(12) United States Patent
Rogojina et al.

(10) Patent No.: US 12,228,824 B2
(45) Date of Patent: Feb. 18, 2025

(54) INK COMPOSITIONS WITH QUANTUM DOT CONCENTRATIONS FOR DISPLAY DEVICES

(71) Applicant: Kateeva, Inc., Newark, CA (US)

(72) Inventors: Elena Rogojina, Newark, CA (US); William P. Freeman, Newark, CA (US); Florian Pschenitzka, Newark, CA (US); Teresa A. Ramos, Newark, CA (US); Christopher D. Favaro, Newark, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 18/320,078

(22) Filed: May 18, 2023

(65) Prior Publication Data
US 2023/0288757 A1    Sep. 14, 2023

Related U.S. Application Data

(63) Continuation of application No. 16/755,806, filed as application No. PCT/US2018/054214 on Oct. 3, 2018, now abandoned.
(Continued)

(51) Int. Cl.
| | |
|---|---|
| G02F 1/1337 | (2006.01) |
| C09D 11/38 | (2014.01) |
| C09K 11/02 | (2006.01) |
| C09K 11/62 | (2006.01) |
| G02F 1/13 | (2006.01) |
| B82Y 20/00 | (2011.01) |
| C08L 33/12 | (2006.01) |

(52) U.S. Cl.
CPC ........ *G02F 1/133719* (2013.01); *C09D 11/38* (2013.01); *C09K 11/02* (2013.01); *C09K 11/62* (2013.01); *G02F 1/1303* (2013.01); *B32B 2457/20* (2013.01); *B32B 2457/202* (2013.01); *B32B 2457/206* (2013.01); *B82Y 20/00* (2013.01); *C08L 33/12* (2013.01); *C09K 2323/03* (2020.08); *C09K 2323/035* (2020.08); *G02F 1/133715* (2021.01); *G02F 2202/023* (2013.01); *G02F 2202/10* (2013.01)

(58) Field of Classification Search
None
See application file for complete search history.

(56) References Cited

U.S. PATENT DOCUMENTS

| | | |
|---|---|---|
| 4,116,937 A | 9/1978 | Jones et al. |
| 8,330,348 B2 | 12/2012 | Berben |

(Continued)

FOREIGN PATENT DOCUMENTS

| | | |
|---|---|---|
| CN | 102702934 A | 10/2012 |
| JP | 2016141742 A | 8/2016 |

(Continued)

OTHER PUBLICATIONS

KR Office Action dated Aug. 29, 2023 for KR Patent Application No. 10-2020-7014046.
(Continued)

*Primary Examiner* — Eli D. Strah
(74) *Attorney, Agent, or Firm* — Hauptman Ham, LLP

(57) ABSTRACT

Organic ligand-capped quantum dots and curable ink compositions containing the organic ligand-capped quantum dots are provided. Also provided are thin films formed from the ink compositions.

10 Claims, 43 Drawing Sheets

Related U.S. Application Data

(60) Provisional application No. 62/652,768, filed on Apr. 4, 2018, provisional application No. 62/634,506, filed on Feb. 23, 2018, provisional application No. 62/573,539, filed on Oct. 17, 2017.

(56) References Cited

U.S. PATENT DOCUMENTS

| | | |
|---|---|---|
| 8,714,719 B2 | 5/2014 | Mauck et al. |
| 8,836,212 B2 | 9/2014 | Skipor et al. |
| 10,804,417 B2 | 10/2020 | Pschenitzka et al. |
| 2008/0169753 A1 | 7/2008 | Skipor et al. |
| 2008/0277626 A1 | 11/2008 | Yang et al. |
| 2009/0314991 A1 | 12/2009 | Cho et al. |
| 2010/0086701 A1 | 4/2010 | Iftime et al. |
| 2010/0243295 A1 | 9/2010 | Allemand et al. |
| 2011/0233514 A1 | 9/2011 | Lu et al. |
| 2011/0281388 A1 | 11/2011 | Gough et al. |
| 2012/0045398 A1 | 2/2012 | Pöselt et al. |
| 2015/0177230 A1 | 6/2015 | Li |
| 2015/0243816 A1 | 8/2015 | Nachtigal et al. |
| 2015/0300600 A1 | 10/2015 | Dubrow et al. |
| 2015/0301408 A1 | 10/2015 | Li |
| 2016/0005932 A1 | 1/2016 | Lee et al. |
| 2016/0024322 A1 | 1/2016 | Jain et al. |
| 2016/0126499 A1 | 5/2016 | Dai et al. |
| 2016/0161801 A1 | 6/2016 | Watano et al. |
| 2016/0164031 A1 | 6/2016 | Pieper et al. |
| 2016/0218252 A1 | 7/2016 | Steckel et al. |
| 2017/0062762 A1 | 3/2017 | Jain et al. |
| 2017/0115562 A1 | 4/2017 | Kim et al. |
| 2017/0261849 A1 | 9/2017 | Tang |
| 2017/0321114 A1 | 11/2017 | Kamo et al. |
| 2018/0102449 A1 | 4/2018 | Pschenitzka et al. |
| 2018/0354244 A1 | 12/2018 | Plante et al. |
| 2019/0077954 A1 | 3/2019 | Tangirala et al. |
| 2019/0382655 A1 | 12/2019 | Kuwana et al. |

FOREIGN PATENT DOCUMENTS

| | | |
|---|---|---|
| KR | 1020170019277 A | 2/2017 |
| KR | 1020170036701 A | 4/2017 |
| KR | 1020170047125 A | 5/2017 |
| TW | 201936898 A | 9/2019 |
| WO | 2007137292 A2 | 11/2007 |
| WO | 2015178330 A1 | 11/2015 |
| WO | 2015196573 A1 | 12/2015 |
| WO | 2016125481 A1 | 8/2016 |
| WO | 2017162913 A1 | 9/2017 |

OTHER PUBLICATIONS

KR Office Action mailed Dec. 2, 2023 for KR Patent Application No. 10-2023-7017264.

Non-Final Office Action issued Nov. 6, 2019 to U.S. Appl. No. 15/727,551.

Final Office Action issued Mar. 4, 2020 to U.S. Appl. No. 15/727,551.

Notice of Allowance issued Jun. 12, 2020 to U.S. Appl. No. 15/727,551.

International Search Report and Written Opinion issued on Dec. 14, 2018, to PCT Application No. PCT/US18/54214.

International Search Report and Written Opinion issued on Dec. 28, 2017, to PCT Application No. PCT/ US17/55666.

FIG. 1B

| Glass | Anti-Photoluminescence Layer(s) | QD Color Filter | Polarizer (optionally, with ITO coating) | Spacer | Liquid crystal | TFT array on glass | Polarizer + Enhancement film | Diffuser | BLU (Blue LED) |

FIG. 1A

| Glass | Polarizer Layer | Color Filter Layer (optionally, with ITO coating) | Spacer | Liquid crystal | TFT array on glass | Polarizer + Enhancement film | Diffuser | White Light Source |

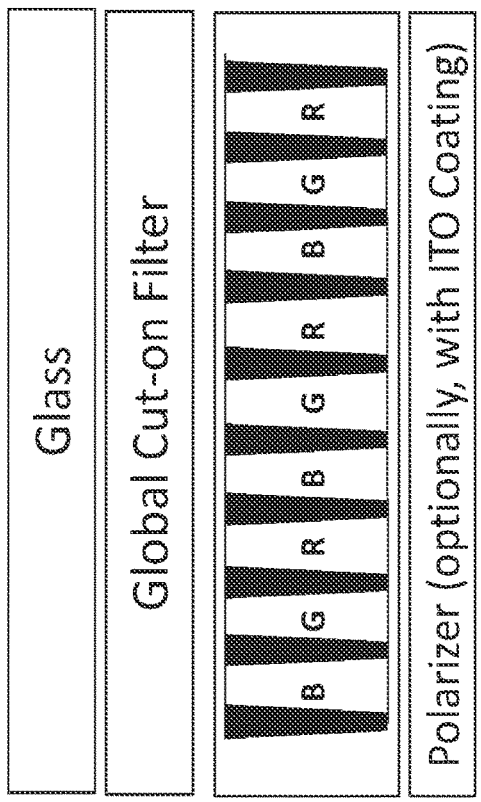
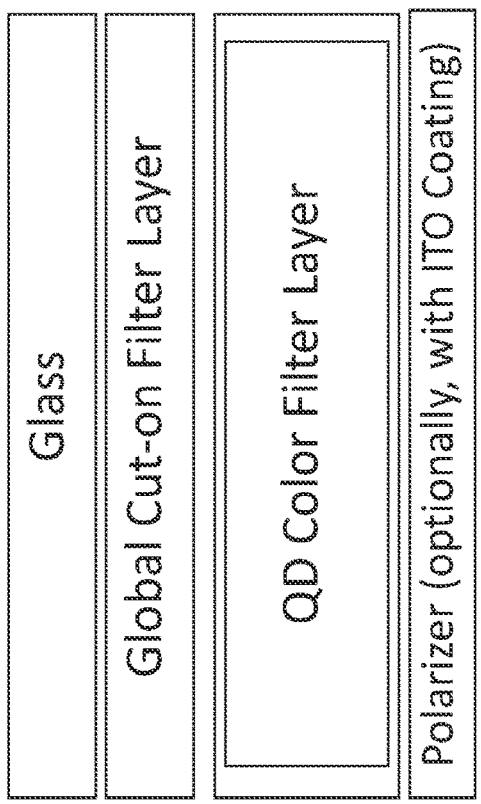
FIG. 3B
FIG. 3A

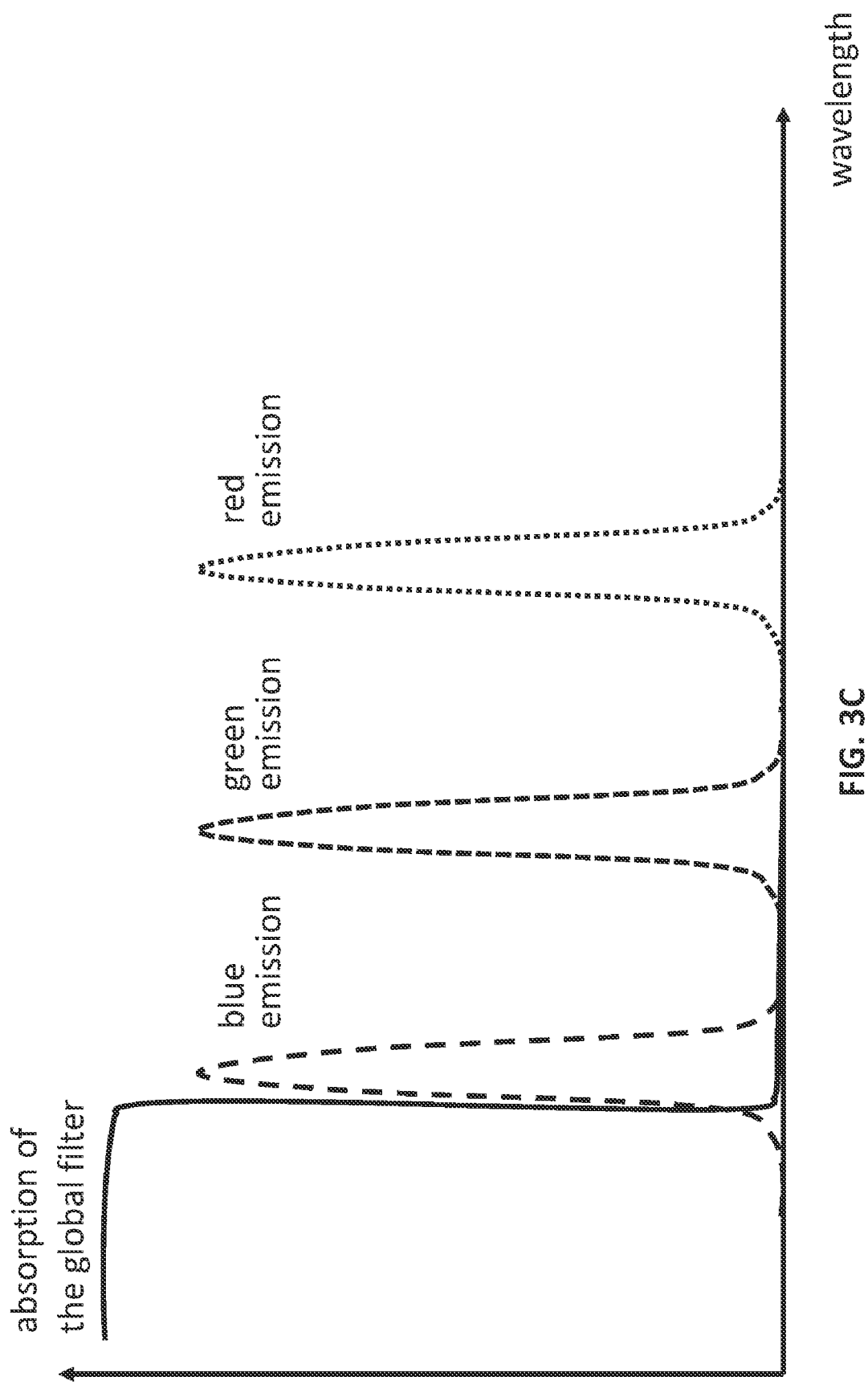

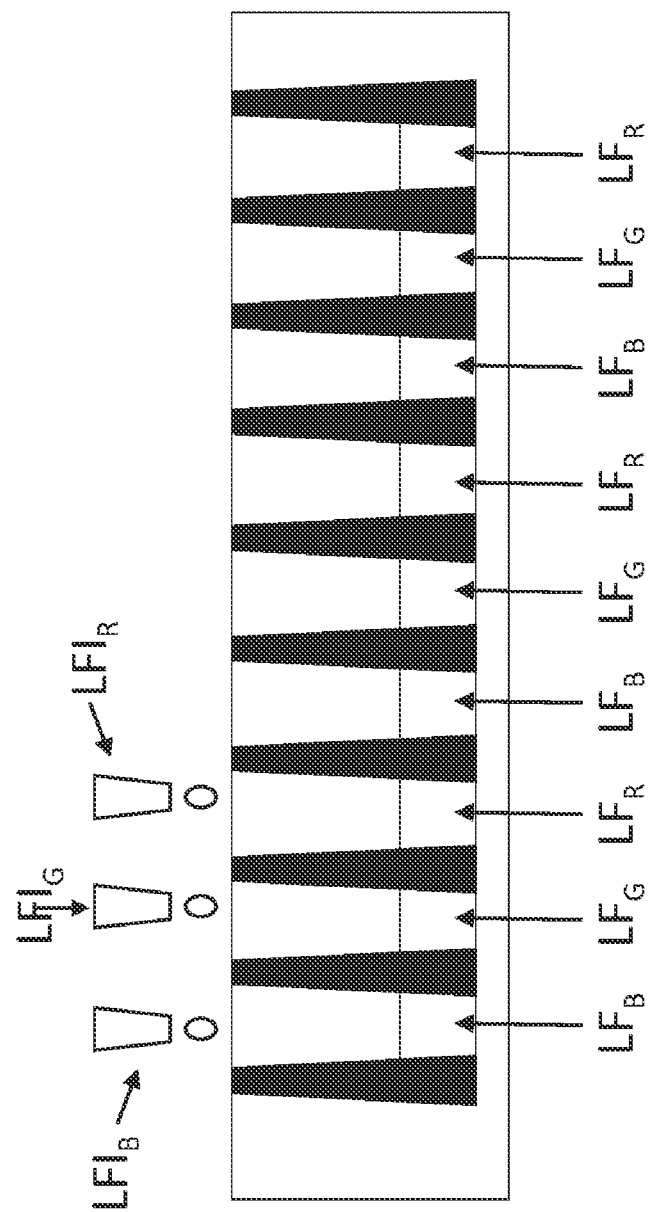

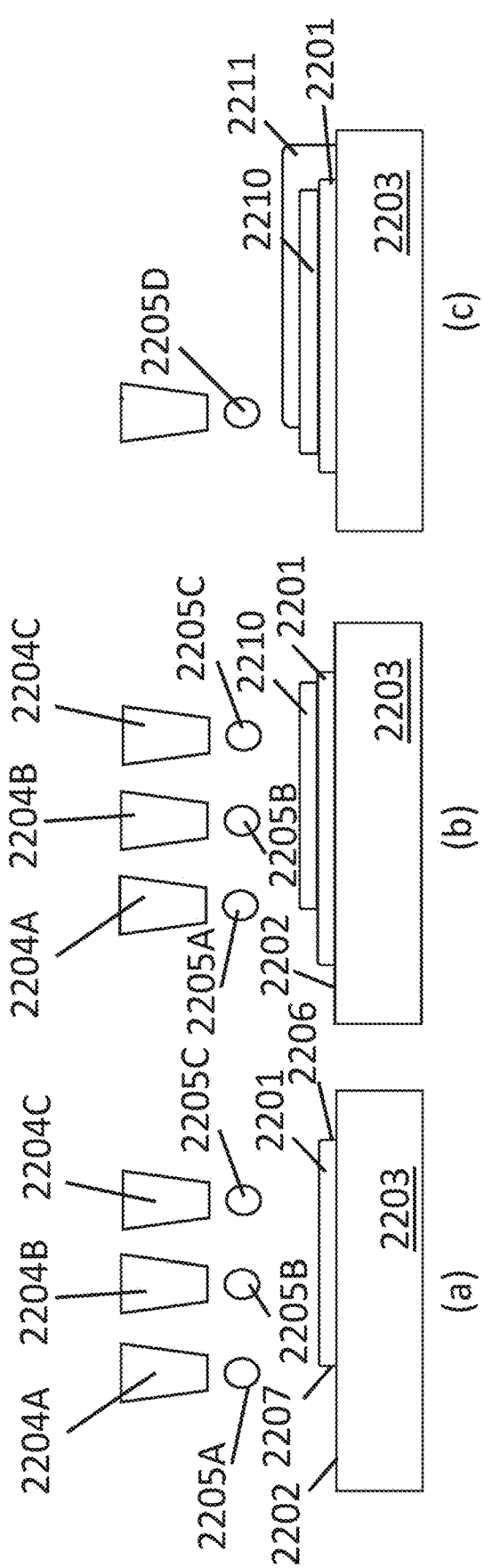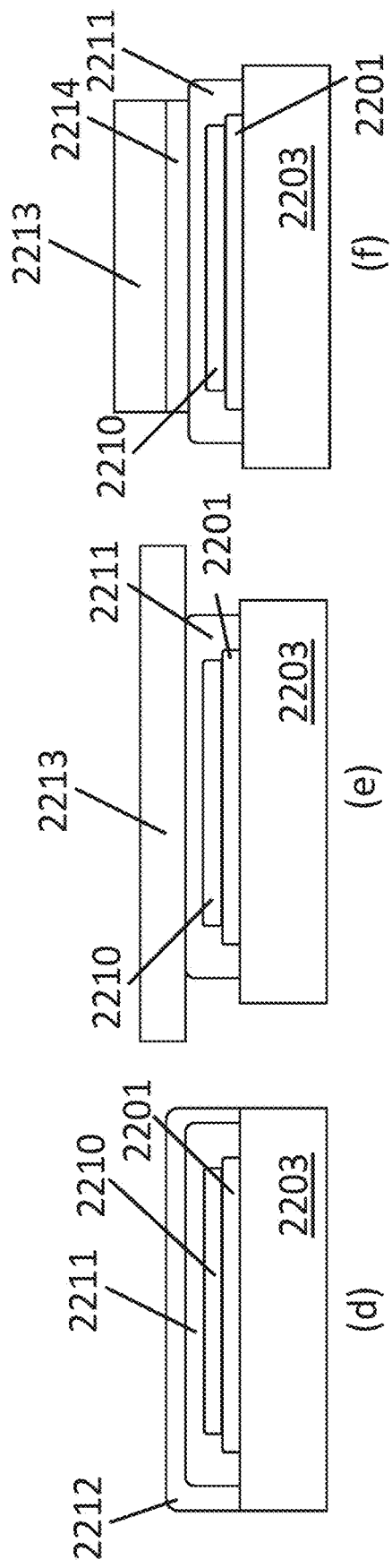
FIG. 22

INK COMPOSITIONS WITH QUANTUM DOT CONCENTRATIONS FOR DISPLAY DEVICES

CROSS-REFERENCE TO RELATED APPLICATIONS

This application is a continuation of U.S. patent application Ser. No. 16/755,806, filed on Apr. 13, 2023, which is a 371 of International Patent Application No. PCT/US18/54214, filed on Oct. 3, 2018, which claims priority from U.S. Provisional Patent Application No. 62/573,539, filed on Oct. 17, 2017; U.S. Provisional Patent Application No. 62/634,506, filed on Feb. 23, 2018; and U.S. Provisional Patent Application No. 62/652,768, filed on Apr. 4, 2018, the entire contents of which are incorporated herein by reference.

BACKGROUND

Liquid crystal display (LCD) device technology continuously evolves with respect to improving the end-user experience. One aspect of improving the end user experience has been to target expanding the color gamut of LCD devices. Accordingly, quantum-dot (QD) technology has been explored with respect to expanding the color gamut of LCD devices. Generally, various technology solutions are based on a modification to an LCD device assembly that includes a polymeric sheet or rod in which QDs are embedded.

SUMMARY

Ink compositions for forming quantum-dot containing films are provided. Also provided are methods of forming cured films from the ink compositions and photonic devices that incorporated the films as light converting and emitting layers are provided.

One embodiment of a method of forming a quantum dot-containing film on a device substrate includes: inkjet printing a layer of a curable ink composition on the surface of a device substrate, the ink composition including: 30 wt. % to 96 wt. % di(meth)acrylate monomers, mono(meth)acrylate monomers, or a combination of di(meth)acrylate monomers and mono(meth)acrylate monomers; and 0.1 wt. % to 50 wt. % quantum dots with organic ligands bound to their surfaces; and curing the curable ink composition.

One embodiment of an ink composition includes: 30 wt. % to 96 wt. % di(meth)acrylate monomers, mono(meth)acrylate monomers, or a combination of di(meth)acrylate monomers and mono(meth)acrylate monomers; and 0.1 wt. % to 50 wt. % quantum dots with organic ligands bound to their surfaces.

One embodiment of a cured film includes a polymerization product of an ink composition that contains: 30 wt. % to 96 wt. % di(meth)acrylate monomers, mono(meth)acrylate monomers, or a combination of di(meth)acrylate monomers and mono(meth)acrylate monomers; and 0.1 wt. % to 50 wt. % quantum dots with organic ligands bound to their surfaces.

One embodiment of a photonic device includes: a photonic device substrate; and a cured film on the photonic device substrate, the cured film being a polymerization product of an ink composition that contains: 30 wt. % to 96 wt. % di(meth)acrylate monomers, mono(meth)acrylate monomers, or a combination of di(meth)acrylate monomers and mono(meth)acrylate monomers; and 0.1 wt. % to 50 wt. % quantum dots with organic ligands bound to their surfaces.

BRIEF DESCRIPTION OF THE DRAWINGS

A better understanding of the features and advantages of the present disclosure will be obtained by reference to the accompanying drawings, which are intended to illustrate, not limit, the present teachings. In the drawings, which are not necessarily drawn to scale, like numerals may describe similar components in different views. Like numerals having different letter suffixes may represent different instances of similar components.

FIG. 1A is a schematic illustration, which represents various layers that may be included in an embodiment of an LCD display device. FIG. 1B is a schematic illustration, which represents various layers that may be included in another embodiment of an LCD display device.

FIG. 3A is a schematic illustration of the upper layers of an LCD device in which the layer stack does not include local cut-on filters in the sub-pixel cells. FIG. 3B is a cross-sectional side view of the upper layers of an LCD device according to FIG. 3A, including the blue, green, and red sub-pixels in the QD color filter. FIG. 3C shows the absorbance spectrum of a global cut-on filter that absorbs radiation having wavelengths shorter than the blue emission wavelengths of the device.

FIG. 4A shows a process of inkjet printing the local light filter layers in the sub-pixel cells of a QD color filter.

FIG. 22 is a schematic illustration of a method for inkjet printing layers containing quantum dots and scattering nanoparticles on a device substrate.

DETAILED DESCRIPTION

Figures 2A, 2B:
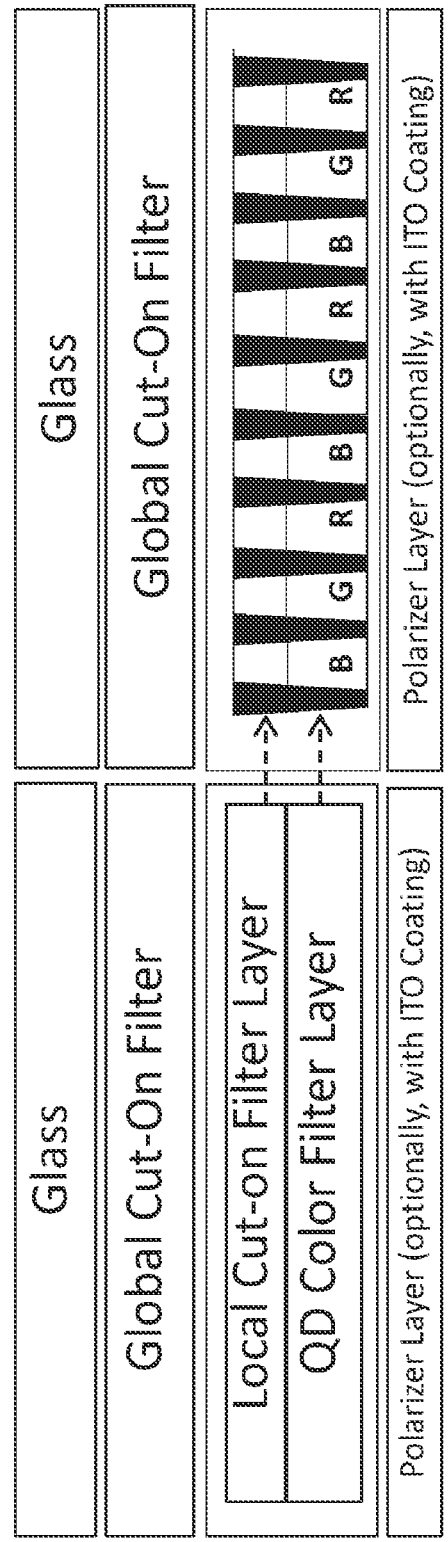
FIG. 2A is a schematic illustration of the upper layers of an LCD device that includes a QD color filter.
FIG. 2B is a cross-sectional view of the upper layers of the LCD device of FIG. 2A, showing the configuration of the QD color filter.

Ink compositions for forming QD-containing films are provided. Also provided are methods for forming the QD-containing films via inkjet printing and photonic devices that incorporate the QD-containing films. The QD-containing films can be incorporated as light-emitting layers in a variety of optoelectronic devices. Although the description that follows illustrates the use of the QD-containing films as color filter layers and color enhancement layers in devices such as LCDs or organic light-emitting diodes (OLEDs), the QD-containing films can be incorporated into other devices that include a QD-containing light-emitting layer.

Display Devices Having Color Filters Incorporating a QD-Containing Layer

FIG. 1A is a schematic illustration that represents various layers that may be included in an LCD display device. For various display devices, for example, for various LCD devices, and for some types of organic light emitting diode (OLED) devices, light is directed from a source of white light located in back of the individual sub-pixels of a color filter array. The sub-pixels can be, but are not limited to, red (R) sub-pixels, green (G) sub-pixels, and/or blue (B) sub-pixels. For LCD devices, the light source may be a backlight source that illuminates many sub-pixels in a color filter array at once, at a common brightness which can be adjusted based on the image to be displayed. The light transmitted through each of the sub-pixels of a color filter array can be further modulated by a corresponding liquid crystal filter associated with each sub-pixel of a color filter array. The liquid crystal filter can be controlled by, for example, a transistor circuit. In the case of OLED devices, the light supplied to each of the sub-pixels of a color filter array typically comes from a white OLED device and the brightness of each sub-pixel is modulated by a transistor circuit. For either various embodiments of LCD devices or OLED devices, each sub-pixel of a color filter array contains a light filtering media that transmits light only within a prescribed electromagnetic wavelength bandwidth associated with the sub-pixel color. Manufacturing a conventional color filter array can be done using, for example, photolithographic techniques, which are complex processes requiring many separate sequences of, for example, blanket coating, photo-exposure, and development to fabricate both the light blocking "black matrix" material in between the sub-pixels, as well as the individual color filter material deposition sequences (e.g. one each for R, G, and B). Though FIG. 1A indicates an indium tin oxide (ITO) layer, which in various embodiments can be coated on the polarizer surface positioned towards the liquid crystal, various embodiments of an LCD display device do not include an ITO coating on a polarizer. The device might have an anti-glare layer to reduce glare caused by ambient light.

FIG. 1B is a schematic illustration that represents various layers that may be included in an LCD display device according to the present teachings. In the device of FIG. 1B, the color filter shown in FIG. 1A has been replaced by a color filter layer fabricated using QDs. The QDs are small crystalline particles that absorb incident radiation having a first wavelength, or a first range of wavelengths, and convert the energy of the radiation into light having a different wavelength, or a different range of wavelengths, which is emitted from the QDs within a very narrow part of the optical spectrum. Thus, by incorporating QDs of appropriates sizes and materials in appropriate concentrations and ratios into a light-emitting device layer, that layer can be designed to alter the absorption and/or emission spectra of a photonic device that incorporates the layer. Thus, the QD-containing color filter layers are so called because they "filter" incoming light having a first wavelength or wavelength range, such as ultraviolet or blue light, by converting at least a portion of it into light having a different wavelength or wavelength range, such as red and/or green light. On a first side of a QD-containing color filter, as depicted in FIG. 1B, there can be a polarizer layer.

An LCD device may also utilize an anti-photoluminescent layer in conjunction with a QD-containing color filter (referred to herein as a QD color filter). Since the color filter sub-pixels that utilize QDs are at the front of the display, it is desirable to avoid having ambient light act as a source of excitation for QDs in the color filter layer. Accordingly, various embodiments of LCD devices utilize various local and global filter layers acting as anti-photoluminescent layers. Similarly, this layer of filters can also be utilized to prevent excess blue light (which has not been absorbed and converted by the QD layer) to be transmitted and thus decrease the color gamut of the display. Moreover, as will be described in more detail herein, inkjet printing can be used to fabricate the QD-containing layers of various embodiments of the QD color filters, as well as various anti-photoluminescent layers for such devices.

FIG. 2A is a schematic illustration of the upper layers of an LCD device of the type shown in FIG. 1B. FIG. 2B is a cross-sectional view of the upper layers of the LCD device. As noted for FIG. 1B, on a first side of a QD-containing layer of the QD color filter there can be a polarizer layer. In various embodiments of a QD-containing color filter as illustrated generally herein, for FIG. 1B, FIG. 2A, FIG. 2B, FIG. 2E, FIG. 3A, FIG. 3B, FIG. 3F, and FIG. 3G, a conductive film, such as an ITO film, can be coated on the polarizer layer, while in other embodiments, the device may not require an ITO coating. In various embodiments of an LCD device for which a conductive coating is utilized, other conductive, transparent materials can also be used, for example, but not limited by, fluorine-doped tin oxide (FTO), doped zinc oxide, and graphene, as well as combinations of such materials can be used. As shown in FIG. 2B, the QD color filter includes a plurality of sub-pixel cells defined by sub-pixel banks (depicted as thick black sections). The sub-pixels formed in the sub-pixel cells include red sub-pixels (designated with an "R" in FIG. 2B), green sub-pixels (designated with a "G" in FIG. 2B), and blue sub-pixels (designated with a "B" in FIG. 2B). Each red sub-pixel includes a red light-emitting layer containing red-emitting QDs dispersed in a polymer matrix. Similarly, each green sub-pixel includes a green light-emitting layer containing green-emitting QDs dispersed in a polymer matrix. In some embodiments of the LCD device in which the BLU is an ultraviolet light, each blue sub-pixel includes a blue light-emitting layer containing blue-emitting QDs in a polymer matrix. In other embodiments of the LCD device in which the BLU is a blue light, the blue sub-pixels in the QD color filter need not include QDs, but can, optionally, include a polymer matrix that at least partially transmits the blue light from the BLU. The polymer matrices in the sub-pixels are capable of transmitting light across at least certain portions of the visible spectrum. By way of illustration, BLU may be composed of one or more blue LEDs, including one or more blue OLEDs.

In the LCD device of FIG. 2B, an anti-photoluminescent layer is provided in the form of a global cut-on filter layer and a local cut-on filter layers. More information about the structure of global and local cut-on filter layers (also referred to as global light filter layers and local light filter layers) is provided in FIGS. 3A, 3B, 3F, and 3G and their accompanying description below.

In addition to the QDs, the light-emitting layers of the sub-pixels can contain scattering nanoparticles (SNPs), which may be geometric scattering nanoparticles (GSNPs), plasmonic scattering nanoparticles (PSNPs), or a combination thereof. It should be noted that, although the PSNPs and GSNPs will generally have at least one nanoscale dimension—that is, at least one dimension of not greater than about 1000 nm, the nanoparticles need not be round particles. For example, the nanoparticles can be elongated particles, such as nanowires, or irregularly shaped particles. Such scattering nanoparticles can also be included in the matrix material of blue sub-pixels that do not contain any QDs. Scattering by GSNPs is accomplished by refraction at the surface of the particle. Examples of GSNPs include metal oxide nanoparticles, such as nanoparticles of zirconium oxide (i.e. zirconia), titanium oxide (i.e. titania) and aluminum oxide (i.e. alumina). A PSNP is characterized in that incident light excites an electron density wave in the nanoparticle that creates a local oscillating electric field extending out from the surface of the nanoparticle. In addition to the scattering effect of the particle, if the PSNP is in close proximity to one or more QDs, this electric field can couple to the QDs, thereby enhancing the absorption of the QD layer. Examples of PSNPs include metal nanoparticles, such as nanoparticles of silver and gold.

Figure 2C:
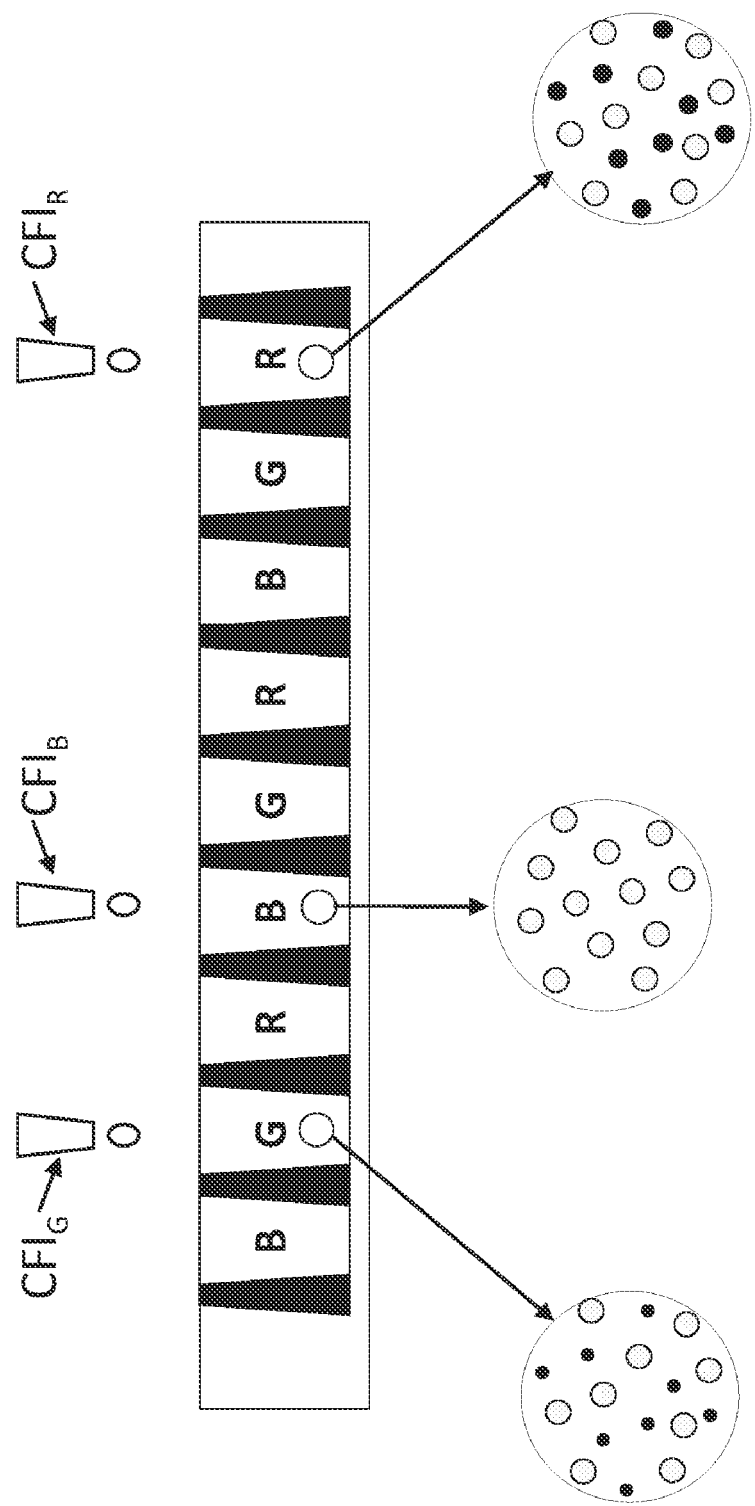
FIG. 2C illustrates the printing of a QD color filter that includes scattering nanoparticles (represented by open circles) in its green sub-pixels, red sub-pixels, and blue sub-pixels.

FIG. 2C shows an example of a QD color filter 160 that includes GSNPs that can be formed using inkjet printing into a plurality of sub-pixel cells 115 formed in substrate 110. As depicted in FIG. 2C, an ink composition containing green QDs ($CFI_G$), an ink composition containing blue QDs ($CFI_B$), and an ink composition containing red QDs ($CFI_R$) can be printed to form to form the green, blue, and red light-emitting layers, respectively, of QD color filter 160. As illustrated generally in FIG. 2C, the various QD inks can include SNPs (represented by open circles)), which can be incorporated in the green sub-pixels, the red sub-pixels, and the blue sub-pixels. (As depicted in FIG. 2C, the green QDs are represented by the smaller solid circles and the red QDs are represented by the larger solid circles.) The SNPs provide enhanced light absorption and extraction by acting as light scattering centers in the polymer matrices. Including SNPs in combination with the QDs can increase the color conversion efficiency of a QD-containing sub-pixel by increasing photon scattering in the interior of the light-emitting layer, so that there are more interactions between the photons and the QDs and, therefore, more light absorption by the QDs.

In embodiments of QD color filters that include blue-emitting QDs in the blue sub-pixels, SNPs (for example, GSNPs) could also be included in those sub-pixels. However, even blue sub-pixels that lack QDs can include SNPs dispersed in a polymer matrix to provide isotropic blue light emission from the blue sub-pixels that is equivalent to, or nearly equivalent to, the isotropic red and green light emission that is provided by the red and green sub-pixels, such that the optical appearance of the emitted blue light (e.g., haze and specular emission) is similar to that of the emitted red and green light. However, in order to avoid unwanted scattering of ambient light in the sub-pixels, some embodiments of the light-emitting layers are free of SNPs.

The QDs and, if present, GSNPs and/or PSNPs can be incorporated into the light-emitting layer of a sub-pixel by including them in an ink composition, depositing them by inkjet printing the ink composition as a layer in a sub-pixel cell, and drying and/or curing the printed ink composition. By way of illustration, an effective scattering nanoparticle size in the range from about 40 nm to about 1 µm, depending on the type of scattering, can be selected for use in a jettable ink. The GSNPs will typically be larger than the PSNPs and both types of particles will generally be larger than the QDs. By way of illustration only, in various embodiments of the ink compositions and the layers formed therefrom, the GSNPs have an effective size in the range from about 100 nm to about 1 µm and the PSNPs have an effective size in the range from about 10 nm to about 200 nm.

Figure 2D:
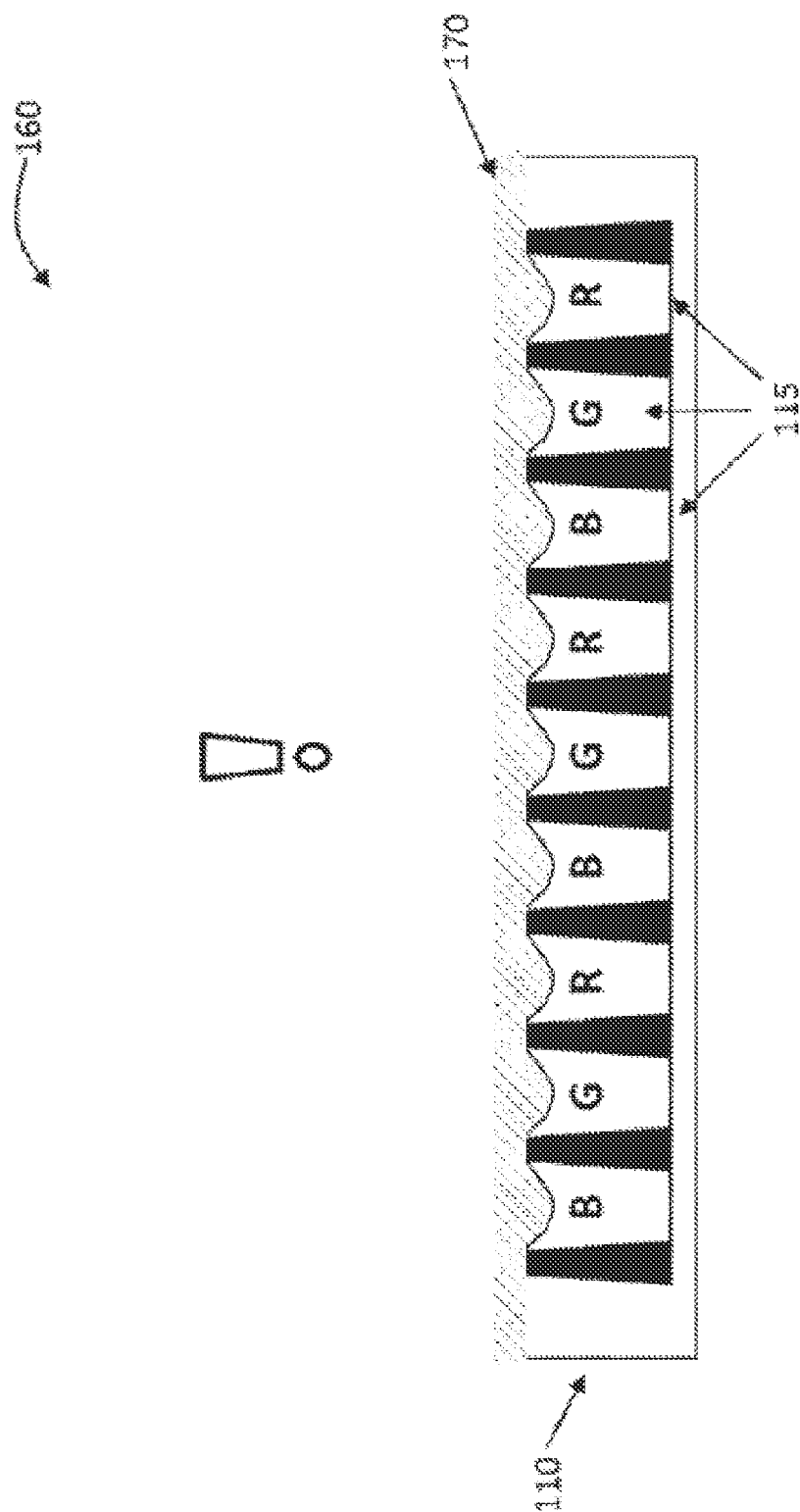
FIG. 2D illustrates the printing of a barrier or planarization layer over embodiments of the QD color filter of FIG. 2C.

FIG. 2D illustrates generally a process for forming a polymeric layer on various embodiments of QD color filter 160. According to the present teachings, polymeric layer 170 can be formed after the formation of the QD-containing light-emitting layer of the QD color filter. According to the present teachings, polymeric layer 170 can be a planarization layer. In various embodiments, polymeric layer 170 can be a planarization layer that may additionally act as a protective layer. For various embodiments of a QD color filter, as will be described in more detail for FIG. 2E, polymeric layer 170 can be formed over an inorganic barrier layer. As will be described in more detail herein, polymeric layer 170 can be formed from a polymer-forming ink composition that, when subsequently cured or dried, can form polymeric layer 170. Polymeric layer 170 can be, for example, between about 1 µm (micron) to about 5 µm (micron) in thickness. As illustrated generally in FIG. 2D, there can be surface topology occurring as a result of the sub-pixel cell structures in conjunction with, for example, formation of a meniscus occurring in the sub-pixel cells. As such, inkjet printing can be done to compensate for the variation in surface topology, for example, by printing more of a polymer-forming ink composition over areas where there are depressions, and less of a polymer-forming ink composition over areas that are raised relative to the areas of depression.

In various embodiments of a polymer-forming ink composition of the present teachings that can be used to form polymeric layer 170 of FIG. 2D, particles of various shapes and materials can be added to an ink composition for the purpose of providing refractive index adjustment of a polymeric layer formed over the QD-containing sub-pixels. In various embodiments of such a polymeric-film forming ink composition, metal oxide nanoparticles, such as zirconium oxide, aluminum oxide, titanium oxide, and hafnium oxide of size, for example, between about 5 nm to about 50 nm, can be added to an ink. For various embodiments of such a polymeric-film forming ink composition, graphene nanostructures, such as graphene nanoribbons and graphene platelets, can be added to an ink composition in order to substantially reduce the water vapor permeation through the polymeric layer. According to the present teachings, graphene platelets can have dimensions of, for example, between about 0.1 nm to about 2 nm in thickness and between about 100 nm to about 1 µm (micron) in diameter, while graphene nanoribbons can have dimensions of between, for example, about 0.1 nm to 10 nm in thickness and length of between about 1 nm to about 20 nm. Loading of various graphene nanoparticles in an ink composition of the present teachings can be between about 0.1% and 1.0%.

Figure 2E:
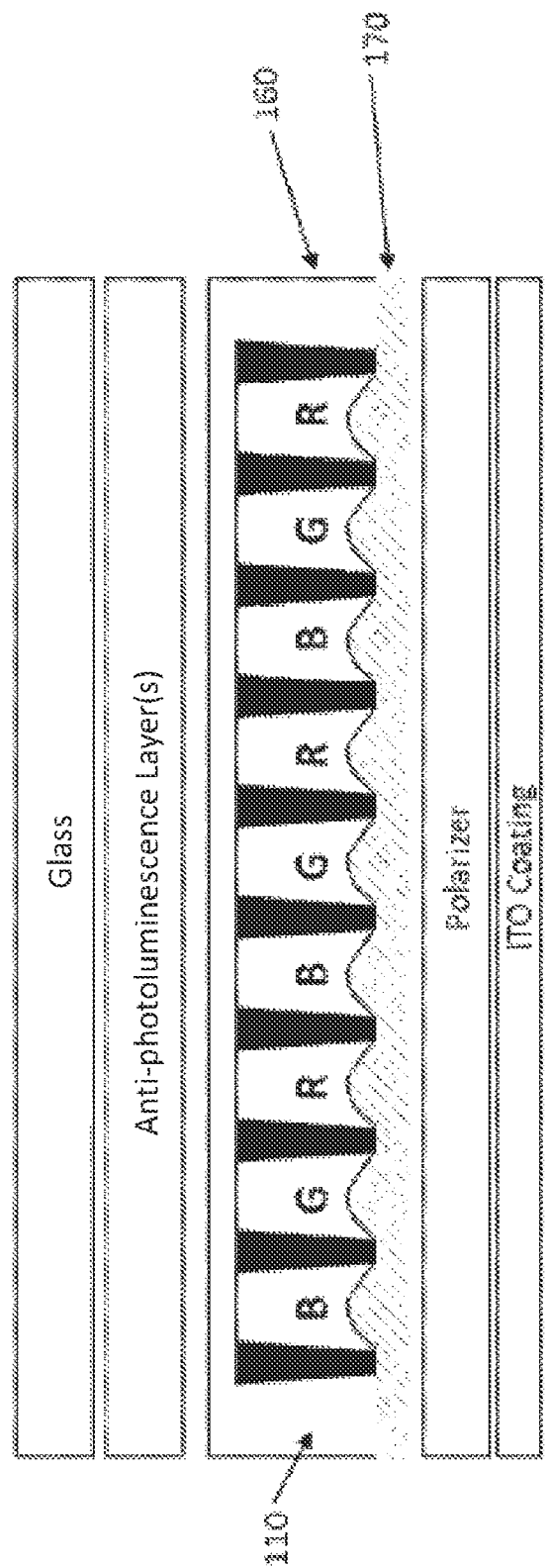
FIG. 2E illustrates an LCD device utilizing the QD color filter of FIG. 2D.

FIG. 2E illustrates generally a portion of an LCD device, for example, as depicted in FIG. 1B, depicting planarizing layer 170 of QD color filter 160 oriented towards a polarizer, for which an ITO layer as previously discussed herein can be optional. In various embodiments of QD color filter 160, planarization layer can be, for example, a polyethylene terephthalate (PET) film, an acrylate-based polymeric film, or the like. QDs embedded in the QD-containing sub-pixels of QD color filter 160 are known to degrade when exposed to atmospheric gases, such as water vapor, oxygen and ozone. Thus, in various embodiments of the QD color filter, polymeric layer 170 can be coupled to an inorganic barrier layer that protects the QD-containing layer from the ingress of water vapor, oxygen, and/or ozone. The inorganic barrier layer, which can be disposed above or below polymeric layer 170, can be comprised of inorganic materials, such as metal oxides, metal nitrides, metal carbides, metal oxynitrides, metal oxyborides, and combinations thereof. For example, the inorganic barrier layer can be composed of a material such as a silicon nitride material ($SiN_x$), aluminum oxide ($Al_2O_3$), titanium oxide ($TiO_2$), hafnium oxide ($HfO_2$), or a silicon oxynitride material ($SiO_xN_y$), or combinations thereof. According to the present teachings, layer 170 can be a combination of a first barrier layer composed of at least one inorganic barrier material as described herein, followed by a second polymeric layer. If present, the polymeric planarization layer and the barrier layer should be capable of transmitting light in the visible region of the electromagnetic spectrum. Polymeric protective layers can be deposited using inkjet printing, as exemplified by U.S. Patent Publication 2016/0024322.

To prevent excitation of the quantum dots by ambient light three embodiments of the CED are proposed: (1) a CED containing only a global cut-on filter; (2) a device containing only local cut-on filters; and (3) a device containing both global and local cut-on filters.

Some embodiments of the LCD devices will include a global cut-on filter layer, without any local cut-on filters. One such device is shown schematically in FIGS. 3A and 3B. FIG. 3A is a schematic illustration of the upper layers of an LCD device. FIG. 3B is a cross-sectional side view of the upper layers, including the blue, green, and red sub-pixels in the QD color filter layer. The global cut-on filter can be deposited on either side of the glass substrate. Ambient light with shorter wavelengths than the blue emission will be blocked from entering the QD layer and, therefore, will not excite the red and green QDs. This global cut-on filter layer may be continuous and un-patterned, and may be disposed on either side of the substrate of the QD color filter. The global cut-on filter layer is desirably of high optical performance with a steep cut-on filter characteristic.

Figure 3D:
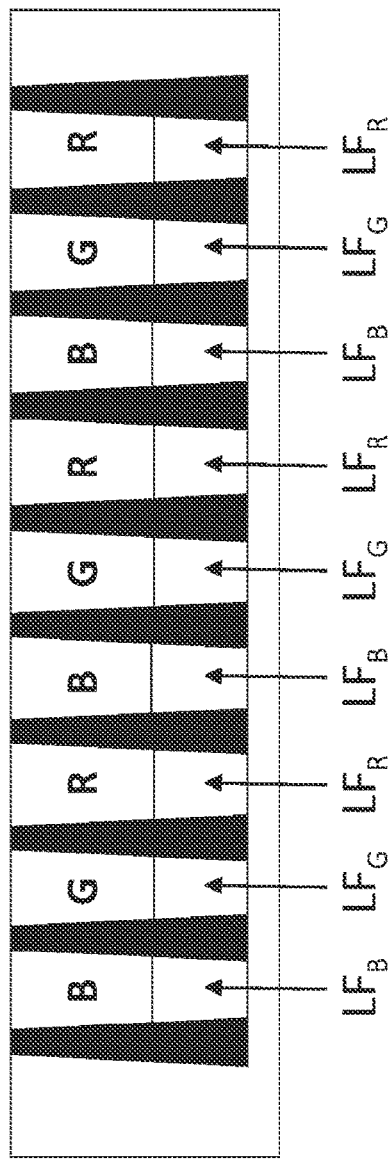
FIG. 3D shows a cross-sectional side view of an embodiment of a QD color filter that includes local light filter layers adjacent to QD-containing layers in the sub-pixels.
Figure 3E:
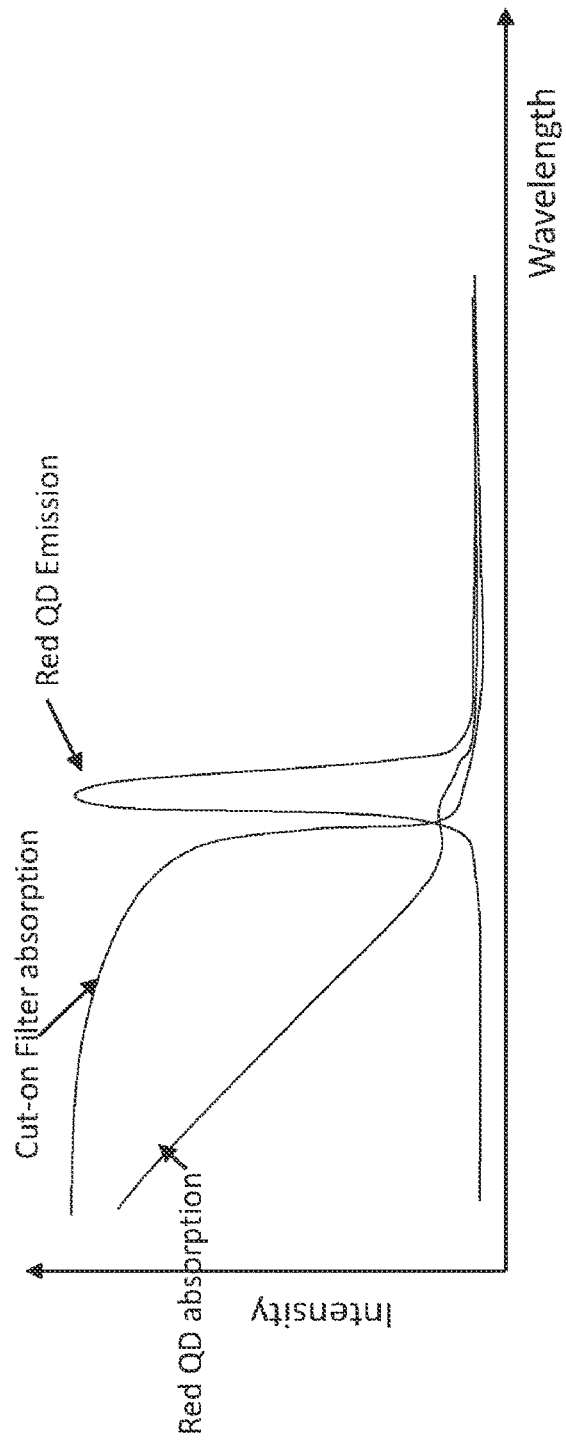
FIG. 3E shows the absorbance spectrum of a red sub-pixel-specific cut-on filter layer; the absorbance spectrum of the red-emitting QDs in a light-emitting layer; and the emission spectrum of the red-emitting QDs in the light-emitting layer for a red sub-pixel.

FIG. 3D shows a cross-sectional side view of an embodiment of a QD color filter that includes a local light filter layer disposed between the substrate and the light-emitting surface of the QD-containing layer in each sub-pixel cell. These local light filter layers serve to filter out ambient light incident on the device that would otherwise enter the QD-containing layers and be absorbed by the QDs, creating unwanted photoluminescence and degrading the optical quality of the LCD. By the same mechanism, these local light filters can also filter out any excess blue light from the BLU which has not been absorbed by the QD layer and which would otherwise cause a diminished color saturation and diminished color gamut for the display. As illustrated in FIG. 3E, the local light filter layers (LFs) act as a sub-pixel-specific cut-on filter; absorbing radiation at wavelengths below the emission wavelengths of the QDs in the QD-containing light-emitting layer and transmitting radiation at wavelengths at and above the emission wavelengths of the QD-containing light-emitting layer. In FIG. 3E, the local light filter layer is illustrated for a red sub-pixel. The local light filter layers include light absorbers with the appropriate light absorbing properties. Thus, a local light filter layer for a red sub-pixel ($LF_R$) will include a light absorber that absorbs radiation at wavelengths below the red-light emission wavelengths of the red-emitting QDs in the red-emitting sub-pixel and transmits radiation at wavelengths at and above the red-light emission wavelengths of the red-emitting QDs in the red-emitting sub-pixel. Similarly, a local light filter layer for a green sub-pixel ($LF_G$) will include a light absorber that absorbs radiation at wavelengths below the green light emission wavelengths of the green-emitting sub-pixel and transmits radiation at wavelengths at and above the green light emission wavelengths of the green-emitting sub-pixel. And, if blue QDs are being used, a local light filter layer for a blue sub-pixel ($LF_B$) will include a light absorber that absorbs radiation at wavelengths below the blue light emission wavelengths of the blue-emitting sub-pixel and transmits radiation at wavelengths at and above the blue light emission wavelengths of the blue-emitting sub-pixel. Local light filter layers could be omitted if the blue sub-pixels are free of QDs, in which case the sub-pixel cells corresponding to the blue sub-pixels could be completely filled with a matrix material that is optically transparent to blue light. The local filters can be deposited using, for example, inkjet printing; the light absorbing materials would be deposited into the sub-pixel cell and dried/cured before the QD-containing light-emitting layer of the QD color filter was deposited in the sub-pixel cell. In this way, two discrete layers could be formed within a sub-pixel cell, with the local cut-on filter layer facing the outside of the device after assembly and, thus, protecting the QD color filter layer from unwanted excitation.

In a variation of the LCD shown in FIG. 2B, the local light filter layers can be formed underneath their respective sub-pixel cells, rather than within those sub-pixel cells. In this variation, the local light filter layers could be formed in a pattern over the sub-pixel cells using, for example, photolithography.

In some embodiments of the LCD devices, a global cut-on filter layer is combined with local cut-on filter layers. In such devices ambient light having wavelengths shorter than the blue emission wavelengths of the display device will be blocked by the global cut-on filter layer. However, light having wavelengths longer than the blue emission wavelengths, but shorter than the emission wavelengths of the QDs at the respective sub-pixel location can still cause excitation of the QDs. A local cut-on filter which blocks only this particular part of the optical spectrum can, in conjunction with a global cut-on filter, eliminate (or significantly reduce) the excitation of the QD by ambient light. At the same time, a local cut-on filter with said properties will block excess blue light from the BLU, which was not absorbed by the QD color filter. By this process the color saturation and the color gamut of the display can be enhanced. An embodiment of a display device that incorporates a local cut-on filter layer and a global cut-on filter layer is illustrated in FIGS. 3F and 3G, and the spectral function of the system is shown in FIG. 3H.

Figures 3F, 3G:
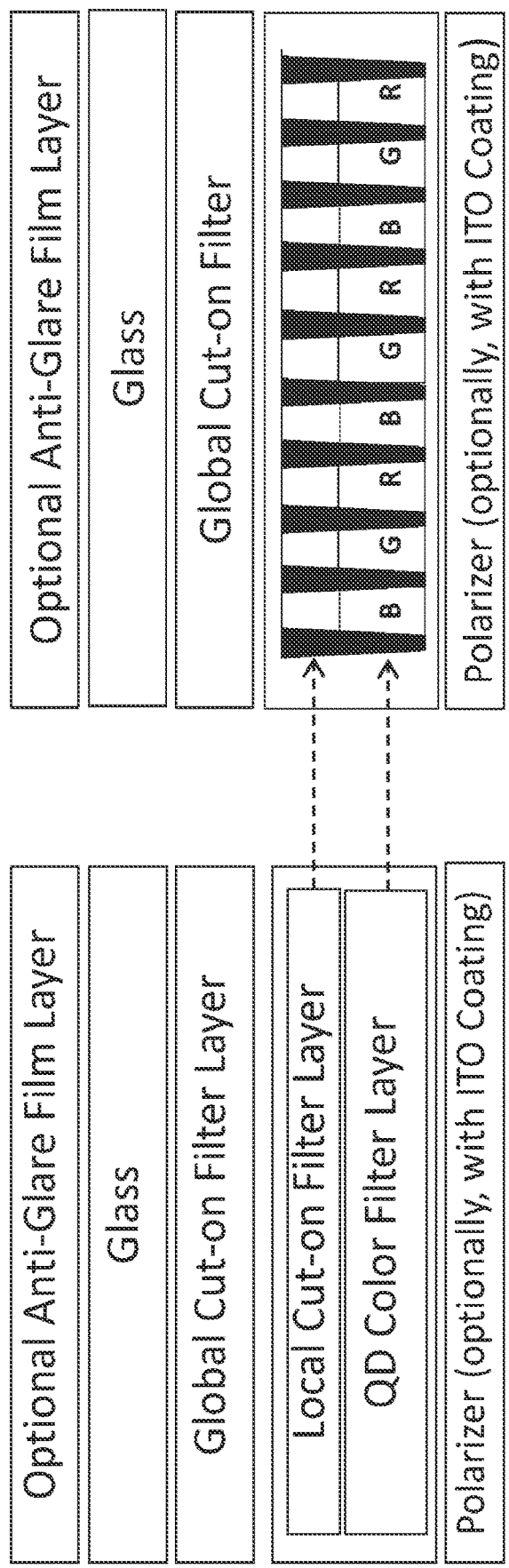
FIG. 3F is a schematic illustration of the upper layers of an LCD device similar to that of FIG. 2A, except that the layer stack further includes a global cut-on filter layer.
FIG. 3G is a cross-sectional side view of the upper layers of the LCD device according to FIG. 3F, including the blue, green, and red sub-pixels in the QD color filter.
Figure 3H:
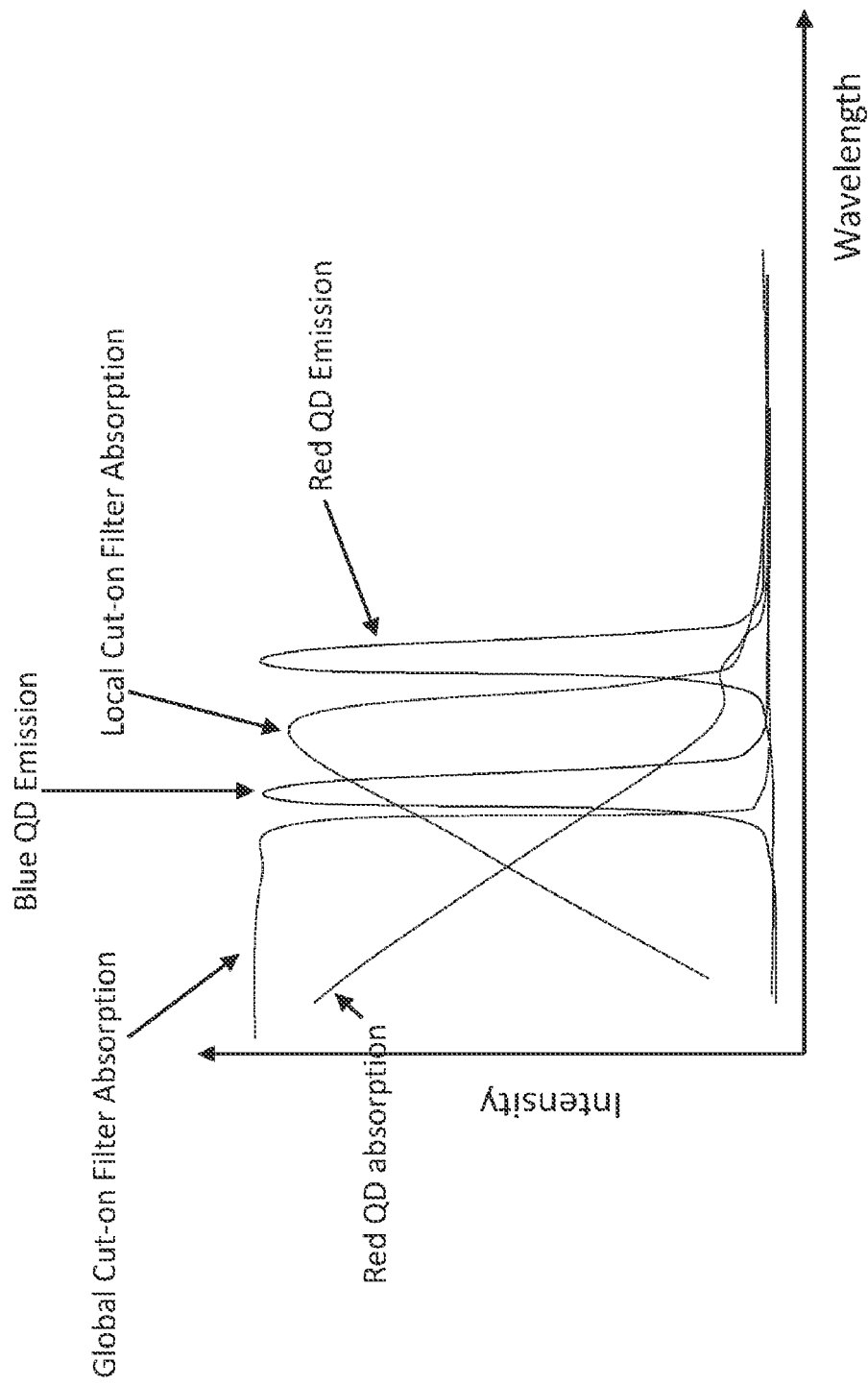
FIG. 3H shows the absorbance spectrum of a global cut-on filter layer; the absorbance spectrum of a red sub-pixel-specific local cut-on filter layer; the absorbance spectrum of the red-emitting QDs in a light-emitting layer; the emission spectrum of the red-emitting QDs in the light-emitting layer for a red sub-pixel; and the emission spectrum of blue-emitting QDs in a blue light-emitting layer (or, alternatively, the blue light emission spectrum for a blue BLU transmitted through a blue sub-pixel).

FIG. 3F is a schematic illustration of the upper layers of an LCD device. FIG. 3G is a cross-sectional side view of the upper layers, including the blue, green, and red sub-pixels in the QD color filter. In this embodiment of the LCD device, the QD color filter has the same structure as that shown in FIG. 3D and the global cut-on filter layer overlies all of the sub-pixel cells. As discussed above, the global cut-on filter layer acts as an additional filter for ambient incident light; absorbing radiation at wavelengths below the shortest emission wavelengths of the device, for example, below the blue emission wavelengths of the device. In the embodiment of the LCD shown in FIGS. 3F, 3G and 3H, the red sub-pixels include local cut-on filter layers that acts as band-pass filters for ambient incident light. Analogous local light filter layers can be included in the green and/or blue sub-pixels.

In addition to, or as an alternative to, providing local filters as layers separate from the QD-containing layers in the QD color filters, the light absorbing materials can be incorporated into the QD color filter layer by including them in an QD-containing ink composition, inkjet printing the ink composition as a QD-containing layer in a sub-pixel cell, and curing the printed ink composition. It should be understood that, although not depicted here, the light absorbing materials, QDs, and, optionally, any GSNPs and/or PSNPs can be included in a single ink composition and printed as a single layer in a sub-pixel cell in which the light absorbers and QDs are uniformly distributed. However, in such embodiments, it may be desirable to select the light absorbing material and the polymer matrix material such that they do not fully prevent the transmission of blue light. Suitable light absorbers for inclusion in the local light filter layers include organic dye molecules, such as azo dyes, inorganic pigments, and combinations thereof.

A process of inkjet printing a QD color filter including a plurality of green, red, and blue sub-pixels is shown schematically in FIG. 2C, whereby a green color filter ink composition, $CFI_G$, is printed directly into the sub-pixel cell for a green sub-pixel using a first inkjet printing nozzle, a blue color filter ink composition, $CFI_B$, is printed directly into the sub-pixel cell for a blue sub-pixel using a second inkjet printing nozzle, and a red color filter ink composition, $CFI_R$, is printed directly into the sub-pixel cell for a red sub-pixel using a third inkjet printing nozzle. Alternatively, the different color sub-pixels can be printed sequentially using the same inkjet printing nozzle. Each of the color filter ink compositions contains its respective color emitting QDs in an organic polymer forming material, an organic solvent, or mixture thereof. The curable organic polymer forming materials cure to form a polymer matrix material and can include various organic monomers, oligomers, and/or polymers, as discussed in more detail below. In addition, the color filter ink compositions can include a crosslinking agent, a photoinitiator, or both.

Figure 4B:
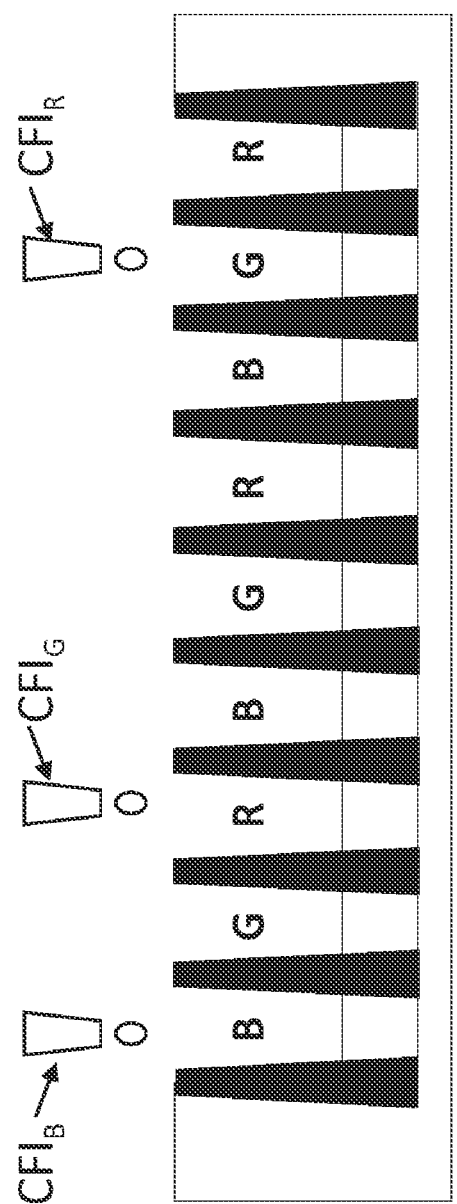
FIG. 4B shows a process of inkjet printing the QD-containing light-emitting layers in the sub-pixel cells of a QD color filter.

A process of inkjet printing a QD color filter having local light filter layers is shown schematically in FIGS. 4A and 4B, whereby the local light filter layers are printed in the sub-pixel cells prior to printing the QD-containing light-emitting layers. As shown in FIG. 4A, a green local light filter ink composition, $LFI_G$, is printed directly into the sub-pixel cell for a green sub-pixel using a first inkjet printing nozzle (or a first set of nozzles), a blue local light filter ink composition, $LFI_B$, is printed directly into the sub-pixel cell for a blue sub-pixel using a second inkjet printing nozzle (or a second set of nozzles), and a red local light filter ink composition, $LFI_R$, is printed directly into the sub-pixel cell for a red sub-pixel using a third inkjet printing nozzle (or a third set of nozzles). Alternatively, the different color sub-pixels can be printed sequentially using the same inkjet printing nozzle (set of nozzles). Each of the local light filter ink compositions contains its respective light absorbing material, one or more polymer binder precursors, a solvent, or mixture thereof, as discussed in more detail below. The curable polymer binder precursors cure to form a matrix material and can include various organic monomers and/or oligomers. In addition, the local light filter ink compositions can include a crosslinking agent, a cure initiator, such as a photoinitiator, or both. Once the sub-pixel-specific local light filter layers are formed in the bottoms of their respective sub-pixel cells, the QD-containing light emitting layers can be printed over the cured or dried local light filter layers, as illustrated in FIG. 4B. After the final assembly of the display, the color filter substrate faces outside and the QD-containing layers face the interior of the display.

In various alternative processes for printing the QD-containing layers and the layers containing the light absorbing materials a single ink composition containing a mixture of the QDs and the light absorbing materials is applied (e.g., inkjet printed) as a single layer initially and dried in such a manner that a layer containing the light absorbing materials separates from a layer containing the QDs, resulting in a two-layer structure. For example, if the QDs are capped with long carbohydrate ligands, it is possible to phase separate them out with a suitable solvent before the remaining light absorber-containing portion of ink composition dries. Alternatively, the solubility of the light absorbing material could be selected such that this material (or the matrix in which it is dissolved) crashes out first, due to the solubility limits of the material.

QD-Containing Color Enhancement Layers

The present inventors have recognized that inkjet printing techniques can be used to provide innovative QD-containing CEDs. Various CEDs of the present teachings include quantum dots dispersed in a matrix. The CEDs can be formed as continuous or discontinuous inkjet printed layers using QD-containing inkjet printable ink compositions. As a result, the composition, geometry, and location of the CEDs can be precisely tailored for a variety of device applications. By incorporating QDs of appropriate sizes and materials in appropriate concentrations and ratios into the CEDs, the CEDs can be designed to alter the absorption and/or emission spectra of photonic devices that incorporate the CEDs.

Figure 5:
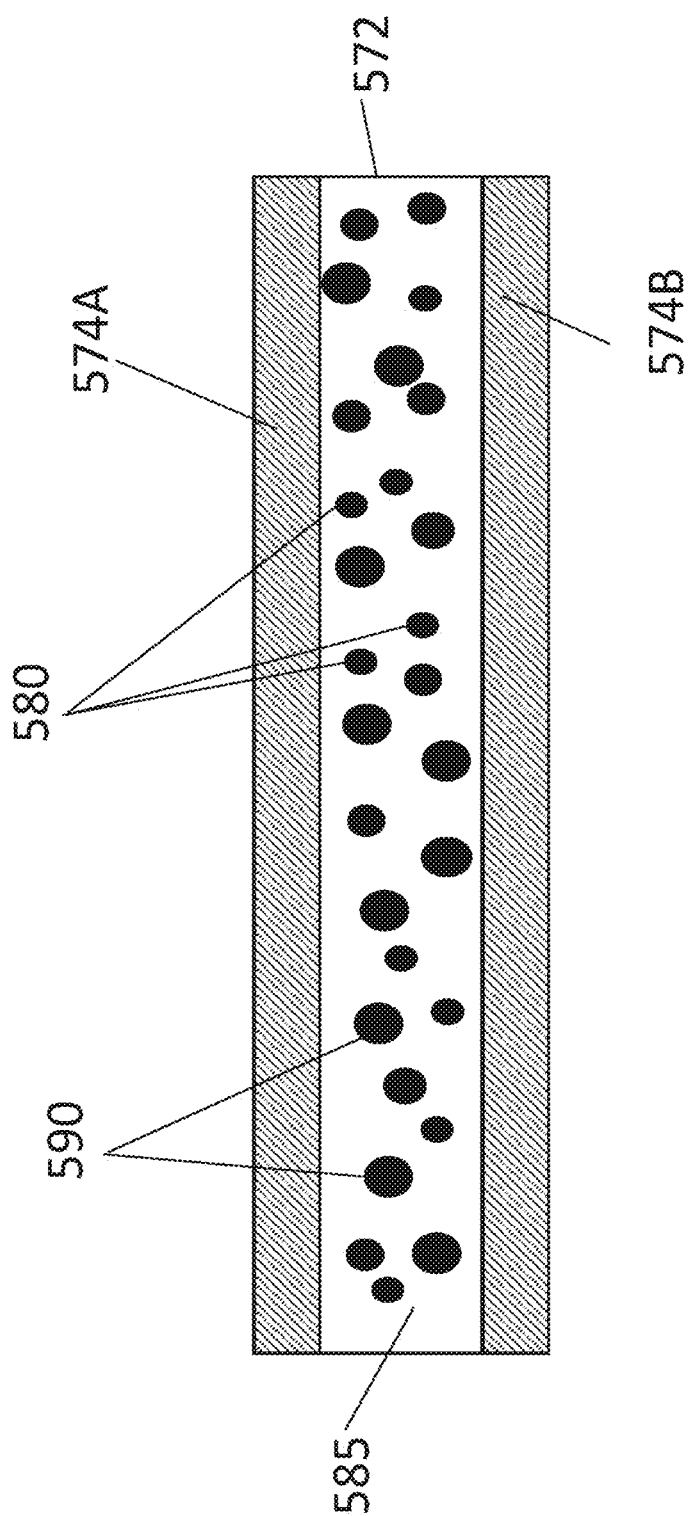
FIG. 5 shows a cross-sectional side view of a quantum dot-containing layer disposed between two protective layers for a color enhancement device.

A cross-sectional view of a basic embodiment of a CED is depicted schematically in FIG. 5. This CED includes a QD-containing layer 572 that contains a plurality of QDs 580, 590 in a matrix 585, such as a polymer matrix. QD-containing layer 572 optionally can be positioned between first and second protective layers, 574A and 574B, respectively. QD-containing layer 572, as depicted, has a plurality of green-emitting QDs 580, shown as smaller spheres, as well as a plurality of red-emitting QDs 590, shown as larger spheres. As shown in FIG. 5, green-emitting QDs 580 and red-emitting QDs 590 are dispersed through matrix 585, which can be, for example, a polymeric matrix capable of transmitting light in the visible spectrum. Moreover, first and second protective layers 574A and 574B provide protection for the QDs embedded in QD-containing layer 572, given the sensitivity of QDs to atmospheric gases, such as water vapor, oxygen and ozone. In various embodiments of the CED, first and second protective layers 574A and 574B can be a polymeric film, such as polyethylene terephthalate (PET), (meth)acrylate-based polymeric film, or the like, or an inorganic barrier layer, or combination of the two. Like QD matrix 585, the protective film needs to be capable of transmitting light in the visible spectrum.

Depending on the devices into which they are incorporated, the CEDs of the present teachings can enhance the visual experience of an end user by enhancing the color gamut of light output by the device; and/or enhance the efficiency of the device to provide improved optical clarity and brightness to an end user. Similarly, the layer can also improve the absorption efficiency of radiation incident on the device. For example, a QD-containing layer can be inkjet printed onto a surface of a photovoltaic cell, such that a portion of the radiation incident on the cell is converted into wavelengths that are more efficiently absorbed by the photoactive material of the cell. By way of illustration, blue and/or ultraviolet (UV) light incident upon the QD-containing layer in a silicon solar cell can be absorbed by the QDs and emitted as red light, which is more efficiently absorbed by the silicon. In the photovoltaic cells, the QD-containing layer can be printed directly onto the photoactive material or on the surface of another component, such as an anti-reflection coating or an electrode.

Figure 6:
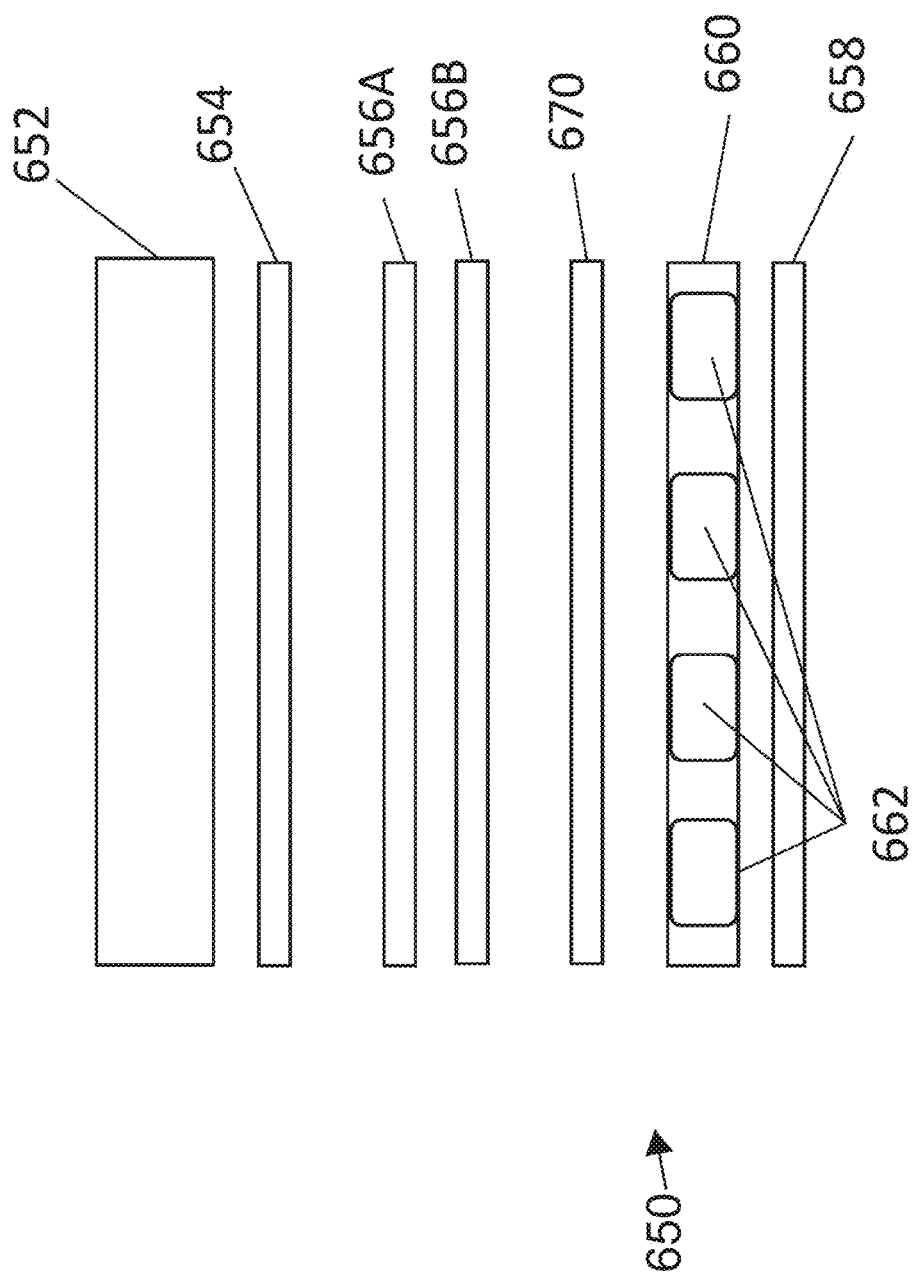
FIG. 6 illustrates generally a schematic exploded perspective view of the components of an LCD device.

In the LCD devices, the QD-containing layer can be printed directly onto a light guide surface or onto the surface of another component, such as a reflector, a diffuser, or a polarizer. FIG. 6 illustrates generally an exploded perspective view of one embodiment of an LCD device 650 into which a CED can be incorporated. LCD device 650 can have LCD panel 652. LCD panel 652 itself can be comprised of many component layers, which can include, for example, but not limited by, a thin film transistor (TFT) layer, a liquid crystal layer, a color filter array (CFA) layer, and a linear polarizer. Additional component layers can include another polarizer 654, first and second brightness enhancement films 656A and 656B, respectively, and reflector film 658. LCD device 650 includes light guide plate 660, which can include a plurality of LED devices 662 positioned proximal to an end of light guide plate 660 as sources of light that can be propagated through light guide plate 660. For various LCD devices, the LED devices associated with a light guide plate can be either white or blue LED sources, though as will be discussed herein subsequently, for LCD device 650, the plurality of LED devices 662 can be blue emitting LEDs with, for example, but not limited by, an emission line at 445 nm.

Figure 7:
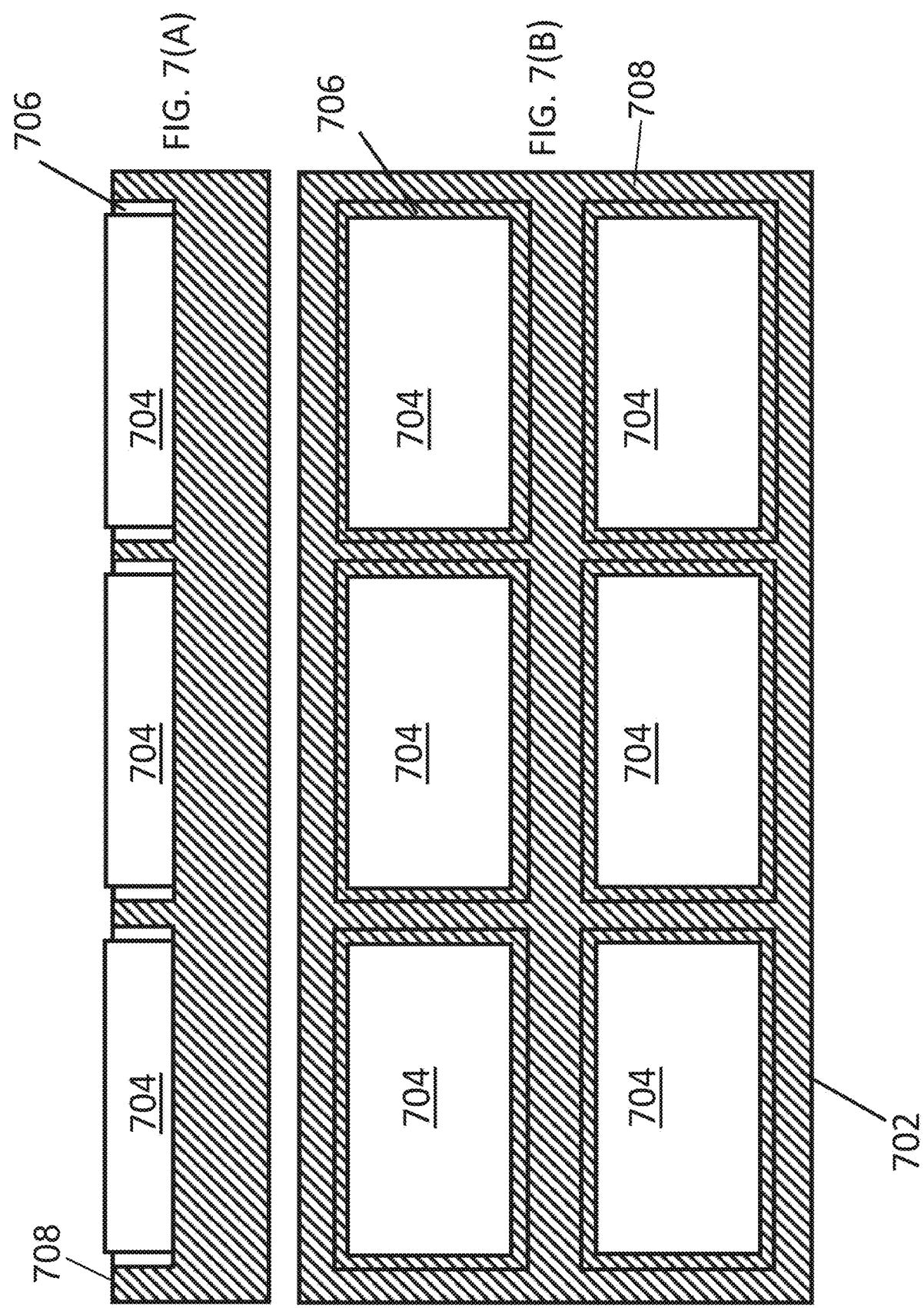
FIG. 7A shows a cross-sectional side view of a substrate tray for inkjet printing a plurality of device substrates.
FIG. 7B shows a top view of the substrate tray of FIG. 7A.

A plurality of device layers can be inkjet printed onto a plurality of substrates simultaneously, or in rapid succession, with or without a controlled delay between the successive printing steps using a substrate tray that holds the substrates in place and that moves with respect to the inkjet printhead during the inkjet printing process. This is illustrated schematically in FIG. 7A and FIG. 7B, which show a cross-sectional side view and a top view, respectively, of a substrate tray 702 holding a plurality of device substrates 704 disposed in an array. Device substrates 702 can be, for example, light guides, reflectors, diffusers, polarizers, layers of anti-reflective material, or electrodes. The shape of the substrate is not limited to rectangular shapes. For example, wafers, as used in the semiconductor industry, can also be processed. Substrate tray 704 includes a plurality of securing features that prevent device substrates 704 from sliding around on the surface of the substrate tray when the tray is in motion. The securing features can take on a variety of forms. In the embodiment shown in FIGS. 7A and 7B, the securing features are a plurality of recessed areas 706 defined in the upper surface 708 of substrate tray 704. A device substrate can be placed in each recessed area without the need for an additional mechanism for fixing the substrates to the tray. Alternatively, the securing features can include locking mechanisms that fix the substrates to the tray and/or provide for precise positioning and alignment of the substrates in select locations on the tray. For example, a spring-loaded pin can be placed between device substrate 704 and the wall of its recessed area 706 to prevent the substrate from moving around in the recessed area.

If the alignment of the device substrates on the tray is critical and the tolerances of the securing features are not sufficiently high, the device substrates can be placed in precise alignment on the substrate trays using alignment sensors with sensory feedback and then locked into place on the tray by a locking mechanism. This sensor-aided alignment can be carried out after the substrate tray has been transferred to the inkjet printer but prior to inkjet printing the QD-containing layers or before the substrate tray has been transferred to the inkjet printer.

In addition to the QDs, the QD-containing layer can contain GSNPs, PSNPs, or a combination thereof. Alternatively, the GSNPs and/or PSNPs can be contained in one or more separate layers in the CED. When the GSNPs and/or PSNPs are incorporated in a QD-containing layer they can improve the conversion performance of that layer. In addition, the GSNPs and PSNPs provide enhanced light extraction, by acting as light scattering centers in the matrix of the QD-containing layer and/or in a separate layer in the CED. Including GSNPs and/or PSNPs in combination with the QDs can increase the color conversion efficiency of a CED by increasing light scattering in the interior of the quantum dot layer, so that there are more interactions between the photons and the scattering particles and, therefore, more light absorption by the QDs. Like the QDs, the GSNPs and PSNPs can be incorporated into a CED by including them in an ink composition, and depositing them by inkjet printing the ink composition as a layer, as described above with respect to QD color filters.

The QD-containing layers and/or scattering nanoparticle-containing layers in a CED can be continuous or discontinuous and can have a uniform distribution or a non-uniform distribution of QDs and/or scattering particles along their lengths and/or through their thicknesses. Similarly, QD-containing layers and/or scattering particle-containing layers in a CED can have a uniform or a non-uniform thickness along their lengths. The use of a non-uniform QD or scattering nanoparticle distribution or a non-uniform layer thickness can be used, for example, to offset a non-uniform intensity distribution of the QD-exciting light in the layer. For example, the use of a gradient concentration of the QDs and/or the scattering nanoparticles in a given layer can provide a more uniform light emission and/or color spectrum along the length of a CED by compensating for any non-uniformity in the intensity of the light entering the QD-containing layer. This is illustrated for various embodiments of a CED in an LCD panel assembly in the embodiments that follow.

For simplicity, and with the exception of FIG. 12, in the figures described below, scattering nanoparticles are represented with open circles and quantum dots are represented by solid (filled) circles. The scattering nanoparticles represented by the open circles can be only GSNPs, only PSNPs, or a mixture of GSNPs and PSNPs and are referred to generically as SNPs. In addition, some of the embodiments illustrated in the figures include a QD-containing layer that does not include any SNPs. Although not depicted in all of the figures, any QD-containing layer can also include SNPs (GSNPs, PSNPs, or both) as an alternative to—or in addition to—any separate SNP-containing layers.

Figure 8:
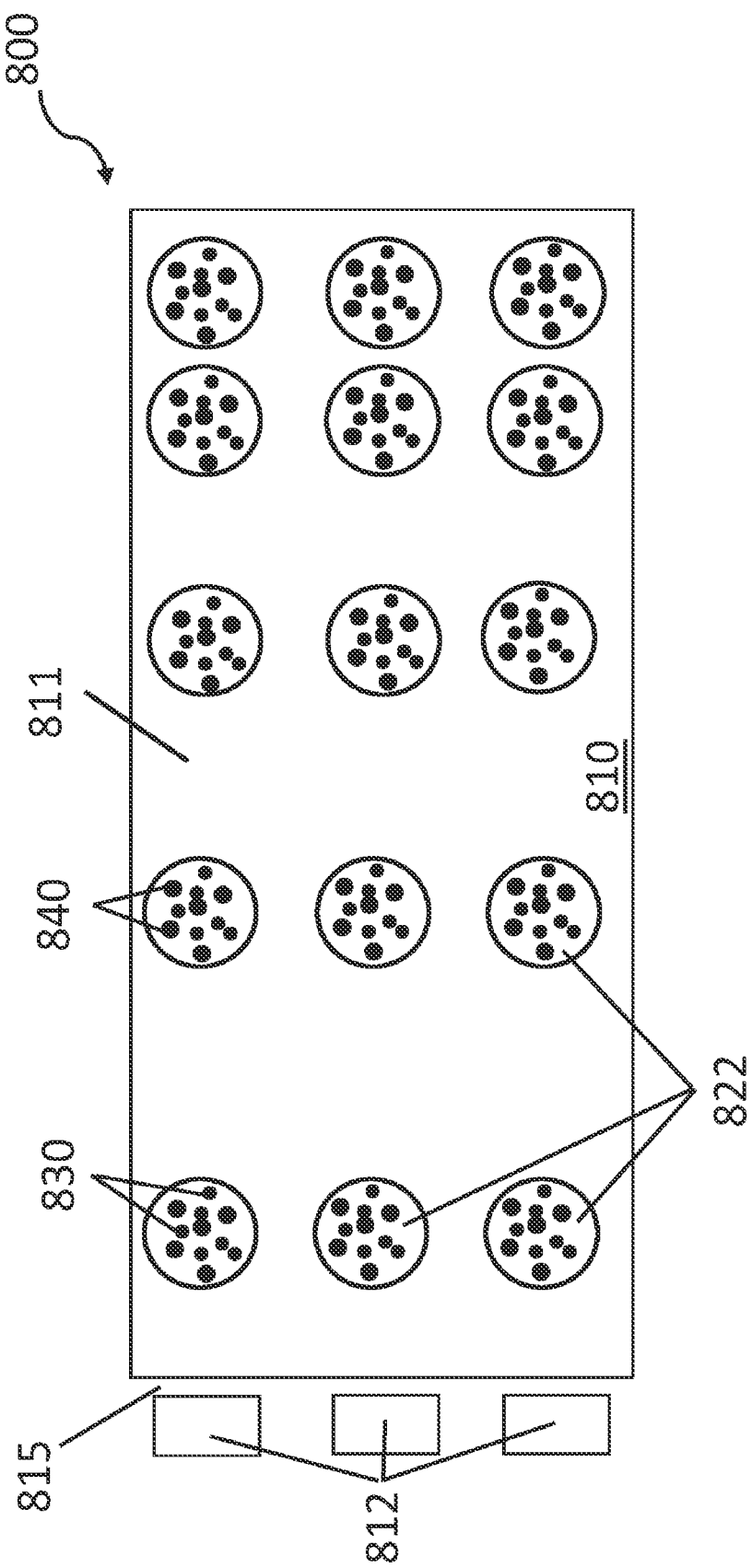
FIG. 8 shows a top view of one embodiment of an edge lit CED having a discontinuous quantum dot-containing layer.

FIG. 8 is a top plan view of CED 800 that incorporates QD materials into the subassembly of an LCD device using inkjet printing. Similar to the combination of light guide plate 660 and QD-containing layer 670 of FIG. 6, CED 800 can be used as a subassembly to achieve the same improvements. In this embodiment, CED 800 has a non-uniform QD-containing layer composed of a patterned array of QD-containing structures 822 deposited in confinement regions upon light guide plate 810. Inkjet printing is used to locally deposit QD-containing structures 822 onto first surface 811. The local density of these structures is controlled by the inkjet printing pattern. The number of QDs per QD-containing structure can be controlled by the QD concentration in the ink composition, by the inkjet drop volume, and/or by the number of inkjet drops per QD-containing structure. Surface treatment of first surface 811 before the printing process can be used to tailor the local wetting properties on the surface and, as a result, can control the size and the shape of the printed QD-containing structures. The surface treatment can be performed in a patterned fashion to increase printing resolution and structure profile. Light guide plate 810 is illuminated by LEDs 812 positioned at a near end edge 815. In this edge lit configuration, the intensity of the light in light guide plate 810 decreases along its length. As a result, light that is out-coupled from light guide plate 810 enters QD-containing structures 822 with a non-uniform light intensity distribution, wherein the intensity of the light out-coupled into the QD-containing structures closer to near end edge 815 is greater than the intensity of the light out-coupled into those that are close to far end edge 816. For this reason, the local density of QD-containing structures 822 has a gradient along the length of light guide plate 810, with a lower density of QD-containing structures 822 at near end edge 815 and a higher density of QD-containing structures 822 at the opposite edge of light guide plate 810. This arrangement of the QD-containing structures can compensate for the decrease in light intensity along the length of light guide plate 810, thereby generating a more uniform emission along the length of the CED. Though FIG. 8 depicts an ordered array of QD-containing structures 822 having a density gradient distribution, for various embodiments of CEDs of the present teachings utilizing QD-containing structures, any pattern of confinement regions having any of a variety of shapes and aspect ratios can be formed on the first surface 811 of light guide plate 810. Moreover, the size and packing density of the QD-containing structures can be determined by the manner in which a defined pattern of ink confinement regions is fabricated. In various embodiments of an array of QD-containing structures, the array is fabricated to provide a microlens array.

Figure 9:
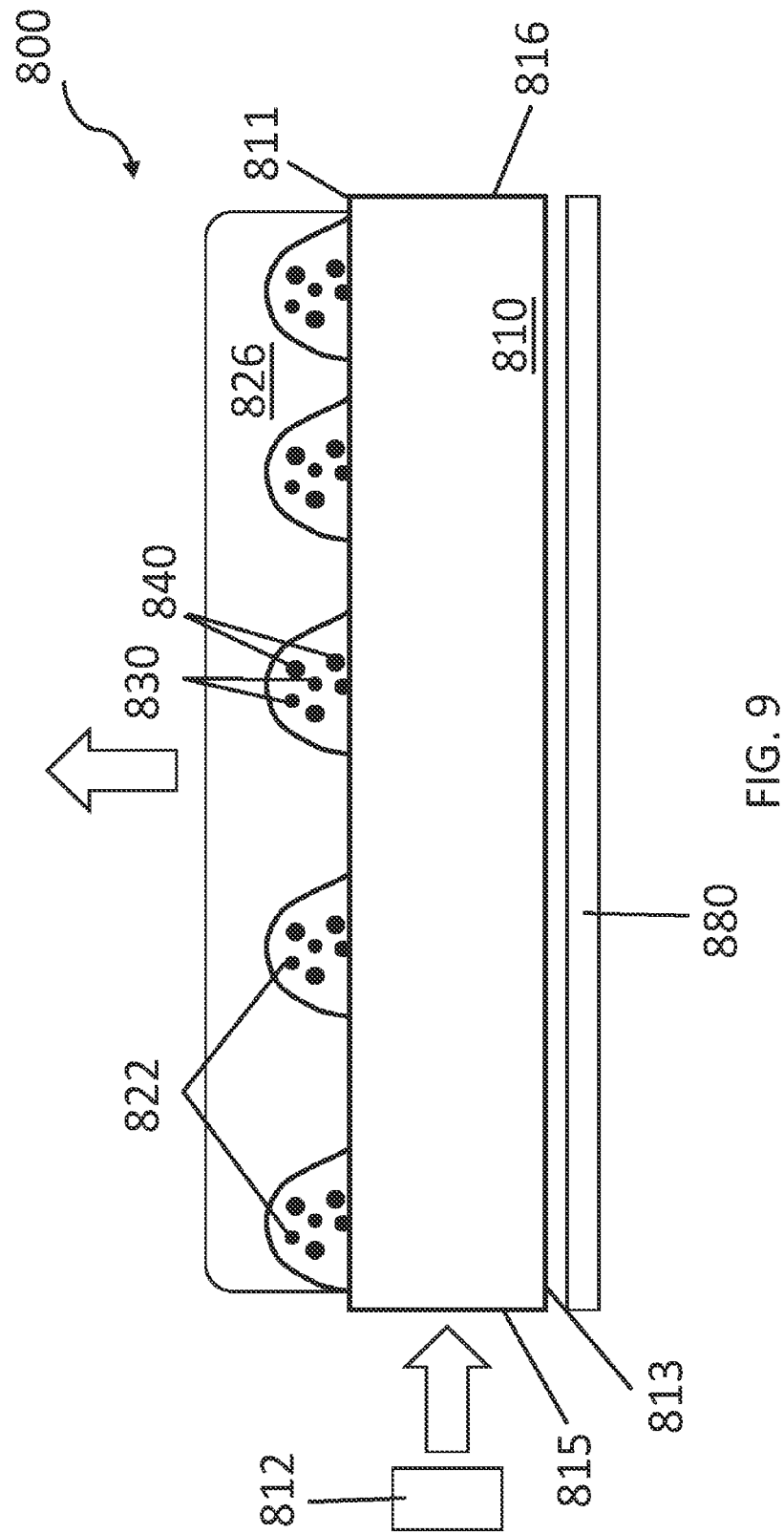
FIG. 9 shows a cross-sectional side view of the CED of FIG. 8.

FIG. 9 is a schematic cross-sectional view of CED 800. In the devices of FIG. 8 and FIG. 9, LED 812 can be a blue-emitting LED with, for example, but not limited by, an emission line at 445 nm. The QD-containing structures 822 in this embodiment of the CED are dome-shaped, but they can have any arbitrary shape. Each structure contains a plurality of QDs, where smaller QDs designated as QD 830 are green-emitting QDs and larger QDs designated as QD 840 are red-emitting QDs. The CED optionally includes a reflector 880 adjacent to a second surface 813 of light guide plate 810. Reflector 880 may be attached to light guide plate 810 using an optically clear adhesive (OCA); desirably one that has a refractive index that is the same as, or nearly the same as, that of the light guide plate.

As depicted in FIG. 9, CED 800 can include protective layer 826 deposited over the array of QD-containing structures 822. Protective layer 826 can be a thick layer that encapsulates the QD-containing layer. For example, protective layer 826 can be between about 1 µm to about 100 µm in thickness. Protective layer 826 can be a thick polymeric layer, such as polyethylene terephthalate (PET), or an (meth) acrylate-based polymeric film. It should be noted that when the protective layer is polymeric, it can be deposited using inkjet printing, as exemplified by US Patent Publication 2016/0024322.

Figure 10:
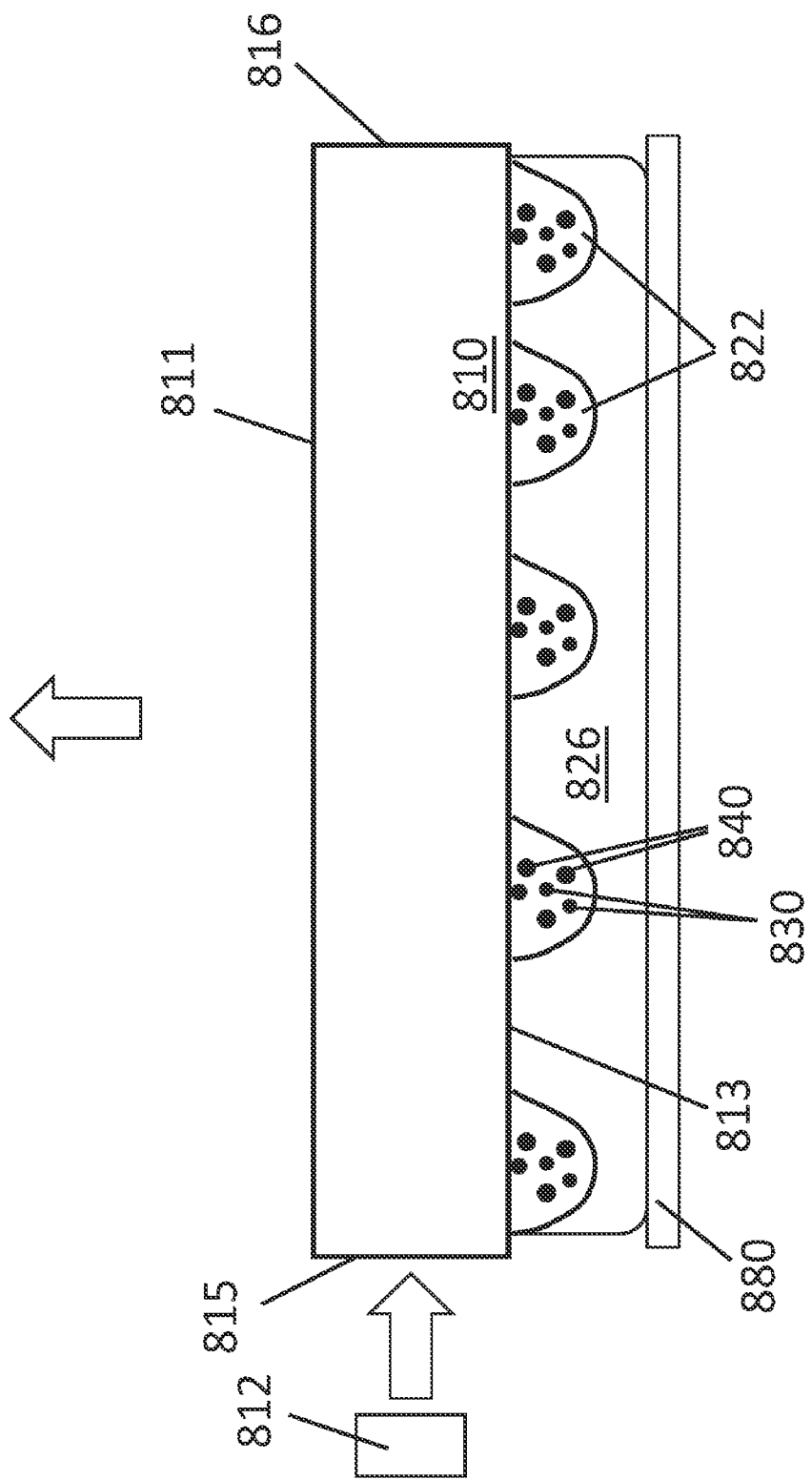
FIG. 10 shows a cross-sectional side of another embodiment of an edge lit CED having a discontinuous quantum dot-containing layer.

An alternative embodiment of a CED having LEDS 812 illuminating its near end edge 815 is shown in FIG. 10. As indicated by the use of like numerals, the components of this CED can be the same as those shown in FIG. 9, but in this embodiment the discontinuous QD-containing layer composed of QD-containing structures 822 and protective layer 826 have been printed onto second surface 813 of light guide plate 810, such that light emitted through second surface 813 passes through QD-containing structures 822 and protective layer 826, is reflected from reflector 880, and passes back through QD-containing structures 822, protective layer 826, and light guide plate 810 before exiting the CED through first surface 811. A similar geometry can be achieved by printing QD-containing structures 822 and protective layer 826B directly onto the surface of reflector 880 that faces light guide plate 810, rather than onto second surface 813 of light guide plate 810. After the protective layer has been printed on the reflector, the reflector can be laminated onto the second surface of the light guide plate.

In variations of the CEDs shown in FIGS. 8, 9, and 10 the QD-containing structures can be uniformly spaced along the length of the light guide plate, but the concentration of QDs in the QD-containing structures can be tailored, such that the concentration of QDs in the QD-containing structures increases as a function of distance from the near end edge of the light guide plate.

Figure 11:
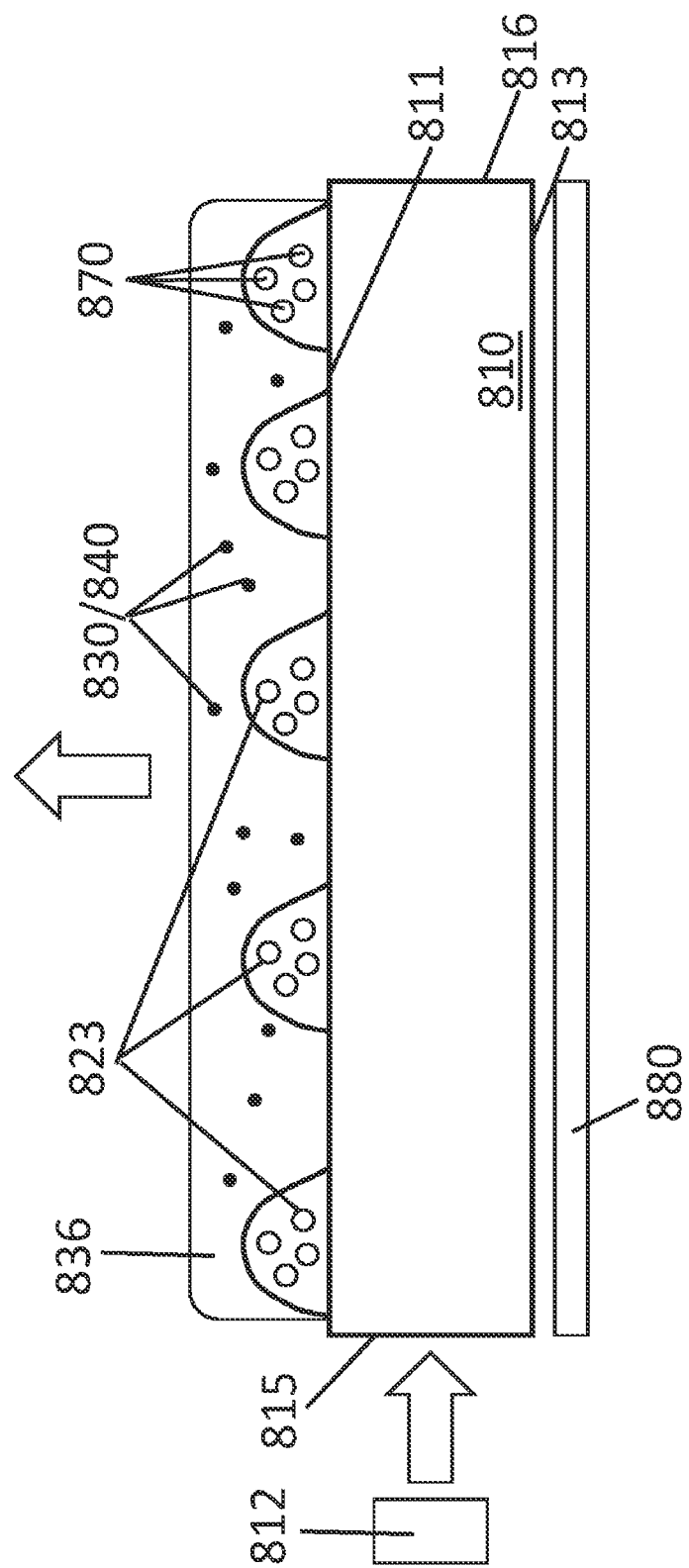
FIG. 11 shows a cross-sectional side view of an embodiment of an edge lit CED having a discontinuous scattering nanoparticle-containing layer and a separate quantum dot-containing layer.

FIG. 11 illustrates a CED in which the outcoupling functionality and color conversion functionality can be separated into adjacent layers. In this embodiment, SNPs 870 are dispersed in a discontinuous layer composed of a plurality of SNP-containing structures 823. These structures provide the outcoupling functionality of the device. Like QD-containing structures 822 in FIG. 9, SNP-containing structures 823 are dome-shaped, although they can have any arbitrary shape, and are distributed with a density gradient along the length of light guide plate 810. In this embodiment, QDs 830/840 are dispersed in the matrix of a continuous QD-containing layer 836 providing the color conversion functionality of the device. The effect of the SNP concentration gradient in this embodiment, and in other embodiments, of the CED is to improve the uniformity of the light intensity out-coupled from light guide plate 810 into QD-containing layer 836 and, ultimately, also the uniformity of the intensity of the light exiting the CED.

In a variation of the CED shown in FIG. 11 the SNP-containing structures can be uniformly spaced along the length of the light guide plate, but the concentration of SNPs in the SNP-containing structures can be tailored, such that the concentration of SNPs in the SNP-containing structures increases as a function of distance from the near end edge of the light guide plate.

For simplicity, continuous QD-containing layer 836 is depicted in this and other embodiments as containing QDs having the same size. However, it should be understood that the QD-containing-layers in the CEDs would include different types of QDs, including green-emitting QDs, red-emitting QDs, blue-emitting QDs, and combinations of two or more thereof.

Figure 12:
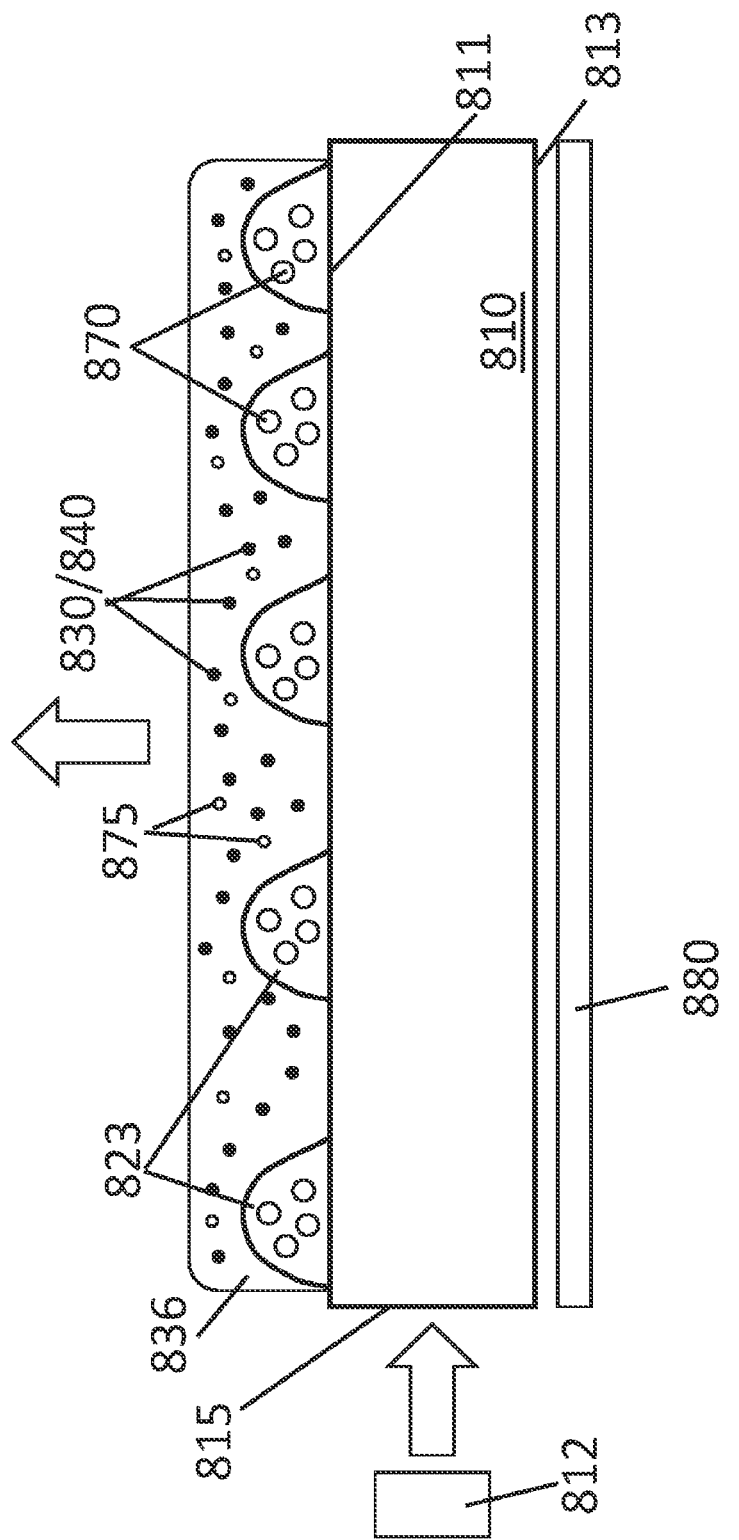
FIG. 12 shows the CED of FIG. 11 having plasmonic scattering nanoparticles in the quantum dot-containing layer.

FIG. 12 is provided to explicitly depict one example of a CED that includes both GSNPs and PSNPs. Thus, unlike in the other figures discussed herein, GSNPs and PSNPs are represented by differently sized open circles. In particular, the larger open circles in FIG. 12 are used to represent GSNPs, while the smaller open circles are used to represent PSNPs. In the embodiment depicted in FIG. 12, QD-containing layer 836 includes PSNPs 875 dispersed in its matrix and GSNPs 823 are included in a separate, discontinuous layer.

Figure 13:
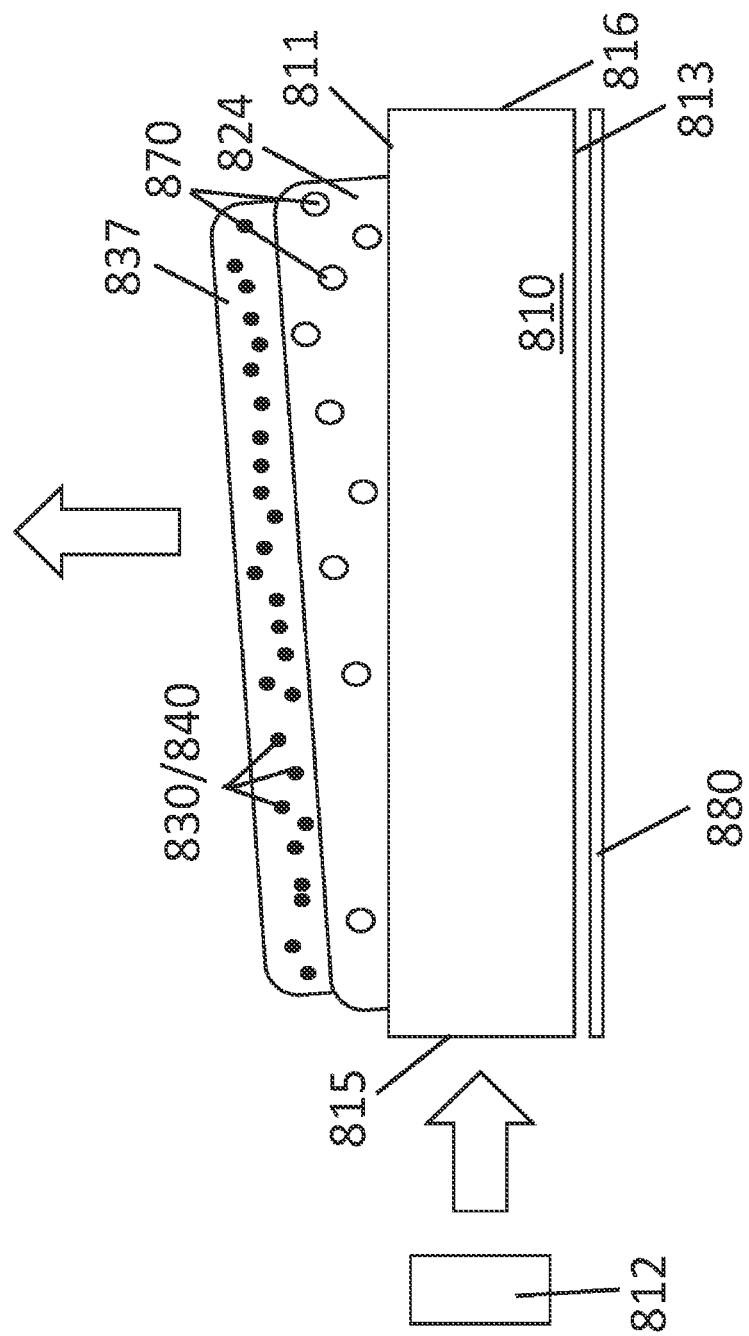
FIG. 13 shows a cross-sectional side view of an embodiment of an edge lit CED having a continuous scattering nanoparticle-containing layer, with a variable thickness along its length, and a separate quantum dot-containing layer.

FIG. 13 shows an embodiment of a CED in which the SNPs 870 are dispersed in a continuous SNP-containing layer 824 and the QDs are dispersed in a separate, continuous QD-containing layer 837 overlying SNP-containing layer 824. In embodiments of the CEDs where the scattering nanoparticles and the quantum dots are located in separate layers, the intensity of the light outcoupled from the layer containing the SNP has a uniform intensity distribution, even when the light outcoupled from the light guide plate does not—as in the case of a light guide plate that is illuminated by a light source at its end edge. Because the light outcoupled from the layer containing the SNPs has a uniform intensity along its length, the QD-containing layer need not have a QD concentration gradient.

In the embodiment shown in FIG. 13, continuous SNP-containing layer 824 has been printed directly onto first surface 811 of light guide plate 810 and continuous QD-containing layer 837 has been printed directly on continuous SNP-containing layer 824. In this configuration, light emitted through first surface 811 passes through SNP-containing layer 824 and scatters from SNPs 870 to cause the outcoupling of the light to QD-containing layer 837. In order to compensate for the higher light intensity from near end edge 815 of light guide 810, there is a gradient in the density of SNPs 870 along the length of SNP-containing layer 824, whereby the density of the SNPs increases as a function of distance from near end edge 815. To further compensate for the non-uniform light intensity emitted from light guide plate 810, SNP-containing layer 824 also has a variable thickness along its length, whereby the thickness of the SNP-containing layer increases as a function of distance from near end edge 815. An alternative geometry can be achieved by printing SNP-containing layer 824 directly onto second surface 813 of light guide plate 810 and printing QD-containing layer 837 onto first surface 811 of light guide plate 810; or by printing SNP-containing layer 824 directly onto the surface of reflector 880 that faces light guide plate 810 and printing QD-containing layer 837 onto first surface 811 of light guide plate 810.

Figure 14:
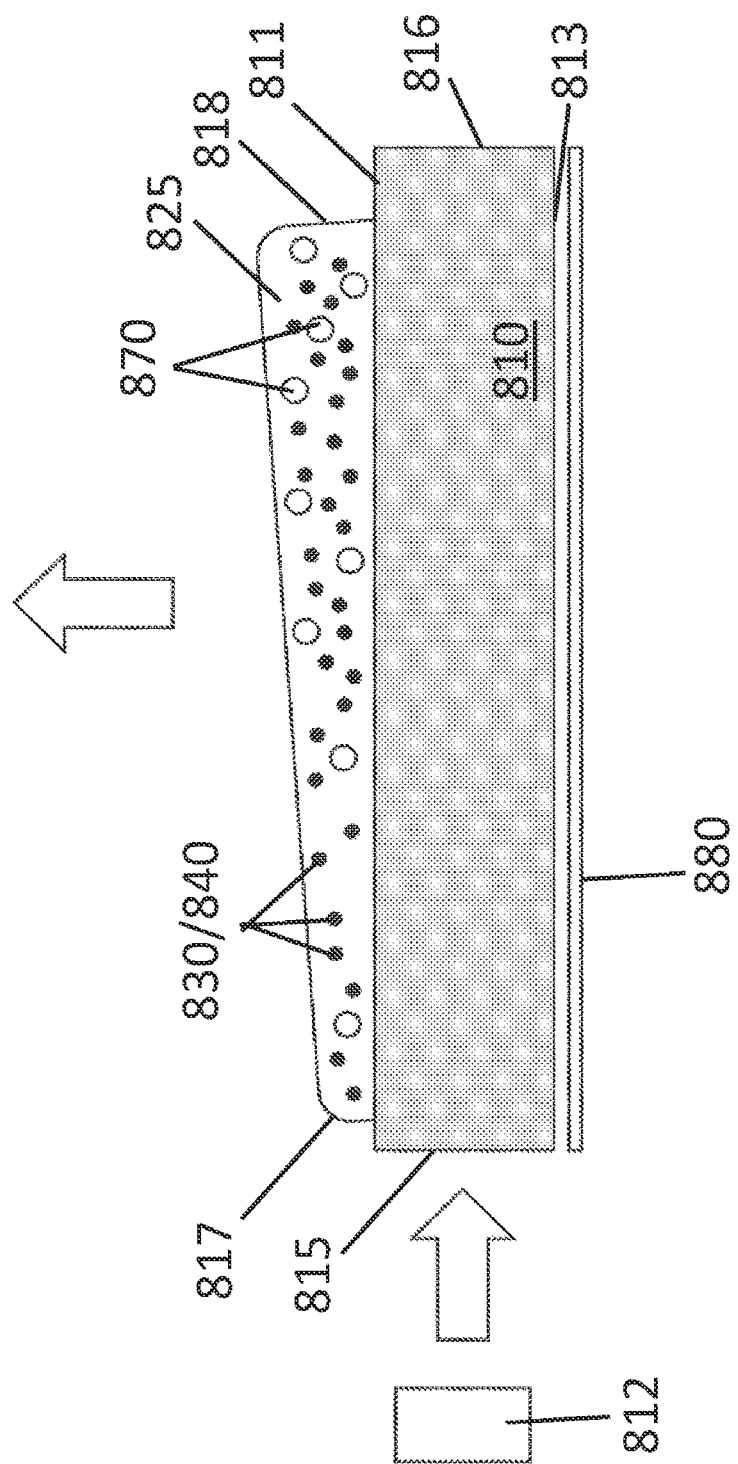
FIG. 14 shows a cross-sectional side view of an embodiment of an edge lit CED having a continuous layer that contains both quantum dots and scattering nanoparticles and has a variable thickness along its length.

FIG. 14 shows a variation of the CED of FIG. 13 in which the QDs 830/840 and the SNPs 870 are combined in a single layer, which is referred to herein as a QD/SNP-containing layer 825. Like SNP-containing layer 824 in the CED of FIG. 13, QD/SNP-containing layer 825 has a gradient in the density of SNPs 870, as well as a variable thickness, along its length. Also, like QD-containing layer 837 in the CED of FIG. 13, QD/SNP-containing layer 825 has a uniform QD concentration along its length. However, due to the wedge-shaped profile of QD/SNP-containing layer 825, the surface density of QDs 830/840 (that is—the density of QDs per mm², as viewed through the top surface of the layer) increases from near end edge 817 to far end edge 818. An alternative geometry can be achieved by printing QD/SNP-containing layer 825 directly onto second surface 813 of light guide plate 810; or by printing QD/SNP-containing layer 825 directly onto the surface of reflector 880 that faces light guide plate 810. This structure can be achieved, for example, by simultaneously printing with two different inks (a first ink containing the QDs and a second ink containing the SNPs). Alternatively, a layer could be printed using the first ink followed by a layer using the second ink, followed by interdiffusion of these printed layers yield layer 825.

Figure 15:
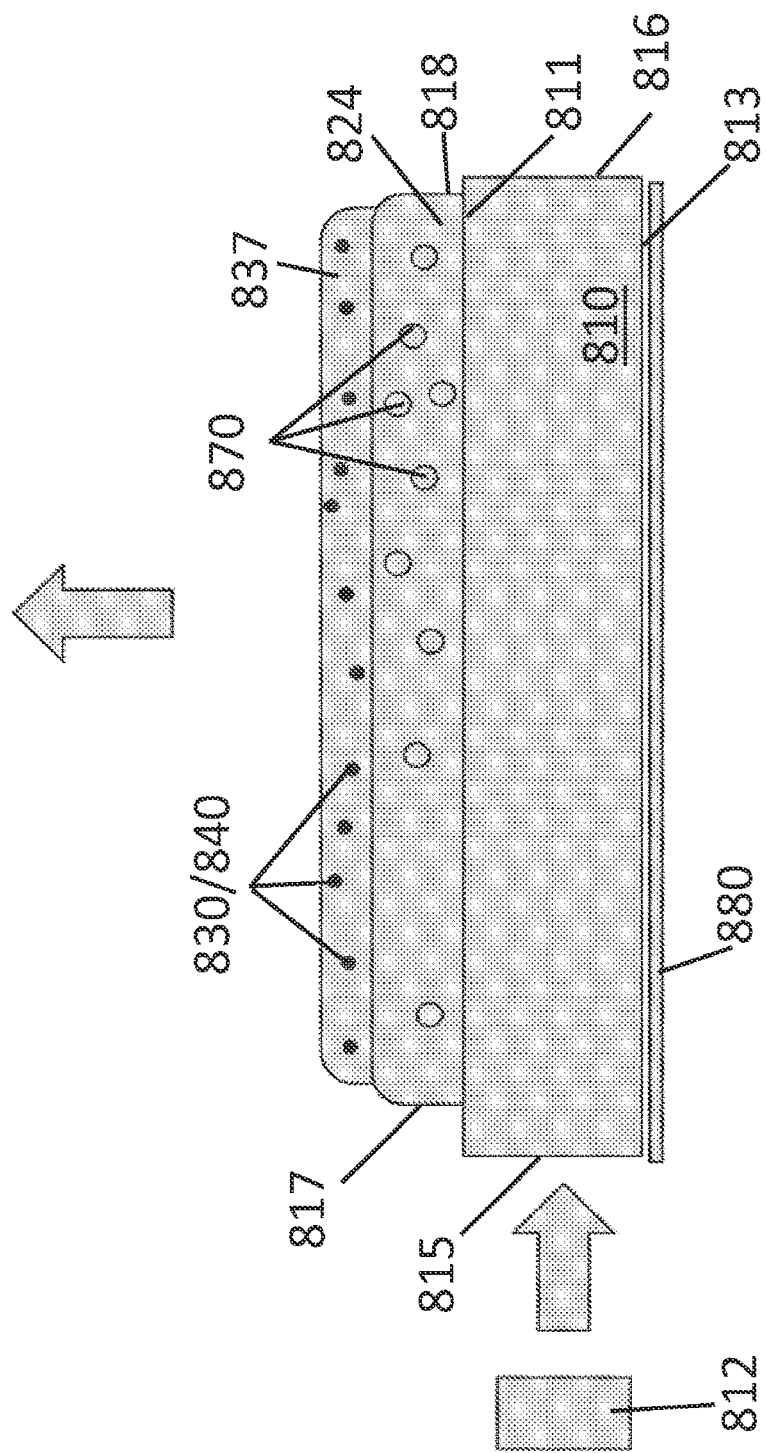
FIG. 15 shows a cross-sectional side view of an embodiment of an edge lit CED having a continuous scattering nanoparticle-containing layer, with a uniform thickness along its length, and a separate quantum dot-containing layer.
Figure 16:
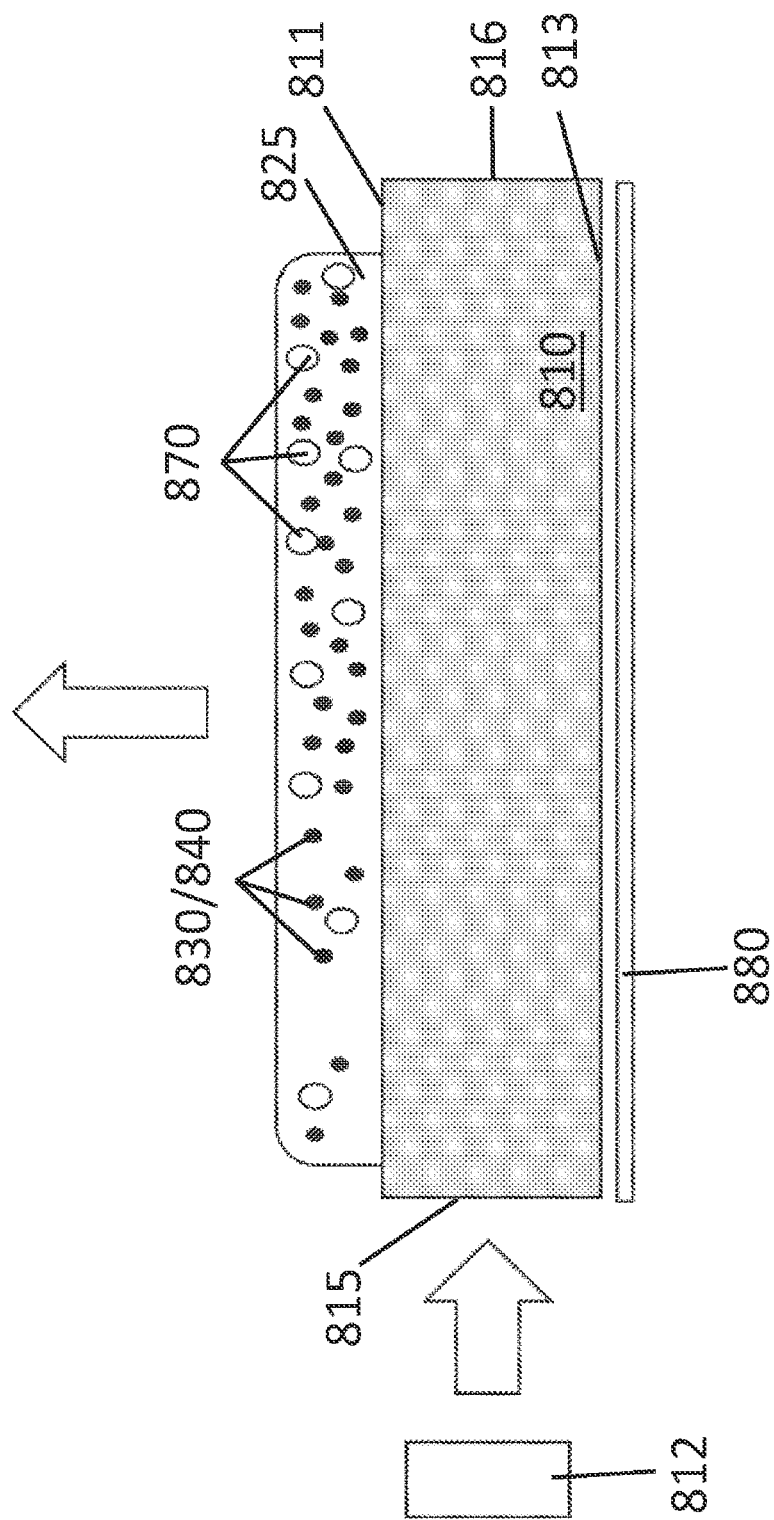
FIG. 16 shows a cross-sectional side view of an embodiment of an edge lit CED having a continuous layer that contains both quantum dots and scattering nanoparticles and has a uniform thickness along its length.
Figure 17:
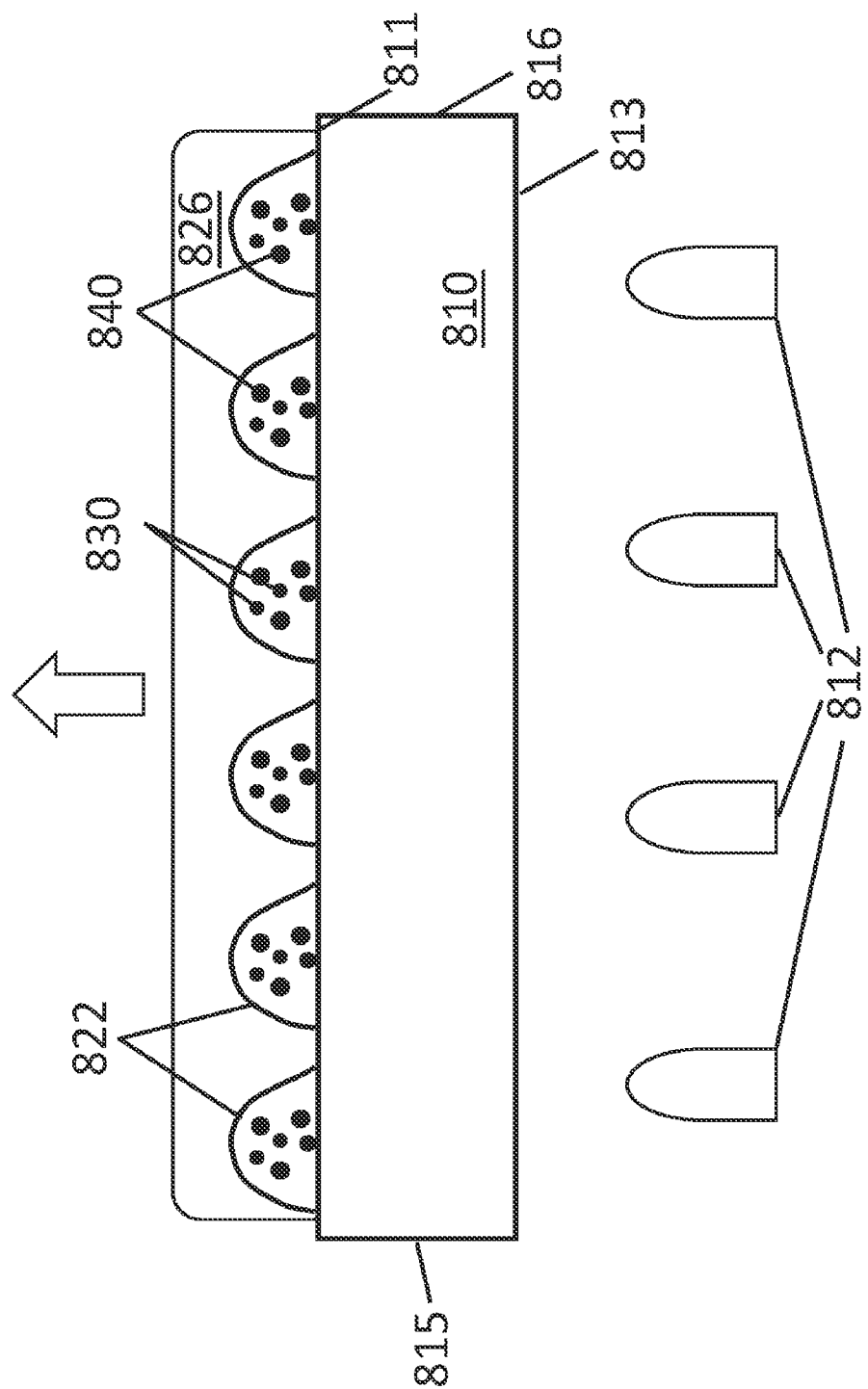
FIG. 17 shows a cross-sectional side view of an embodiment of a back lit CED having a discontinuous quantum dot-containing layer.
Figure 18:
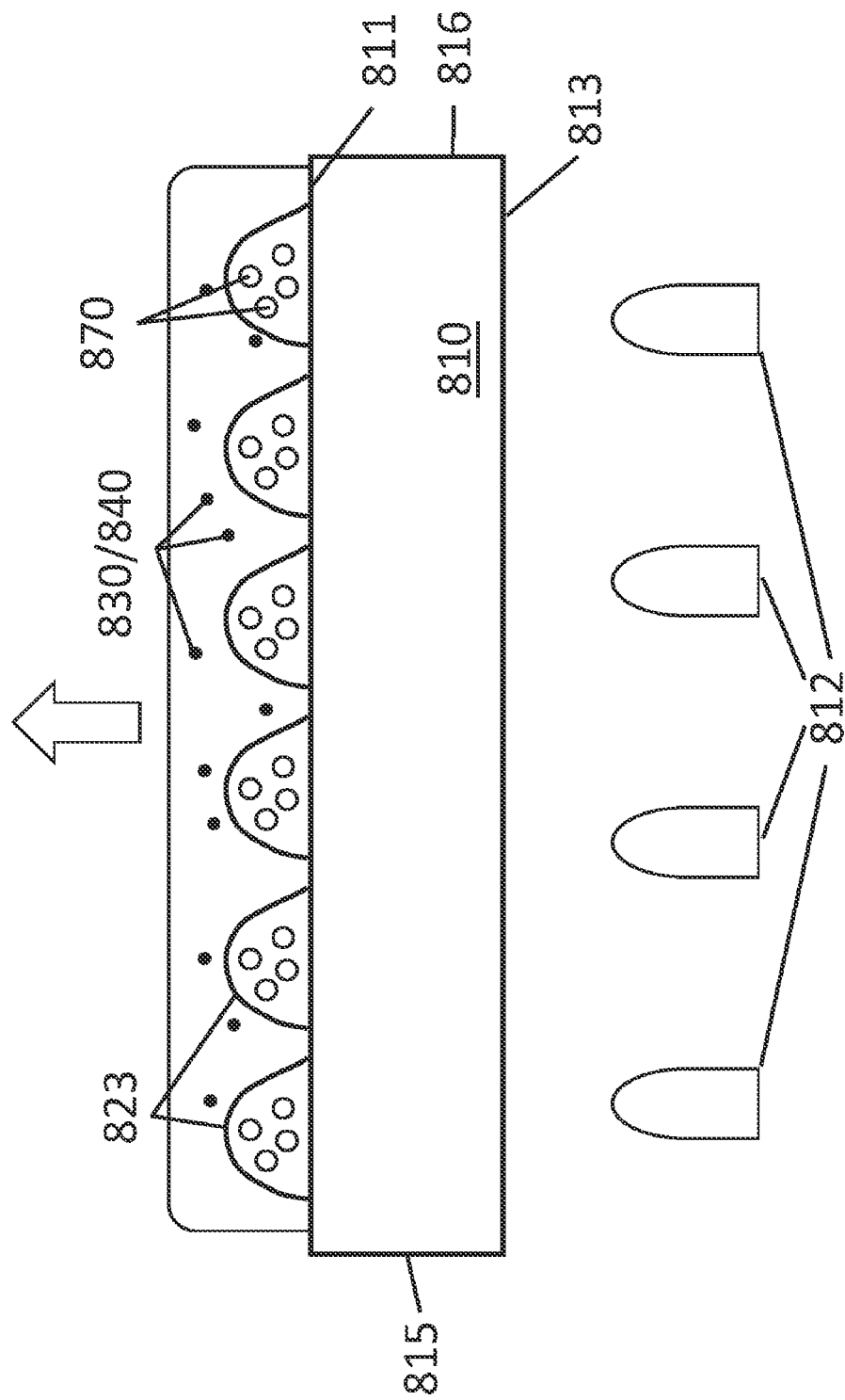
FIG. 18 shows a cross-sectional side view of an embodiment of a back lit CED having a discontinuous scattering nanoparticle-containing layer and a separate quantum dot-containing layer.
Figure 19:
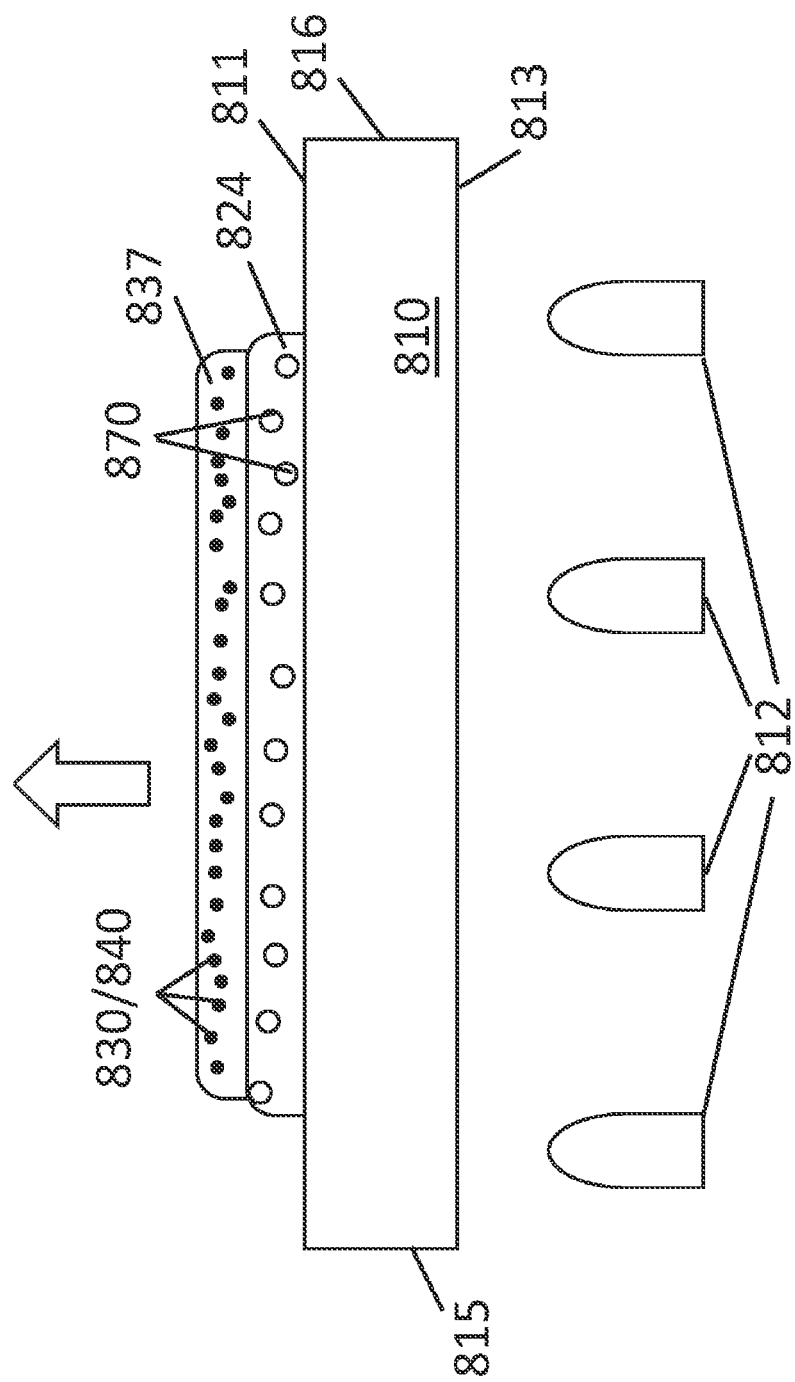
FIG. 19 shows a cross-sectional side view of an embodiment of a back lit CED having a continuous scattering nanoparticle-containing layer, with a uniform thickness along its length, and a separate quantum dot-containing layer.
Figure 20:
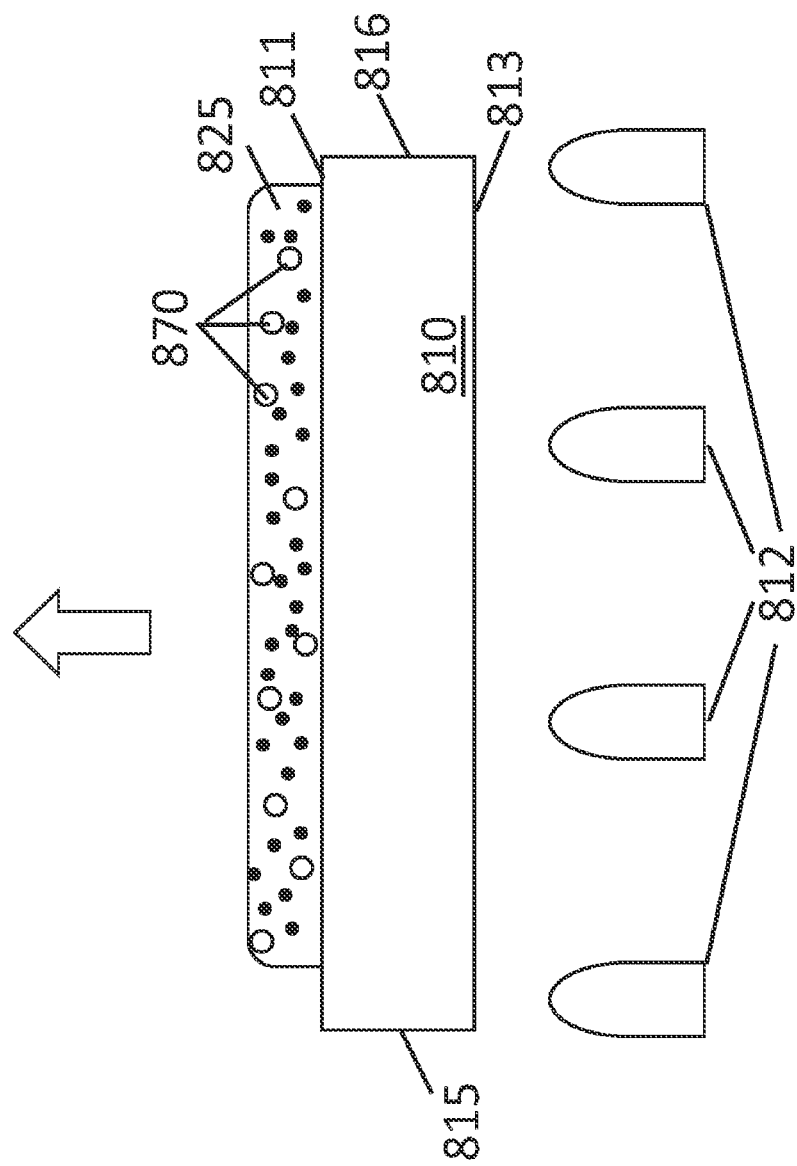
FIG. 20 shows a cross-sectional side view of an embodiment of a back lit CED having a continuous layer that contains both quantum dots and scattering nanoparticles and has a uniform thickness along its length.

FIGS. 15 and 16 show variations of the CEDs of FIGS. 13 and 14, respectively, in which the SNP-containing layer 824 (in the case of FIG. 15) and QD/SNP-containing layer 825 (in the case of FIG. 16) have a uniform thickness along their lengths.

Although the concentration gradients for the QDs and/or the SNPs in the CEDs of FIGS. 9-16 show a particle concentration that increases linearly or substantially linearly from a near end edge to a far end edge, other particle concentration patterns can be used to provide a non-uniform particle concentration through all or a portion of a printed layer. For example, the particle concentration can increase exponentially across the layer or may have a regular or irregular periodic variation across the layer. By way of further illustration, the concentration of QDs and/or scattering nanoparticles can increase from the far end edge of a layer to the near end edge of the layer; from the top of a layer to the bottom of the layer; from the bottom of a layer to the top of a layer, or from a peripheral portion of the layer to the center of the layer.

FIGS. 17, 18, 19, and 20 show variations of the CEDs of FIGS. 9, 11, 15, and 16, respectively, in which light guide plate 810 is back lit, rather than edge lit. (It is noted again that, although the device substrate is illustrated with a light guide plate in these embodiments, other device substrate could be used, including a diffuser or a polarizer.) In each of these CEDs, one or more LEDs 812 illuminate light guide plate 810 through second surface 813, rather than near end edge 815. In the back lit devices, there is no edge-to-edge gradient in the intensity of light emitted from light guide plate 810. Therefore, QD-containing structures 822 and SNP-containing structures 823 may be uniformly spaced along first surface 811 of light guide plate 810 in the CEDs of FIGS. 17 and 18, and SNP-containing layer 824 and QD/SNP-containing layer 825 may have a uniform density of SNPs 870 along their lengths in FIGS. 19 and 20. Although the QD-containing structures 822 in the embodiments shown in FIGS. 17-20 include a mixture of red light-emitting QDs 840 and green light-emitting QDs 830, the red light-emitting QDs 840 and the green light-emitting QDs could also be separated in different QD-containing structures 822. LEDs 812 may be, for example, blue LEDs and QD-containing structures 822 may include red light-emitting QDs and green light-emitting QDs. When such a device is in operation, the blue light emitted from blue LEDs 812 is absorbed by red light-emitting QDs 840 and green light-emitting QDs 830, which convert at least a portion of the blue light into red light and green light. The light output from the device will be a mixture of the unconverted blue light, the red light, and the green light. In some embodiments of the device, the light output will be white light. An embodiment of a device architecture that can be used to partially convert blue light into a mixture of blue, red, and green light is described in U.S. Pat. No. 8,330,348.

Although not shown here, other embodiments of the edge lit CEDs could also be reconfigured as back lit CEDs, including the embodiments depicted in FIGS. 9, 12, 13, and 14 and their alternative geometries.

Figure 21:
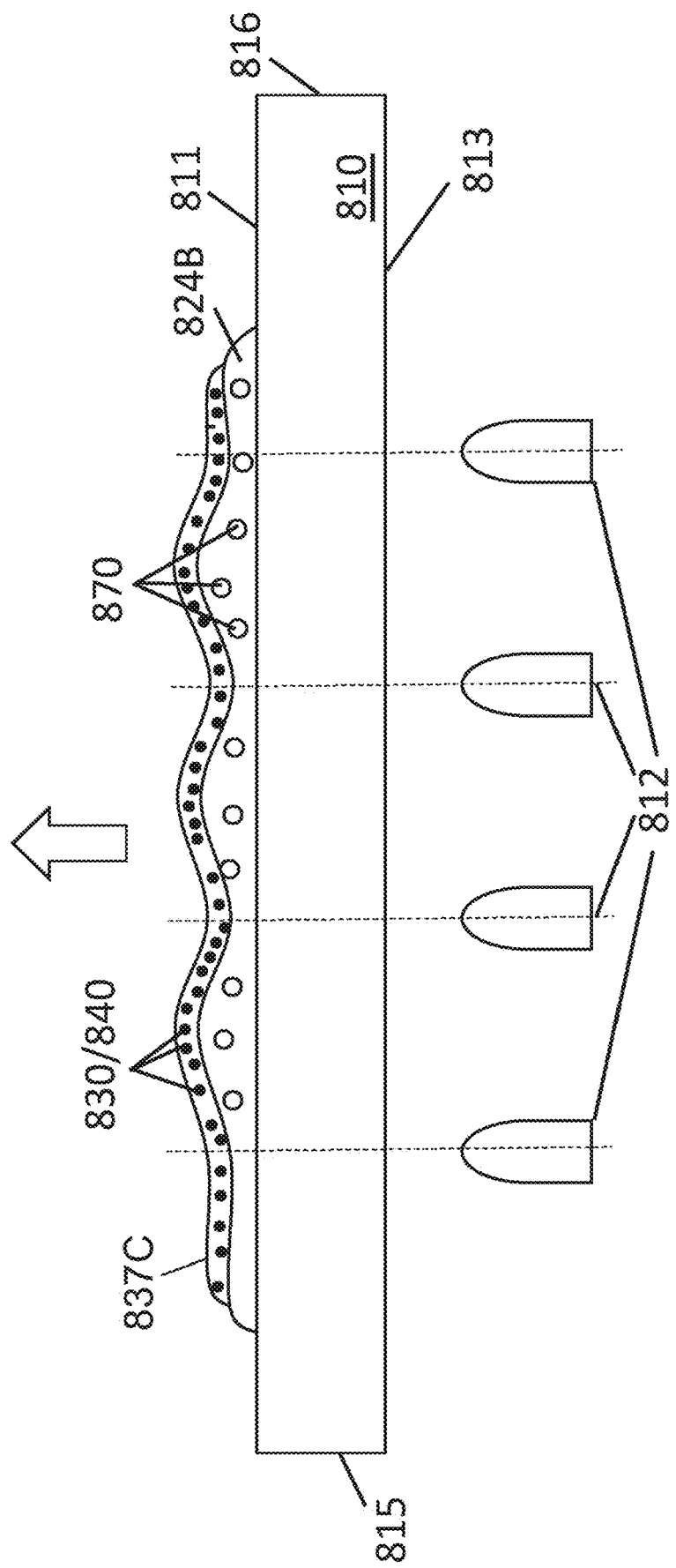
FIG. 21 shows a cross-sectional side view of an embodiment of a back lit CED having a continuous scattering nanoparticle-containing layer, with a thickness modulation along its length, and a separate quantum dot-containing layer, with an optional thickness modulation along its length.

While there is no edge-to-edge gradient in the intensity of the light emitted from surface 811 light guide plate 810 in the back lit CEDs of FIGS. 17-20, the intensity of the light emitted from light guide plate 810 can be non-uniform due to the placement of LEDs 812, with a higher intensity of light entering the portions of the light guide plate disposed directly above the LEDs and a lower intensity of light entering the portions of the light guide plate disposed between the LEDs. FIG. 21 shows an embodiment of a CED that compensates for this intensity non-uniformity. As illustrated in this figure, thicknesses of SNP-containing layer 824B and QD-containing layer 837C can be modulated along their lengths.

A particle-containing layer in a CED can be printed as a continuous layer having a QD concentration gradient, a GSNP concentration gradient, a PSNP concentration gradient, or a combination thereof, via the sequential or simultaneous inkjet printing of three or more different ink compositions. Although the layers depicted in FIGS. 8-16 as having a linear or substantially linear QD and/or SNP concentration gradient along their lengths, the layers can be printed with other gradient patterns, including exponential gradients, as discussed above.

One embodiment of a method for inkjet printing a continuous layer having a QD concentration gradient and/or a SNP concentration gradient utilizes three inks. In some embodiments of these multi-ink printing methods, the first ink composition contains the QDs and a binder; the second ink composition contains the SNP and a binder; and the third ink composition contains a binder, without the QDs or the SNPs. Using this method, the concentration of particles (QDs or SNPs) printed onto a given surface area will be determined by the concentration of the QDs and SNPs in their respective ink compositions and by the volume ratios of the three ink compositions printed over that surface area. The volume of an ink composition can be controlled by controlling the drops of the ink composition printed per area ("DPA"). By way of illustration, a first portion of a layer that is formed by printing the three ink compositions in volumes that satisfy the relationship $(DPA)_{binder} > (DPA)_{SNP} > (DPA)_{QD}$ will have a lower concentration of SNPs and QDs than another portion of the film layer that is formed by printing the three ink compositions in volume ratios that satisfy the relationship $(DPA)_{QD} > (DPA)_{SNP} > (DPA)_{binder}$, provided that the total number of drops per area $(DPA)_{binder} + (DPA)_{SNP} + (DPA)_{QD}$ remains constant.

The three ink compositions can be printed over the surface of a substrate, such as a light guiding plate, a transparent substrate, a diffuser, or a reflector, simultaneously, sequentially, or a combination thereof. For example, two of the ink compositions can be printed simultaneously and the third can be printed subsequently. If the different ink compositions are intended to form separate and distinct layers in the printed film, the ink compositions can be printed sequentially and allowed to dry or cure prior to the printing of a subsequent layer. Alternatively, if the different ink compositions are intended to form a single blended layer in which the binders and particles in the ink compositions are intermixed, the ink compositions can be printed simultaneously or sequentially. When different ink compositions are printed sequentially and a blended layer is desired, the printing should take place on a timescale that allows the ink compositions to mix into a single layer before the ink compositions is dried or cured into a film.

A method for inkjet printing a QD-containing layer on a substrate surface is illustrated schematically in FIG. 22. The method will be illustrated in the description that follows as a method for inkjet printing a layer containing both QDs and SNPs on a substrate surface, wherein the layer has a concentration gradient in the and SNPs from one edge to the layer to the other. However, the same equipment and general procedure also could be used to print layers containing only QDs or only SNPs by varying the ink compositions used and the order in which the ink compositions are deposited. In addition, the ink compositions used to inkjet print the various layers are described generally with reference to FIG. 22. A more detailed description of ink compositions that can be used to form one of more layers in a CED is provided below.

As shown in panel (a) of FIG. 22, the inkjet printing process can begin by printing a layer of material 2201 onto a surface 2202 of a substrate 2203. As previously discussed, the substrate can take the form of a variety of device substrates, such as a light guide, a reflector, or a polarizer. In the embodiment depicted here, three inkjet nozzles 2204A, 2204B, and 2204C, each of which prints droplets of a different ink composition 2205A, 2205B, and 2205C, are used. By way of illustration, ink composition 2205A can contain curable polymer binder precursors, without any QDs or SNPs. This ink composition acts as a diluent for the other ink compositions during the printing of later 2201. Ink composition 2205B can contain curable polymer binder precursors and QDs and ink composition 2205C can contain a curable polymer binder precursors and SNPs. To form printed layer 2201, droplets of ink compositions 2205A, 2205B, and 2205C are jetted from nozzles 2204A, 2204B, and 2204C, respectively, either simultaneously or sequentially onto surface 2202. As the printing progresses from a first edge 2206 to a second edge 2207 of printed layer 2201, the relative volume ratios of the three ink compositions are adjusted so that the desired volumetric densities of the QD and SNP are achieved. For example, the density of the SNPs is lowest at first edge 2206 and higher at second edge 2206, while the volume density of QDs remains constant from edge-to-edge. The polymer binder precursors, which form the matrix of the cured layer after curing, can the same or different for each ink composition. If the ink compositions are to be printed successively and then allowed to mix to form a single layer, the polymer binder precursors should be miscible. Once printed, the layer can be cured by, for example, UV curing, thermal curing, or a combination thereof. Although not shown here, if the QDs and SNPs are inkjet printed as separate layers, the polymer binder precursors can be the same. This may be advantageous for devices in which the layers desirably have the same refractive index.

Optionally, as shown in panel (b) of FIG. 22, a second layer 2210 can be printed over first printed layer 2201 using one of more of inkjet nozzles 2204A, 2204B, and/or 2204C and this layer can also undergo a post-deposition cure. Next a polymeric protective layer 2211 that is free of QDs and SNPs can be formed over second layer 2210 by inkjet printing an ink composition 2205D that includes protective, curable polymer precursors over the second layer and curing the ink composition (panel (c)). Once cured, polymeric protective layer 2211 helps to protect first layer 2201 and second layer 2210 from exposure to damaging effects of the atmosphere, such as water, oxygen, and/or ozone, and allows the CED to be handled prior to incorporation into a larger device structure. In addition, printed polymeric protective layer 2211 can protect layers 2201 and 2210 from the damaging effects of subsequent device processing steps, such as plasma enhanced chemical vapor deposition (PECVD). For example, as shown in panel (d), PECVD may be used to deposit an inorganic barrier layer 2212 over polymeric protective layer 2211. Inorganic barrier layer, provides an enhanced degree of protection from the atmosphere. In various embodiments, barrier layer 2212 can be a deposited dense layer of an inorganic material, such as selected from classes of inorganic materials including metal oxides, metal nitrides, metal carbides, metal oxynitrides, metal oxyborides, and combinations thereof. For example, but not limited by $SiN_x$, $Al_2O_3$, $TiO_2$, $HfO_2$, $SiO_xN_y$, or combinations thereof can be used for inorganic barrier layer 2212. Alternatively, as shown in panel (e) a polymeric film 2213 can be laminated directly onto polymeric protective layer 2211. (Polymeric film 2213 could also be laminated directly onto inorganic barrier layer 2212 in panel (d).) Laminated polymeric film 2213 can provide an additional degree of protection and can permanently laminated to the structure, such that it is ultimately incorporated into a final device structure, or temporarily attached, such that it is removed prior to the final device assembly. Panel (f) in FIG. 22 illustrates the temporary attachment of laminated polymeric film 2213 to the underlying structure, wherein a coating of optically clear adhesive 2214 is disposed between printed polymeric protective layer 2211 and laminated polymeric film 2213.

While the methods for printing film layers having particle concentration gradients described herein and illustrated in FIG. 22 use at least three ink compositions, more than three ink compositions or fewer ink compositions can be used. For example, the printing methods can use two or more different QD-containing ink compositions having different concentrations or types of the quantum dots, or two or more different scattering nanoparticle-containing ink compositions having different concentrations or types of the scattering nanoparticles. For example, in some embodiment of the printing methods, an ink composition containing PSNPs and a binder can be used along with a separate ink composition containing GSNPs and a binder. Alternatively, only two ink compositions can be used. For example, if a layer containing only one type of particles (e.g., only QDs, only GSNPs, or only PSNPs) is being printed, the first ink composition can contain the particles and a binder and the second ink composition can contain a binder, without the particles. By printing the two ink compositions simultaneously or sequentially and varying the drops per area of the two ink compositions during the printing process, as discussed above with respect to a three-ink composition protocol, a layer having a particle gradient along its length can be achieved. Alternatively, this concept also provides for more than three inks. For example, several inks for SNP with binder can be used where the SNP are PSNP of different particle sizes.

Figure 23:
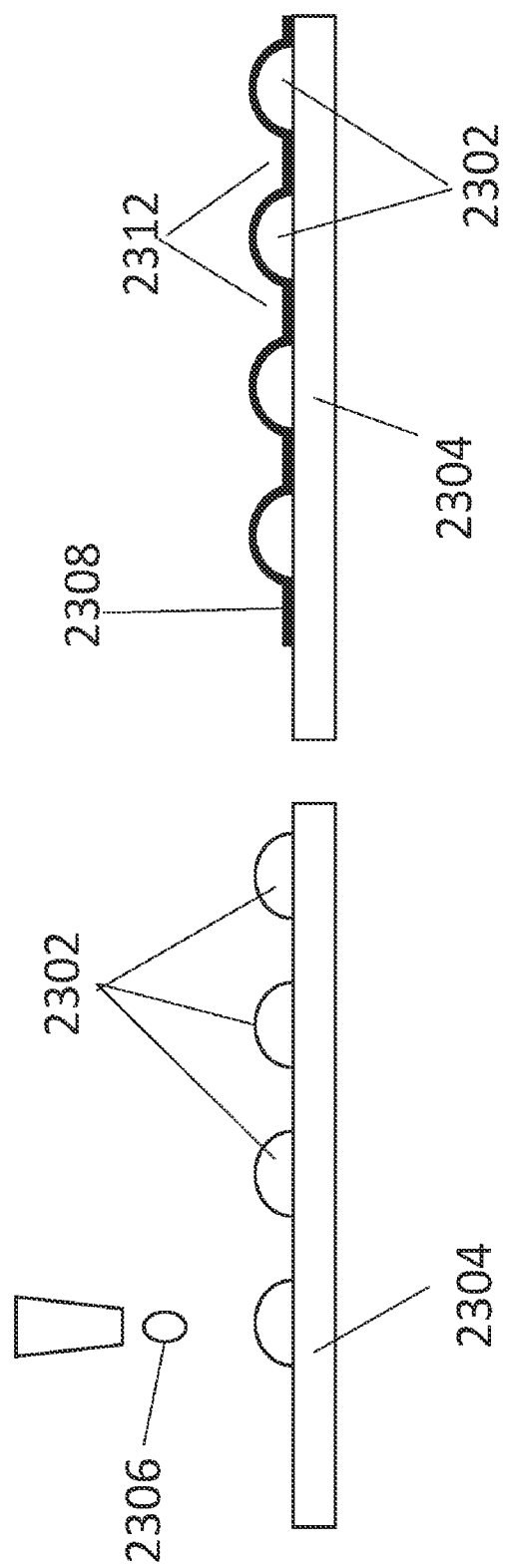
FIG. 23 is a schematic illustration of a method for forming a sealing layer on a substrate and, optionally, also a barrier layer.
Figure 24:
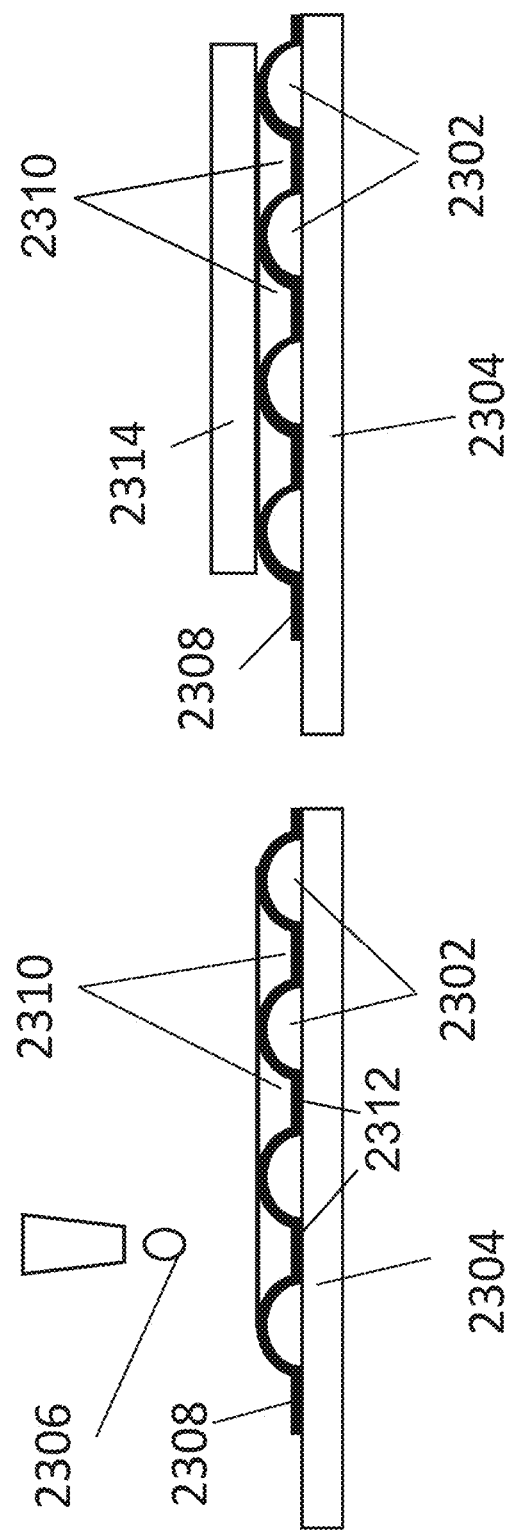
FIG. 24 is a schematic illustration of a method of printing one or more layers of a CED between the sealing banks of a sealing layer and then sealing the CED layers.

For some applications, it can be advantageous to provide a sealing layer around the perimeter of the CED or at least around one or more layers of the CED. These sealing layers can be sealed against another device layer to provide a water and/or oxygen proof edge seal. CEDs fabricated with sealing layers can be cut to size and sealed into a device without the risk of lateral ingress of water and/or oxygen and subsequent damage to the CED. FIGS. 23 and 24 show schematic illustrations of a method for forming a CED having a sealing layer. In this embodiment, the sealing layer includes a plurality of sealing banks 2302 that are inkjet printed onto a substrate 2304 using an ink composition 2306 that includes curable sealing materials, such as curable monomers, oligomers, polymers, or mixtures thereof, and, optionally, SNPs (FIG. 23, left panel). In some embodiments of the sealing layers, sealing banks 2302 have SNPs dispersed therein. In these embodiments, the SNPs can serve to help redirect light from a light source, such as a back-lit unit, into a QD-containing layer printed between the sealing banks (as described below). Like the QD- and SNP-containing layers of the CED, described above, the SNPs within the sealing banks or in different sealing banks can have a non-uniform (e.g., gradient) density distribution across the sealing layer in order to provide the CED with more uniform light emission. Although sealing banks 2302 in FIG. 23 are depicted as being inkjet printed, other fabrication methods, such as nano-imprinting can be used to form these banks.

Optionally, a barrier layer 2308 is formed over sealing barriers 2302 and the exposed portions of substrate 2304 (FIG. 23, right panel). This barrier layer, which can be, for example, an inorganic material, such as by $SiN_x$, $Al_2O_3$, $TiO_2$, ZnO, $ZrO_2$, $HfO_2$, $SiO_xN_y$, or combinations thereof, provides additional protection from water and/or oxygen.

Once the barrier layer has been formed, one or more layers of a CED 2310, including QD-containing layers and/or SNP-containing layers, can be inkjet printed into the recesses 2312 defined between sealing banks 2302, as shown in FIG. 24 (left panel). A temporary or permanent film 2314 can then be sealed to sealing banks 2302 to cover and protect the CED layers 2310 (FIG. 24, right panel).

It should be noted that, while the formation of various device layers is described herein as including a curing step, device layers formed from non-curable compositions may be formed simply by drying.

Curable Ink Compositions

The following teachings relate to various embodiments of ink compositions which, once printed and dried and/or cured, form thin polymeric layers, including, but not limited to, the local light filter layers, the global light filter layers, the light-emitting layers, the light-scattering layers, and/or the color enhancement layers described herein. Various embodiments of the ink compositions can be printed using, for example, an industrial inkjet printing system that can be housed in a gas enclosure, which gas enclosure defines an interior that has a controlled environment maintained as an inert and substantially low-particle process environment. QD-containing light-emitting layers can be inkjet printed over various previously formed device substrates, such as a light polarizer or a local light filter layer of the type disclosed herein, and then cured using, for example, a thermal or UV cure. By way of non-limiting example, a light source, such as a solid-state LED, emitting at a nominal wavelength in the range from 350 nm to 395 nm at a radiant energy density of up to 2.0 $J/cm^2$ could be used to cure a curable ink composition.

The compositions described herein are referred to as "ink compositions" because various embodiments of the compositions can be applied using techniques, including printing techniques, by which conventional inks have been applied to substrates. Such printing techniques include, for example, inkjet printing, screen printing, thermal transfer printing, flexographic printing, and/or offset printing. However, various embodiments of the ink compositions can also be applied using other coating techniques, such as, for example, spray coating, spin coating, and the like. Moreover, the ink compositions need not contain colorants, such as dyes and pigments, which are present in some conventional ink compositions.

It is contemplated that a wide variety of ink compositions can be printed. By way of illustration, during the manufacture of an LCD device, an LCD sub-pixel can be formed to include the various device layers described herein. Various ink compositions for a sub-pixel can be inkjet printed using ink compositions tailored for the formation of an absorbing dye-containing layer, a QD-containing layer for a red sub-pixel, a green sub-pixel, or a blue sub-pixel, a scattering nanoparticle-containing layer, or a QD-free polymer matrix layer for a blue sub-pixel, as well as a polymeric planarization layer.

The curable ink compositions include one or more polymer binder precursors, such as monomers and oligomers, that are polymerizable and form a polymer upon curing. As such, ink compositions that include the polymer binder precursors are polymer-forming ink compositions.

Various embodiments of the ink compositions include: one or more mono(meth)acrylate monomers, one or more di(meth)acrylate monomers, or a combination of one or more mono(meth)acrylate monomers with one or more di(meth)acrylate monomers; one or more multifunctional crosslinking agents; optionally, one or more polymerizable diluents; and quantum dots that are surface-functionalized with organic ligands. As used herein, the phrase "(meth) acrylate monomer" indicates that the recited monomer may be an acrylate or a methacrylate.

Various embodiments of the ink compositions have a (meth)acrylate monomer content in the range from about 30 wt. % to about 96 wt. %. This includes embodiments of the ink compositions having a (meth)acrylate monomer content in the range from about 50 wt. % to 95 wt. %, further includes embodiments of the ink compositions having a (meth)acrylate monomer content in the range from about 70 wt. % to 90 wt. %, still further includes embodiments of the ink compositions having a (meth)acrylate monomer content in the range from 65 wt. % to 75 wt. %, and still further includes embodiments of the ink compositions having a (meth)acrylate monomer content in the range from 65 wt. % to 70 wt. %. Some embodiments of the ink composition include only a single (meth)acrylate monomer, while others include a mixture of two or more (meth)acrylates. For example, various embodiments of the ink compositions include two mono(meth)acrylate monomers, two di(meth) acrylate monomers, or a mono(meth)acrylate monomer in combination with a di(meth)acrylate monomer. Some embodiments of the ink compositions are free of di(meth) acrylates and some embodiments of the ink composition are free of (mono)methacrylates. The weight ratios of the two (meth)acrylate monomers can vary significantly in order to tailor the viscosity, surface tension, and film-forming properties of the ink compositions. By way of illustration, some embodiments of the ink compositions that include two of the mono- or di(meth)acrylate monomers include a first mono (meth)acrylate or di(meth)acrylate monomer and a second mono(meth)acrylate or di(meth)acrylate monomer in a weight ratio in the range from 95:1 to 1:2, including in a weight ratio range from 12:5 to 1:2. This includes embodiments of the ink compositions in which the weight ratio of the first mono(meth)acrylate or di(meth)acrylate monomer to the second mono(meth)acrylate or di(meth)acrylate monomer is in the range from 12:5 to 4:5; further includes embodiments of the ink compositions in which the weight ratio of the first mono(meth)acrylate or di(meth)acrylate monomer to the second mono(meth)acrylate or di(meth) acrylate monomer is in the range from 5:4 to 1:2; and still further includes embodiments of the ink compositions in which the weight ratio of the first mono(meth)acrylate or di(meth)acrylate monomer to the second mono(meth)acrylate or di(meth)acrylate monomer is in the range from 5:1 to 5:4.

Some embodiments of the ink compositions have an organic ligand-capped QD concentration in the range from about 0.1 wt. % to about 50 wt. %, including concentrations in the range from about 1 wt. % to about 50 wt. %, in the range from about 20 wt. % to 30 wt. %, and in the range from about 5 wt. % to about 20 wt. %—although concentrations outside of these ranges can be employed.

Some embodiments of the ink compositions are free of crosslinking agents, while others include one or more crosslinking agents. In some embodiments of the ink compositions, multifunctional (meth)acrylate crosslinking agents can account for between about 3 wt. % to about 10 wt. % of the ink composition. This includes ink compositions having a multifunctional (meth)acrylate crosslinking agent content in the range from 4 wt. % to 6 wt. %.

In some embodiments of the ink compositions, photoinitiators will be included in amounts in the range from about 0.1 wt. % to about 10 wt. %, including amounts in the range from about 0.1 wt. % to about 8 wt. %. This includes embodiments in which the photoinitiators are present in amounts in the range from about 1 wt. % to about 6 wt. %, further includes embodiments in which the photoinitiators are present in amounts in the range from about 3 wt. % to about 6 wt. %, and still further includes embodiments in which the photoinitiators are present in amounts in the range from about 3.75 wt. % to about 4.25 wt. %.

The mono(meth)acrylate and di(meth)acrylate monomers are ether and/or ester compounds that have thin film-forming properties and spreading properties that render them suitable for use film-forming applications, such as in inkjet printing applications. As components of various embodiments of the ink compositions, these monomers can provide compositions that are jettable at a range of inkjet printing temperatures, including room temperature. Generally, for ink compositions useful for inkjet printing applications, the surface tension, viscosity and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 40° C.). Once formulated, various embodiments of the ink compositions can have a viscosity of, for example, between about 2 cps and about 30 cps, including, for example, between about 5 cP and 12 cP, between about 10 cps and about 27 cps, or between about 14 cps and about 25 cps, at 22° C. and a surface tension of between about 25 dynes/cm and about 45 dynes/cm, including, for example, between about 30 dynes/cm and about 42 dynes/cm, and between about 28 dynes/cm and about 38 dynes/cm at 22° C.

The suitable viscosities and surface tensions for the individual monomers used in the ink compositions will depend on the viscosities and surface tensions for the other components present in a given ink composition and on the relative amounts of each component in the ink composition. Generally, however, the mono(meth)acrylate monomers and the di(meth)acrylate monomers will have a viscosity in the range from about 1 cps to about 22 cps at 22° C., including about 4 cps to about 18 cps at 22° C., and a surface tension in the range from about 30 dynes/cm to 41 dynes/cm at 22° C., including in the range from about 32 dynes/cm to 41 dynes/cm at 22° C. Methods for measuring viscosities and surface tensions are well known and include the use of commercially available rheometers (e.g., a DV-I Prime Brookfield rheometer) and tensiometers (e.g., a SITA bubble pressure tensiometer).

The mono(meth)acrylate monomers and di(meth)acrylate monomers can be, for example, linear aliphatic mono(meth) acrylates and di(meth)acrylates, or can include cyclic and/or aromatic groups. In various embodiments of the inkjet printable ink compositions, the mono(meth)acrylate monomers and/or di(meth)acrylate monomers are polyethers. In various embodiments of the inkjet printable ink compositions, the (meth)acrylate monomers are glycol ether (meth) acrylate monomers. These include ethylene glycol phenyl (meth)acrylate (EGPE(M)A), di(ethylene glycol) methyl ether (meth)acrylate (DEGME(M)A), diethylene glycol monoethyl ether acrylate, ethylene glycol methyl ether (meth)acrylate (EGME(M)A), 1,3-butylene glycol di(meth) acrylate, and polyethylene glycol di(meth)acrylate. The polyethylene glycol di(meth)acrylate monomers, including polyethylene glycol di(meth)acrylate monomers having a number average molecular weight in the range from, for example, about 230 g/mole to about 440 g/mole. For example, the ink compositions can include polyethylene glycol 200 dimethacrylate and/or polyethylene glycol 200 diacrylate, having a number average molecular weight of about 330 g/mole.

Other suitable (meth)acrylate monomers include, but are not limited to: alkyl (meth)acrylates, such as methyl (meth) acrylate and ethyl (meth)acrylate; cyclic (meth)acrylates, such as tetrahydrofurfuryl methacrylate, alkoxylated tetrahydrofurfuryl (meth)acrylate, cyclic trimethylolpropane formal (meth)acrylate; and aromatic (meth)acrylates, such as benzyl (meth)acrylate and phenoxyalkyl (meth)acrylates, including 2-phenoxyethyl (meth)acrylate and phenoxymethyl (meth)acrylate.

The (meth)acrylate monomers can also be, for example, alkoxylated aliphatic di(meth)acrylate monomers. These include 1,6-hexanediol diacrylate and neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth) acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth) acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

Still other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

The multifunctional (meth)acrylate crosslinking agents desirably have at least three reactive (meth)acrylate groups and may have at least four reactive (meth)acrylate groups. Thus, the multifunctional (meth)acrylate crosslinking agents can be, for example, tri(meth)acrylates, tetra(meth)acrylates and/or higher functionality (meth)acrylates. Pentaerythritol tetraacrylate, pentaerythritol tetramethacrylate, di(trimethylolpropane) tetraacrylate and di(trimethylolpropane) tetramethacrylate are examples of multifunctional (meth)acrylates that can be used as a primary cross-linking agent. The term 'primary' is used here to indicate that other components of the ink compositions may also participate in crosslinking, although that is not their main functional purpose.

The polymerizable diluents are organic compounds that enhance the solubility of the organic ligand-capped QDs in the (meth)acrylate-based ink compositions. The diluents are relatively low viscosity compounds that are able to participate in free-radical polymerization processing during the curing of the ink compositions and, as such, are able to become covalently bound into the resulting polymeric film. However, the reactivity of the diluents is desirably low enough to avoid premature polymerization prior to the initiation of the cure. For this reason, in some embodiments of the ink compositions, the polymerizable diluents are not (meth)acrylates. The low viscosity compounds may have viscosities in the range of, for example, 1 cP to 5 cP. Examples of suitable polymerizable diluents include compounds having a crosslinkable maleimide group or a crosslinkable norbornene group. In addition to a polymerizable group, the diluent compounds include a chain group, such as a polyether chain. The polyether chain can include, for example, a polypropylene oxide chain, a polyethylene oxide chain, or a polyether chain that includes both polypropylene oxide groups and polyethylene oxide groups along its backbone. Maleimide compounds having hydrophilic polyether groups can be synthesized from a primary polyether amine and exo-3,6-epoxy-1,2,3,6-tetrahydrophthalic anhydride, as illustrated in Example 5. Polyether amines are sold commercially by Huntsman under the tradename Jeffamine®. Some embodiments of these polyether amines have the general structure:

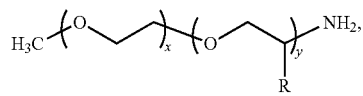

where R=H for ethylene oxides, R=CH$_3$ for propylene oxides, and x and y represent the number of repeat units along the backbone chain. In some embodiments of the values of x and y are in the range from 1 to 12, including in the range from 1 to 10. By way of illustration, Jeffamine® M-600 comprises polyether amines having the general structure:

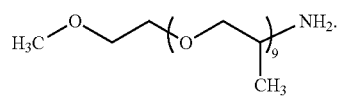

In some embodiments, mixtures of two or more different polyether amines, including two or more of the Jeffamine® amines shown above, can be used. Norbornyl compounds having polyether groups can be synthesized through the reaction of any acrylate or methacrylate with cyclopentadiene. The polyether groups of the diluents can be, but need not be, the same group as the spacer chains of the hydrophilic ligands capping the QDs, which are described in greater detail below. Embodiments of the ink compositions containing diluents may have a diluents content of, for example, about 1 wt. % to about 10 wt. %—although diluents contents outside of this range can be used.

Photoinitiators can also, optionally, be included in the ink compositions for photoinitiating the polymerization process. The specific photoinitiators used for a given ink composition are desirably selected such that they are activated at wavelengths that are not damaging to materials used in the fabrication of the device, such as materials used in the fabrication of LCD display devices. The photoinitiators can be selected such that initial polymerization is induced at wavelengths in the UV region of the electromagnetic spectrum, the blue region of the visible spectrum, or both. An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include Irgacure® TPO (also previously available under the tradename Lucirin® TPO) initiators for UV curing sold under the tradenames Irgacure® TPO, a type I hemolytic initiator which; with absorption @ 380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm$^2$ could be used to cure an ink composition comprising a TPO photoinitiator. Using the appropriate energy sources, high levels of curing can be achieved. For example, some embodiments of the cured films have a degree of curing of 90% or greater, as measured by Fourier Transform Infrared (FTIR) spectroscopy.

The QDs chosen for a given ink composition will depend on the desired light-converting properties of the films made from the ink compositions. By way of illustration only, QDs that can be included in the ink compositions include InP QDs, ZnS QDs, ZnSe QDs, and cadmium-containing QDs.

The QDs in the ink compositions include a surface film of organic ligands. These organic ligands, which help to solubilize the QDs and stabilize them against agglomeration in the (meth)acrylate monomer-based ink compositions, include hydrophobic hydrocarbon ligands; or hydrophilic ligands like ester ligands, ether ligands, amine ligands, or a combination of two of more of ester ligands, ether ligands, and amine ligands. In some embodiments, the organic ligands are polyether amines and/or polyester amines. The ligands each have at least one functional group (a "head group"), which binds the ligand to the surface of a QD, a backbone chain, and at least one tail group. The backbone chain (also referred to as a spacer chain) separates the head group from the tail group and may be, for example, 16-45 (including the 16-40) atoms (for example, carbon atoms, oxygen atoms, nitrogen atoms, and/or sulfur atoms) long. However, ligands having shorter or longer backbone chains can also be used. The organic ligands bond to the QDs, typically via electrostatic interactions between the head group and the QD surface and, in some embodiments, also covalently crosslink to the monomer components in the ink composition as it cures via their tail groups.

The organic ligands include monodentate ligands having a single head group that binds to the surface of a QD and polydentate ligands having two or more head groups that bind to the surface of a QD. The polydentate ligands can be, for example, bidentate, tridentate, tetradentate, or higher dentate ligands. Suitable head groups include carboxylic acids, which bind to the surface of a QD via a carboxylic acidic or a carboxylate group, as well as thiols and/or amines. For example, ligands containing carboxyl (—COOH), amine (—NR$_2$, where R is an H atom or an alkyl group), and thiol (—SH) groups have strong binding affinities for QDs surfaces composed of Group II-VI elements.

By way of illustration, in some embodiments of the ink compositions, the organic ligands have the following structure:

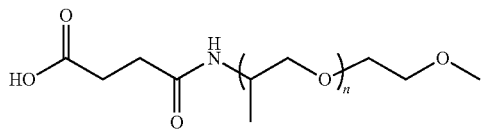

where n represents the number of repeat units in the chain. In some embodiments, n has a value between 4 and 12.

The crosslinkable ligands are characterized in that they have a functional tail group with polymerizable bond, such as a double bond, and at least one functional head group which undergoes binding with the surface of a QD in the ink composition. Such bi-functionality of the crosslinkable ligands keeps the QDs dispersed in the curable ink compositions, and prevents their re-aggregation during the curing process. In some embodiments, the ligand has a tail group that is able to crosslink with the (meth)acrylate monomers, the (meth)acrylate crosslinking agents, and/or other ligands in the ink composition to provide a cured film in which the QDs are stabilized throughout a crosslinked polymer matrix. Crosslinkable tail groups include, but are not limited to, acrylate groups, methacrylate groups, maleimide groups, norbornenyl groups, allyl groups, and alkylbenzyl groups, such as styrene groups.

In some embodiments of the ink compositions, the QDs are functionalized with ligands having tail groups that do no crosslink with other components in the cured composition. Examples of non-crosslinkable ligands include ligands having alkylene oxide tail groups, such as ethylene oxide tail groups and/or propylene oxide tail groups, and ligands having carboxylic acid tail groups. For the non-crosslinkable ligands, the tail group may be the terminal group of the spacer chain.

Some embodiments of the ligands have two or more tail groups. For example, various embodiments of the ligands have two maleimide tail groups or two (meth)acrylate tail groups.

The spacer chain that connects the head group (or head groups) of a ligand to its tail group (or tail groups) can be comprised of, for example, unsaturated or saturated hydrocarbon chain (hydrophobic fragments), or hydrophilic fragments such as a short, oligo- and polymeric chain of ether, -ester, amine, amide (e.g., a polyamide) chemical nature, or a combination of two or more of these types of chains. For example, the spacers can include one or more of the following structures along their chain:

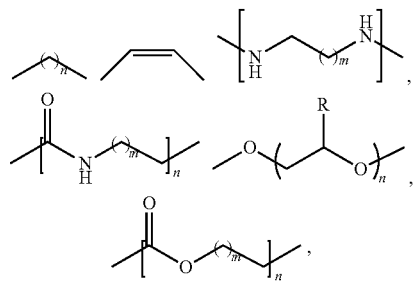

Where R=H, Me and/or Et where n represents the number of repeat units of the functional group in the chain. By way of illustration, n may be up to 10, up to 20, or higher. Thus, the number of repeat units can be 1, 2, 3, 4, 5, 6, or more. Various embodiments of these structures can include different numbers of methylene groups in their repeating functional groups. Thus, m represents the number of methylene groups in structures. By way of illustration, in various embodiments, m has a value in the range from 1 to 10. The spacer chain can be an unbranched or a branched structure. If a ligand is a multidentate ligand and/or if a ligand has two or more tail groups, the spacer chain will be branched structure.

Figure 25:
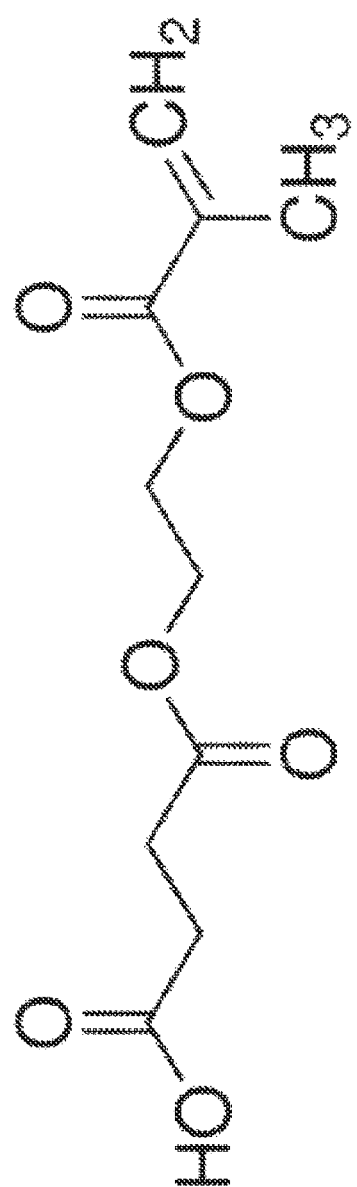
FIG. 25 shows an example of a monodentate ligand having a carboxylic acid head group and a methacrylate tail group.
Figure 26:
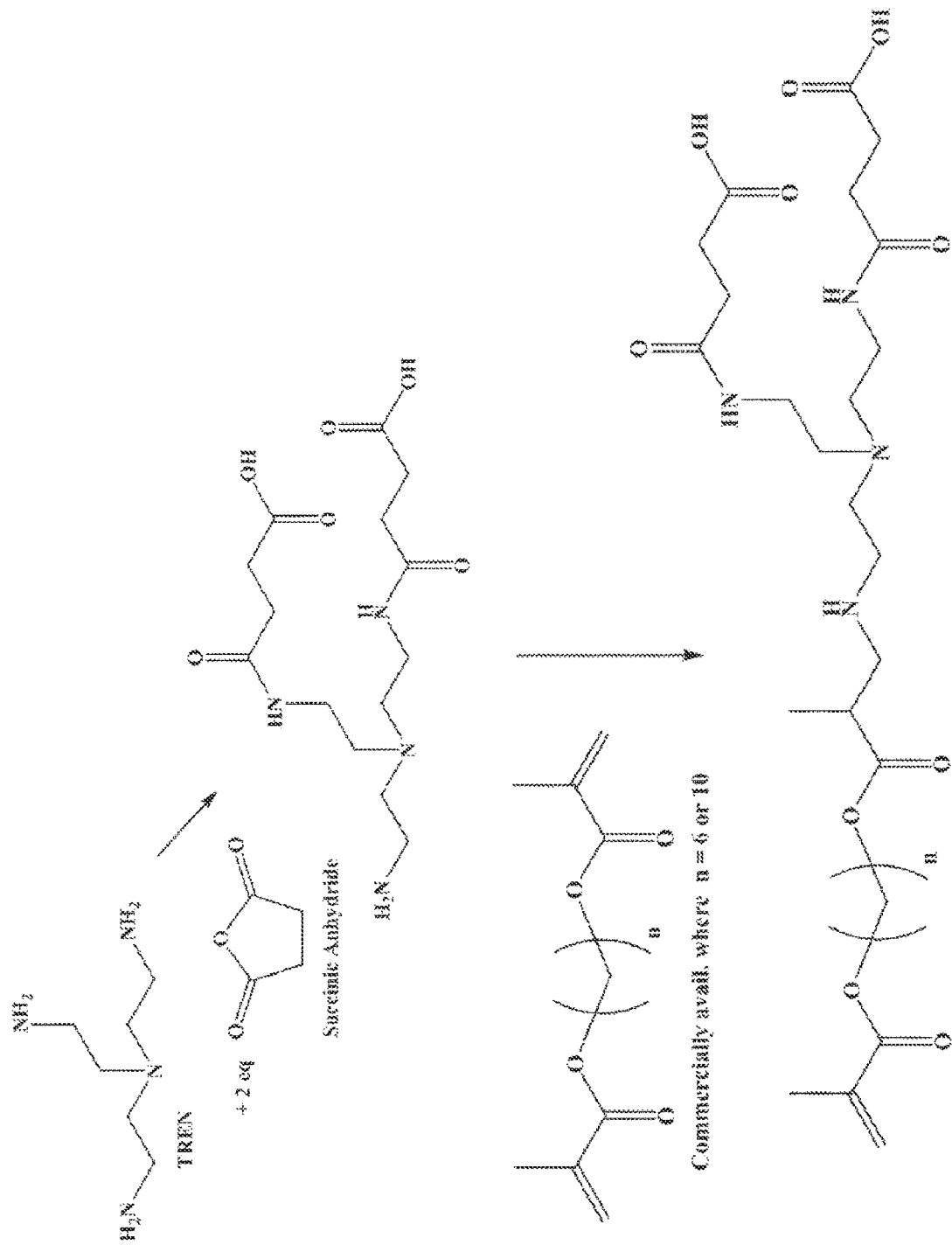
FIG. 26 shows a method of synthesizing a bidentate ligand having two carboxylic acid head groups and a methacrylate tail group.
Figure 27:
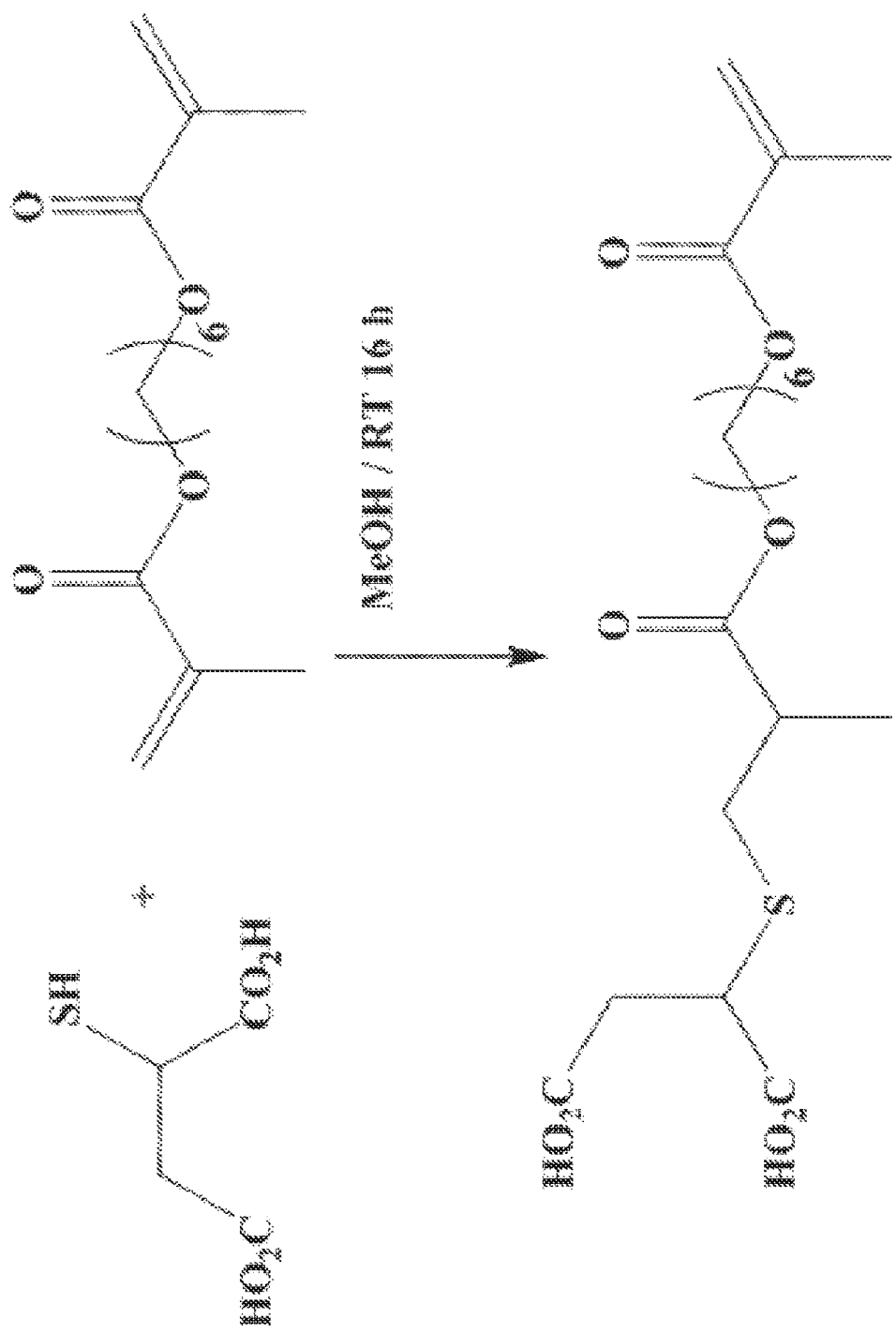
FIG. 27 shows a method of synthesizing another bidentate ligand having two carboxylic acid head groups and a methacrylate tail group.

Some illustrative examples of hydrophilic ligands are described in the Examples. One example of a monodentate carboxylic acid ligand having a methacrylate tail group and one carboxylic acid head groups is shown in FIG. 25. One example of a bidentate dicarboxylic acid ligand having a methacrylate tail group and two carboxylic acid head groups is shown in FIG. 26. In the structures, n is an integer representing the number of repeat units in the backbone chain. A synthesis scheme is also shown in the figure. FIG. 27 shows the structure of another example of a bidentate dicarboxylic acid ligand having a thioester tail group and two carboxylic acid head groups, along with its synthesis scheme.

Figure 28:
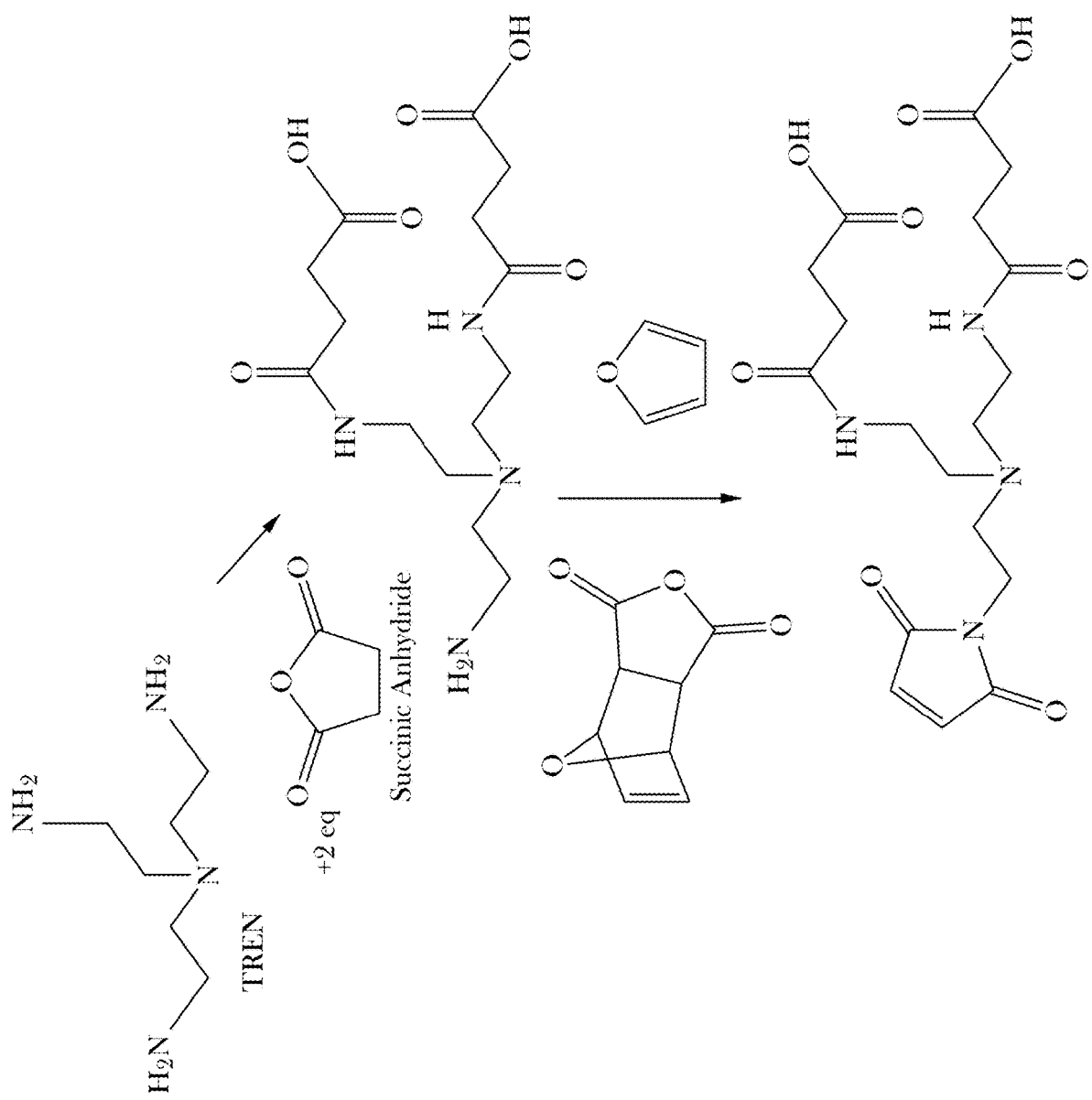
FIG. 28 shows a method of synthesizing a bidentate ligand having two carboxylic acid head groups and a maleimide tail group.
Figure 29:
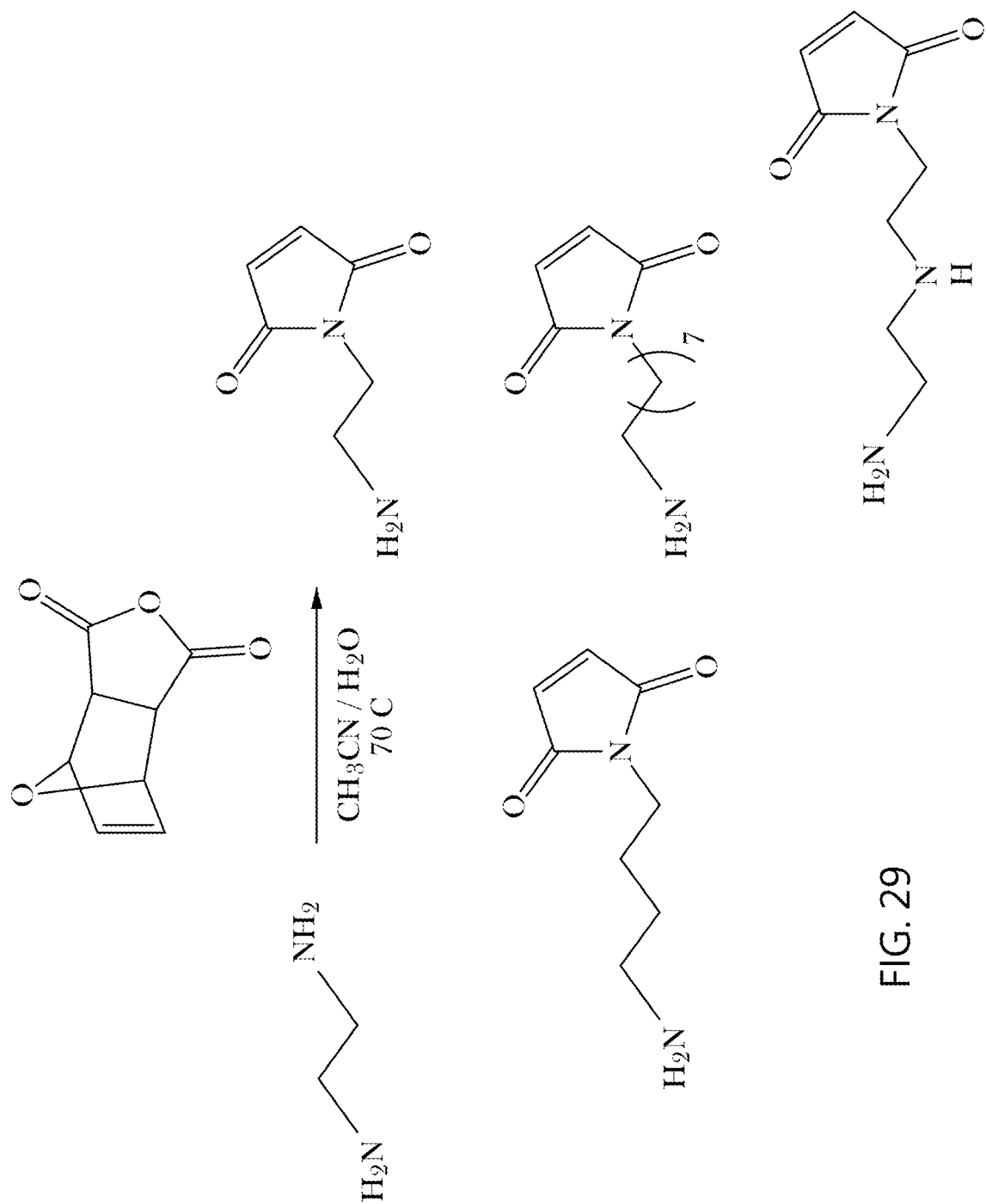
FIG. 29 shows the different maleimide amines that can be used to replace a (meth)acrylate tail group with a maleimide tail group.
Figure 30:
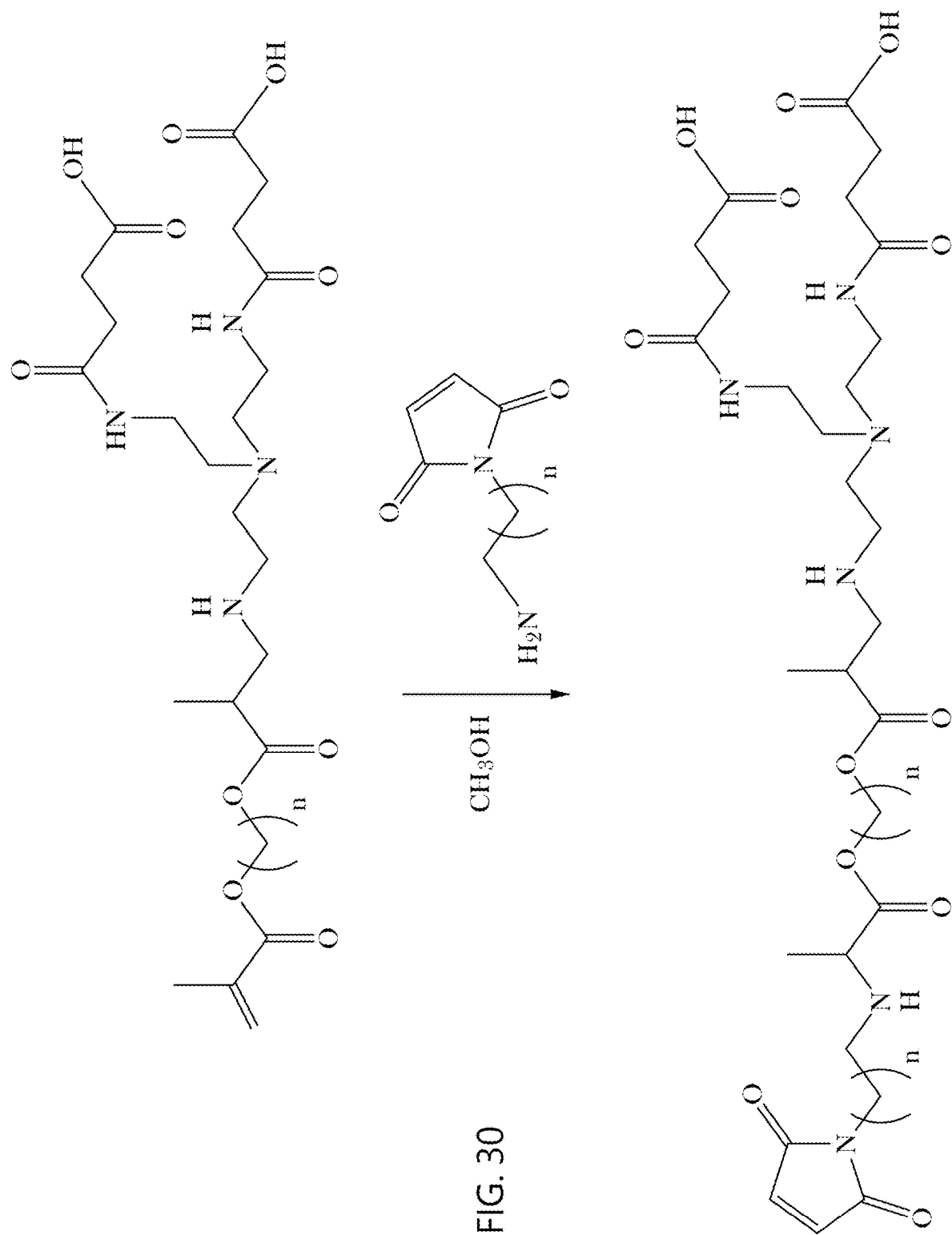
FIG. 30 shows a method of synthesizing a bidentate ligand having two carboxylic acid head groups and a maleimide tail group starting with the bidentate ligand of FIG. 26.
Figure 31:
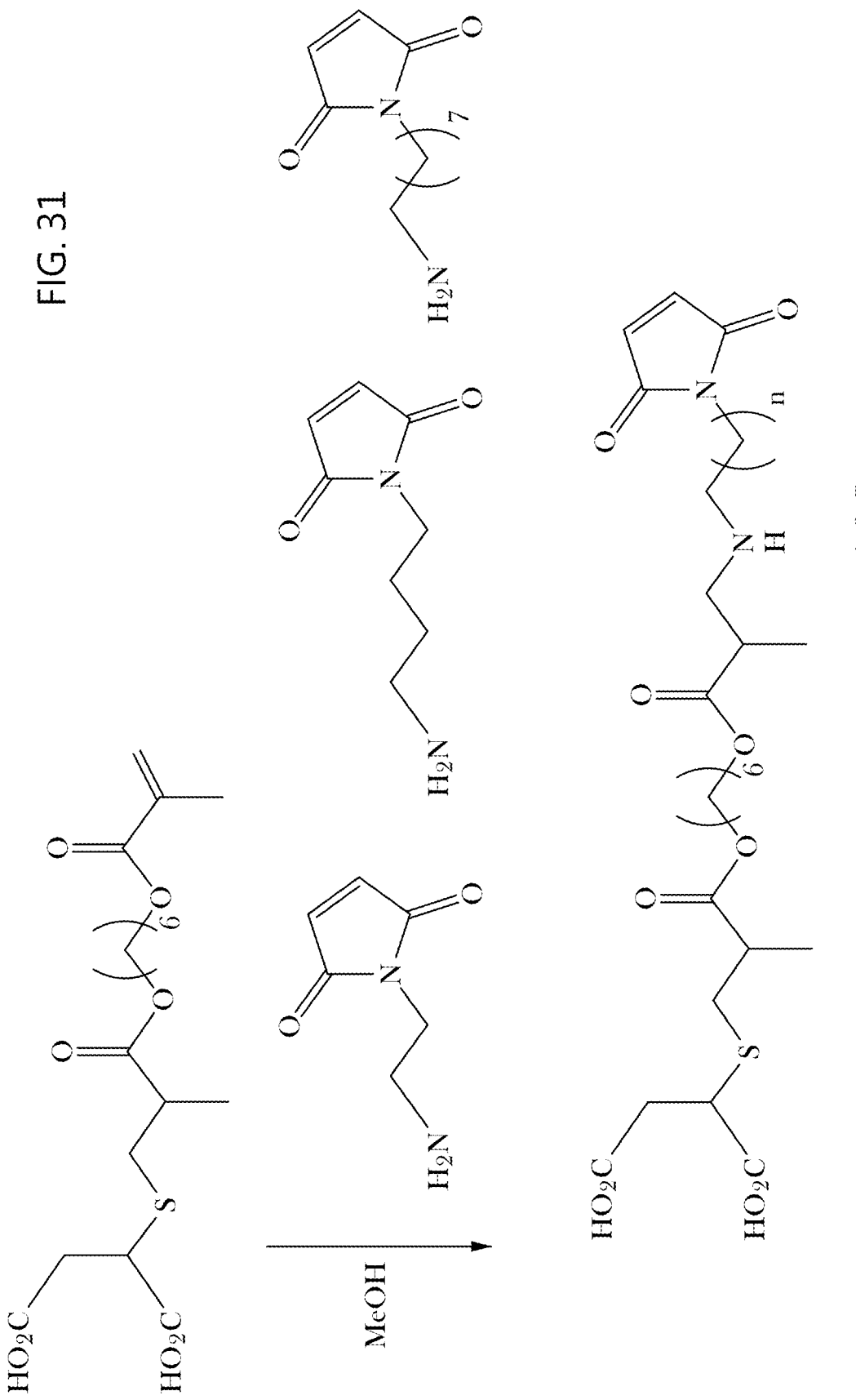
FIG. 31 shows a method of synthesizing a bidentate ligand having two carboxylic acid head groups and a maleimide tail group starting with the bidentate ligand of FIG. 27.

One example of a bidentate ligand having a maleimide tail group and two carboxylic acid head groups is shown in FIG. 28. FIG. 29 shows the structures of four maleimide amines that can be used to convert the (meth)acrylate tail group of an organic ligand into a maleimide tail group. FIG. 30 illustrates a reaction scheme that can be used to convert the (meth)acrylate tail group into a maleimide tail group using a maleimide amine of the type shown in FIG. 29, using the ligand shown in FIG. 26 as an example. The product ligand shown here has a maleimide tail group and two carboxylic acid head groups. FIG. 31 depicts a reaction scheme that can be used to convert the ligand of the type shown in FIG. 27 into a dicarboxylic ligand having a maleimide tail group. As shown in the figure n can have a value of 1, 3, or 7. However, the ligand can also have other n values. More details regarding the synthesis of the organic ligands shown in FIGS. 26-31 are provided in the Examples.

Figure 32:
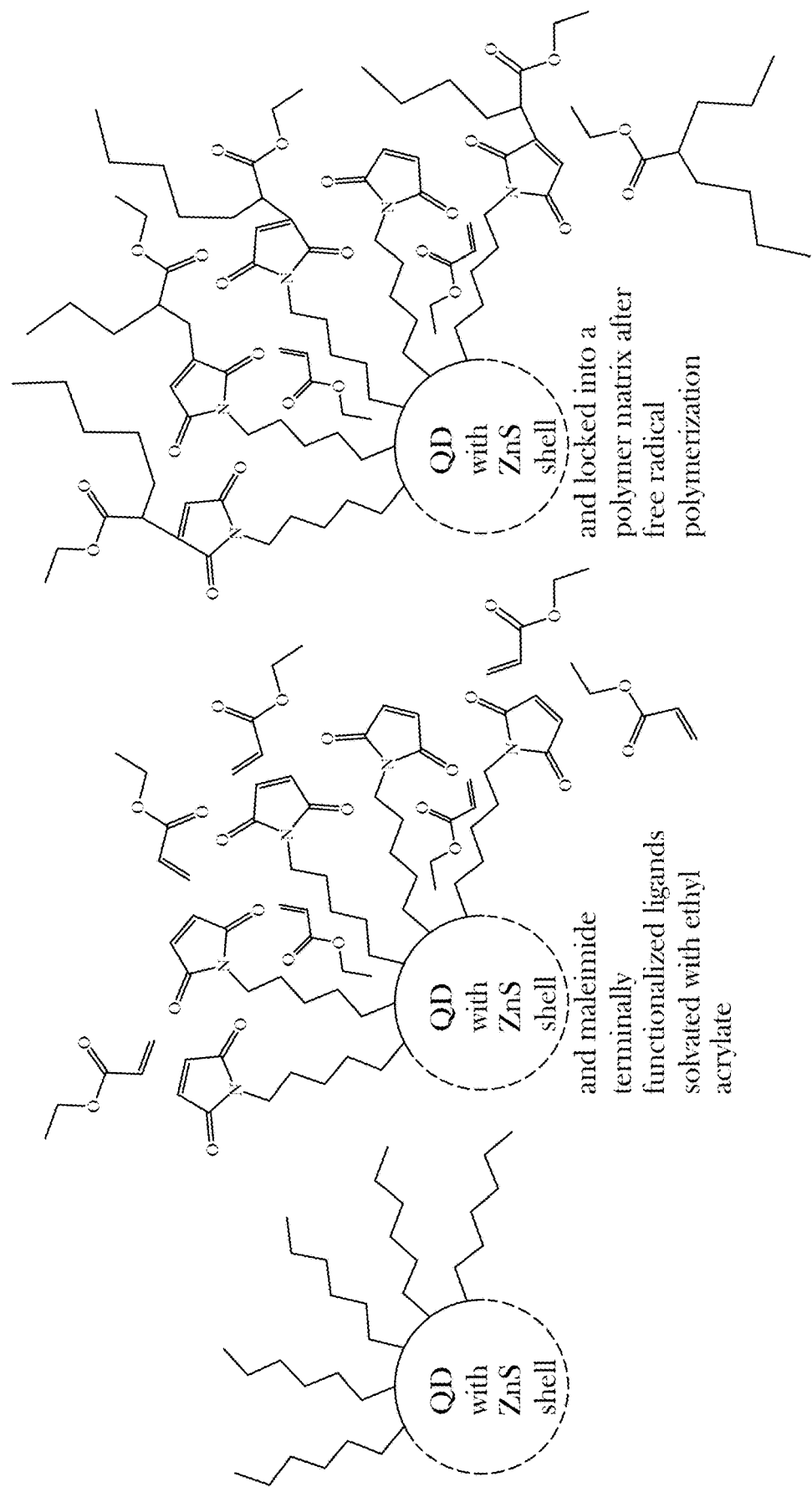
FIG. 32 is a schematic illustration of the crosslinking of a QD into a cured polymeric film.

FIG. 32 illustrates how the use of ligands having cross-linkable tail groups can stabilize QDs in a cured thin film. The left panel in the figure is a schematic illustration of a QD (represented in this embodiment as a core-shell QD with a ZnS shell) initially capped with native hydrophobic ligands. The middle panel shows the same QD, after the hydrophobic ligands have been exchanged with hydrophilic ligands having maleimide tail groups, in an ink composition that includes (meth)acrylate monomers (represented in this embodiment by ethyl acrylate monomers). The right panel is a schematic illustration of a cured film formed from the ink composition, in which the maleimide tail groups have cross-linked with the (meth)acrylate monomers to form an extended polymer matrix into which the QDs are covalently bonded and stabilized.

Figure 33:
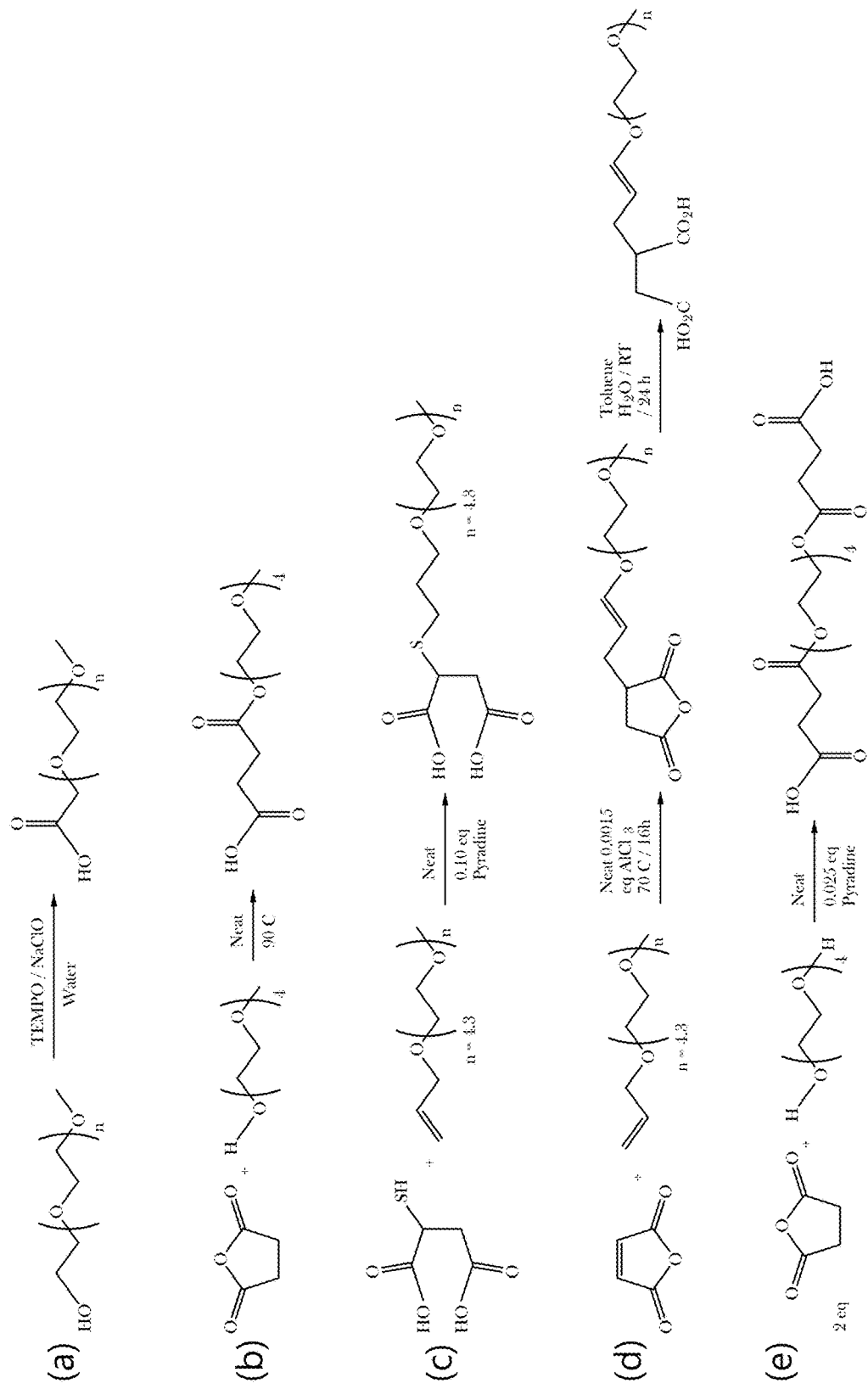
FIG. 33 shows the chemical structures of various organic ligands having non-crosslinking tail groups.

For purposes of illustration, the structures of some non-crosslinkable ligands are shown in FIG. 33. These include monodentate carboxylic acid ligands having alkyl oxide tail groups (panels (a) and (b)), bidentate carboxylic acid ligands having alkyl oxide tail groups (panels (c) and (d)), and a dicarboxylic acid ligand (panel (e)). More details regarding the synthesis of the organic ligands shown in FIG. 32 are provided in the Examples.

Figure 34:
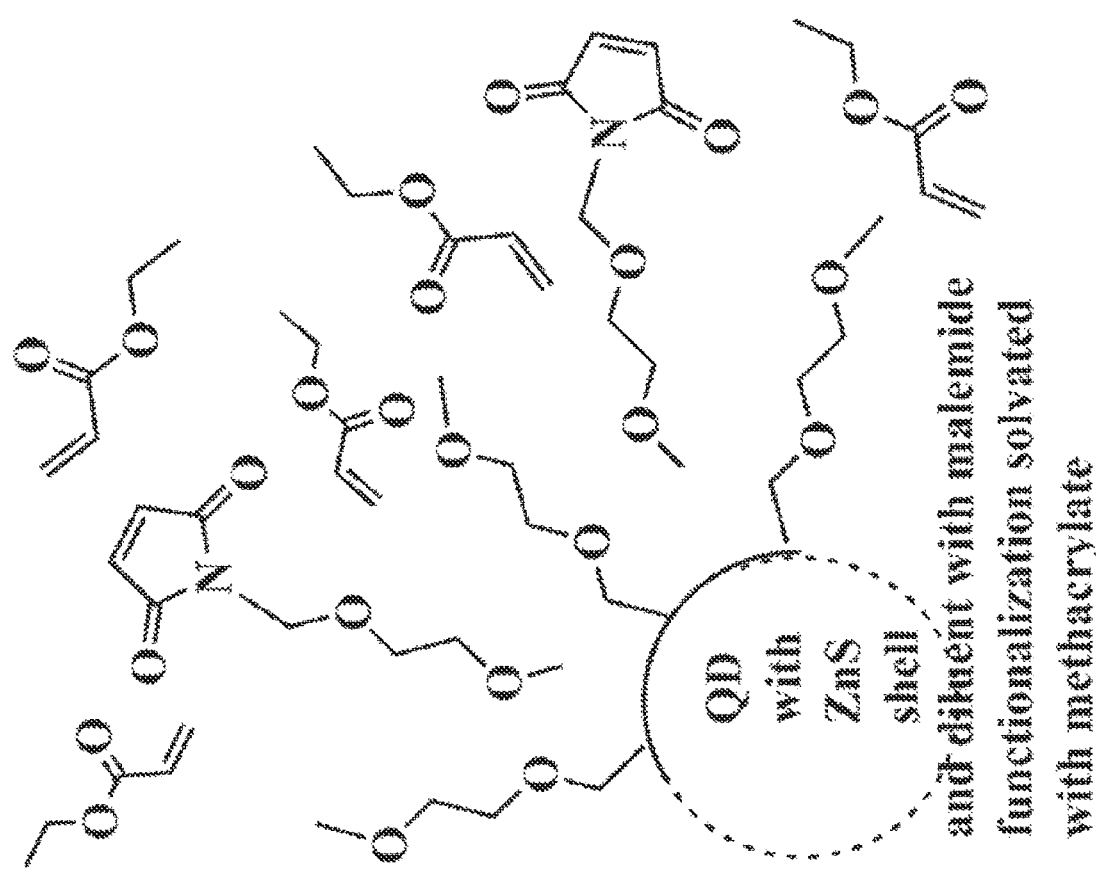
FIG. 34 is a schematic illustration of the stabilization of a QD into an ink composition through the use of a diluent.

In at least some embodiments the diluents render the hydrophilic ligand-capped QDs soluble in (meth)acrylate-based ink compositions in which they would otherwise be less soluble, or only poorly soluble. As a result, the diluents enable the formulation of ink compositions having higher QD concentrations that would be possible in the absence of the diluents. By way of illustration, various embodiments of the ink compositions have a QD concentration of at least 5 wt. %, at least 10 wt. %, at least 15 wt. %, at least 20 wt. %, at least 25 wt. %, or at least 25 wt. %. For example, the ink compositions can have a QD concentration in the ranges from about 5 wt. % to about 80 wt. %. Without intending to be bound to any one theory of the invention, the effect of the diluents may be explained by a QD stabilizing effect brought on by the interaction of the hydrophilic groups of the diluents with the hydrophilic spacer chains of the ligands capping the QDs compounds and the interaction of the polymerizable groups of the diluents with the surrounding (meth)acrylate monomers. This is illustrated schematically in FIG. 34.

A general description of embodiments of methods that can be used to carry out ligand syntheses, ligand exchanges, and ink formulation is provided below. The Examples that follow provide more detailed guidance.

The QDs may initially include a surface film of capping ligands. These capping ligands, which help to passivate the QDs and stabilize them against agglomeration in solution, are frequently present as a result of the solution phase growth of the QDs. The capping ligands are typically hydrophobic organic ligands, such as oleic acid, oleyl amine, and/or stearic acid. The capping ligands can be replaced by the hydrophilic ligands via a ligand exchange process. In such a process, the hydrophobic ligand-capped QDs are introduced into a solution containing the hydrophilic ligands under conditions (e.g., at concentrations and temperatures and for times) that facilitate the exchange of the ligands on the QDs. Suitable ligand exchange solvents include ethyl acetate, dimethoxy ethane (DME), toluene, dimethylformamide (DMF), acetonitrile, N-Methyl-2-pyrrolidone (NMP), and the like. The hydrophilic ligand-capped QDs then can be washed and concentrated by dissolving them in a wash solution. The washing and concentration steps can be carried out multiple times. The dissolved hydrophilic ligand-capped QD solution may then be mixed with a non-polar organic solvent, such as toluene or hexane, whereby the hydrophilic ligand-capped QDs precipitate out of solution. The precipitated QDs are then separated from the solution using, for example, centrifugation and/or filtration followed by drying under vacuum. The separated hydrophilic ligand-capped QDs can then be redissolved in a polar organic solvent and purified by, for example, a molecular weight cut off (MWCO) centrifugal filter. Alternatively, a tangential flow filtration (TFF) can be used to concentrate the hydrophilic ligand-capped QDs. Tangential flow filtration systems are available commercially from companies such as the Pall Corporation. Methods of capping QDs with hydrophilic ligands and washing and concentrating the hydrophilic ligand-capped QDs are illustrated in the Examples.

Figure 35:
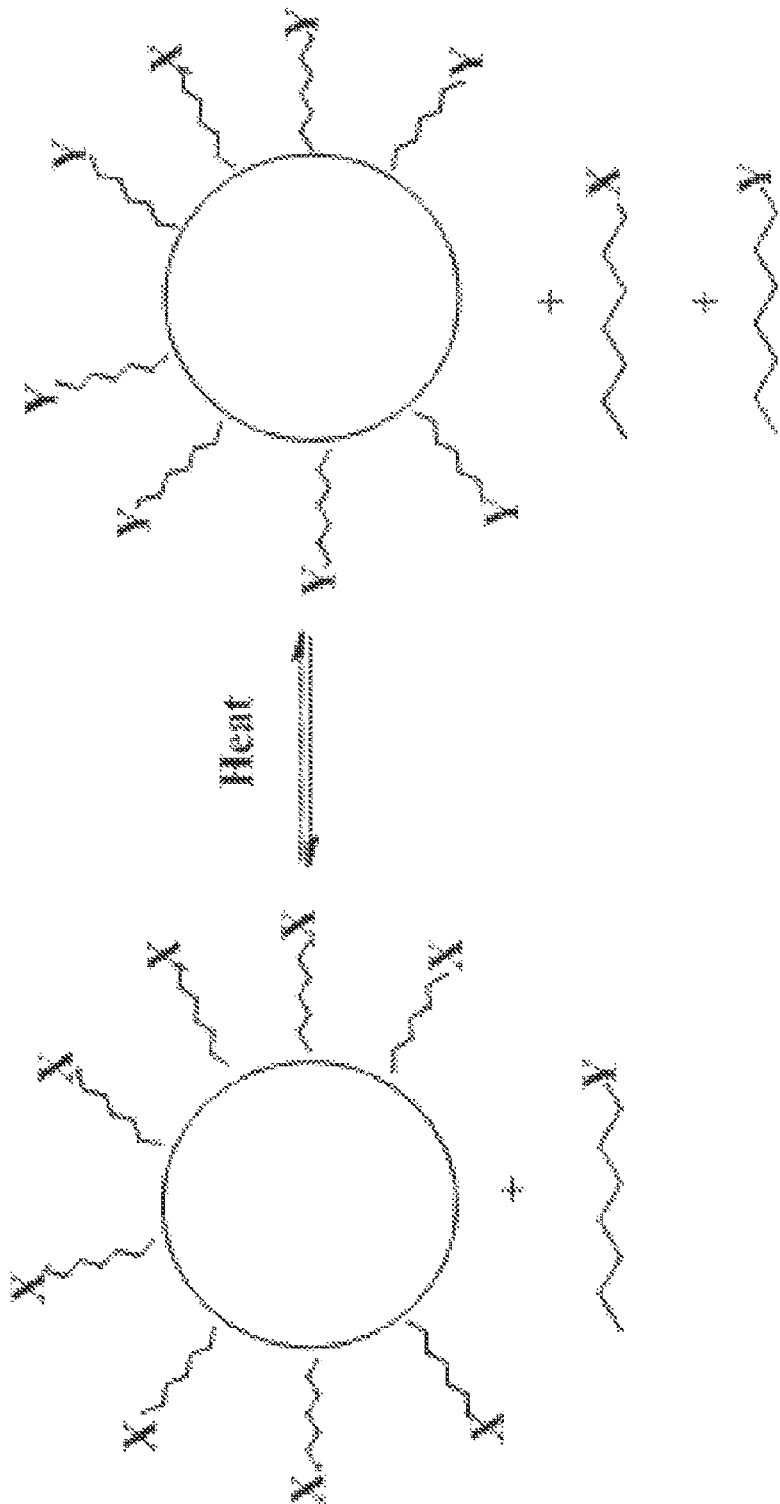
FIG. 35 is a schematic diagram of a ligand exchange mechanism.

The ligand exchange mechanism is illustrated schematically in FIG. 35, where a QD (represented by a circle) is initially capped with hydrophobic ligands (left panel). In this illustration, the hydrophobic ligands are composed of a hydrocarbon chain with an "X" group and the hydrophilic ligand are composed of a hydrocarbon chain with a "Y" group. The ligand exchange reaction is a reversible reaction that is driven by heat to equilibrium. It occurs through a dissociative mechanism, by which the hydrophobic ligand on the surface of the QD needs to open a coordination site by dissociating a ligand from the QD surface before the hydrophilic ligand is able to bind to the QD surface. In the case where both ligands have the same binding constant, this reversible reaction may be driven toward products (to the right) by adding an excess of the hydrophilic ligand to the reaction solution. Alternatively, this reversible reaction may also be driven toward products by using ligands that have a higher binding constant than the ligands on the QDs, such as when the hydrophilic ligand has a higher bonding constant than the hydrophobic ligand. Because multidentate ligands, such as bidentate ligands, bind to the surface more effectively than monodentate ligands, they can assist with pushing the equilibrium of the mechanism shown in FIG. 34 to the right. The dissociation of ligands can be promoted by heating the solution for a time sufficient for equilibrium to be achieved between the 'bound' ligands on the surface and 'free' ligands in solution.

Once the hydrophilic ligand-capped QDs have been washed, concentrated and separated, the QD concentrate can be re-dissolved in a relatively polar organic solvent, such as ethanol, and polymerizable diluent can be added to the solution. Volatile compounds can then be removed to concentrate the hydrophilic ligand-capped QDs in the diluents and this concentrate can then be mixed with the (meth)acrylate monomers, crosslinking agent, and, optionally, photoinitiator to provide an ink composition.

Given that the initiation of polymerization can be induced by light, ink compositions can be prepared under conditions preventing exposure to light. With respect to preparation of organic thin layer ink compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm.

The ink compositions can be inkjet printed using a printing system, such as that described in U.S. Pat. No. 8,714,719, which is incorporated herein in its entirety. The films can be cured in an inert nitrogen environment using UV radiation. The ink compositions can be designed to be applied by inkjet printing. Such ink compositions are, therefore, characterized by jettability, wherein a jettable ink composition displays constant, or substantially constant, drop velocities, drop volumes and drop trajectories over time when jetted continuously through the nozzle of a printhead. In addition, such ink compositions are desirably characterized by good latency properties, where latency refers to the time that nozzles can be left uncovered and idle before there is a significant reduction in performance, such as a reduction in drop velocity or volume and/or a change in trajectory that will noticeably affect the image quality.

Various embodiments of ink compositions, method of inkjet printing and forming films from the ink compositions, and photonic devices incorporating the films are presented below. However, the inventions described herein are not limited to these illustrative examples.

Various embodiments of the ink compositions include: di(meth)acrylate monomers, mono(meth)acrylate monomers, or a combination of di(meth)acrylate monomers and mono(meth)acrylate monomers; optionally, a diluent comprising a polyether group and a crosslinkable group; optionally, a multifunctional (meth)acrylate crosslinking agent comprising at least three acrylate functionalities; and quantum dots with organic ligands bound to their surfaces. In some embodiments, the ink compositions include: 30 wt. % to 96 wt. % of the di(meth)acrylate monomers, the mono(meth)acrylate monomers, or the combination of di(meth)acrylate monomers and mono(meth)acrylate monomers; 1 wt. % to 10 wt. % of the diluent comprising a polyether group and a crosslinkable group; 3 wt. % to 10 wt. % of the multifunctional (meth)acrylate crosslinking agent; and 0.1 wt. % to 50 wt. % of the quantum dots with the ligands bound to their surfaces. In some embodiments, the ink compositions have a viscosity in the range from 2 cps to 30 cps and a surface tension at 22° C. in the range from 25 dyne/cm to 45 dyne/cm at a temperature in the range from 22° C. to 40° C. In some embodiments of the ink compositions, the di(meth)acrylate monomers, the mono(meth) acrylate monomers, or the combination of di(meth)acrylate monomers and mono(meth)acrylate monomers comprises a glycol ether (meth)acrylate monomer, a tetrahydrofurfuryl (meth)acrylate monomer, or a combination thereof. In some embodiment of the ink compositions, the ligands are hydrophilic ligands. In some embodiments, the hydrophilic ligands include ester ligands, ether ligands, or a combination of ester ligands and ether ligands. In some embodiments, the hydrophilic ligands comprise polydentate ligands having two or more head groups bound to the surface of a quantum dot. In some embodiments, the polydentate ligands are bidentate ligands having two head groups bound to the surface of a quantum dot. In some embodiments, the head groups include carboxylate groups. In some embodiments, the ligands include ligand backbone chains, the ligand backbone chains having from 16 to 24 carbon atoms. In some embodiments, ligands are the hydrophilic ligands that include tail groups that are crosslinkable with the di(meth) acrylate monomers, the mono(meth)acrylate monomers, or the combination of di(meth)acrylate monomers and mono (meth)acrylate monomers. In some embodiments, the tail groups include maleimide groups. In some embodiments, the tail groups include acrylate groups. In some embodiments, the tail groups include methacrylate groups. In some embodiments, the tail groups include styrene groups. In some embodiments, the ligands are hydrophilic ligands having tail groups comprising alkylene oxide groups. In some embodiments, the alkylene oxide groups include ethylene oxide groups or propylene oxide groups. In some embodiments, the crosslinkable group of the diluent includes a maleimide group, a norbornene group, or a combination thereof.

Various embodiments of the ink compositions include: 80 wt. % to 97 wt. % di(meth)acrylate monomers, mono(meth) acrylate monomers, or a combination of di(meth)acrylate monomers and mono(meth)acrylate monomers; 3 wt. % to 10 wt. % multifunctional (meth)acrylate crosslinking agent comprising at least three acrylate functionalities; and 0.1 wt. % to 10 wt. % cure initiator. In some embodiments of the ink compositions, the mono(meth)acrylate monomers or the combination of di(meth)acrylate monomers and mono (meth)acrylate monomers include benzyl methacrylate.

One embodiment of a method of forming a quantum dot-containing film on a device substrate includes the steps of: inkjet printing a layer of an embodiment of an ink composition as disclosed herein on the surface of a device substrate; and curing the curable ink composition.

Various embodiments of cured films include the polymerization product of an embodiment of an ink composition as disclosed herein.

Various embodiments of photonic devices include: a photonic device substrate; and the polymerization product of an embodiment of an ink composition as disclosed herein on the photonic device substrate. In some embodiments, the device substrate is a light guide plate and the photonic device is a liquid crystal display device. In some embodiments, the cured film is in a sub-pixel cell of a color filter and the photonic device is a liquid crystal display device.

EXAMPLES

Example 1: Ligands without Polymerizable Functional Groups

TABLE 1

Carboxylic Acid Ligand Structure Guide—Non-Polymerizable End Groups

| Denticity | Ligand Name | Ligand length, in atoms |
|---|---|---|
| Monodentate | EG4SA | 18 |
|  | EG4SA2X |  |
| Bidentate | EG4.3TSA | 20 |
|  | EG4.3OSA | 19 |

A. Synthesis of EG4SA2X, a Dicarboxylic Acid, from Tetraethylene Glycol and Succinic Anhydride 2 eq 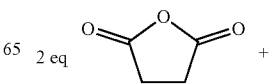 +

-continued

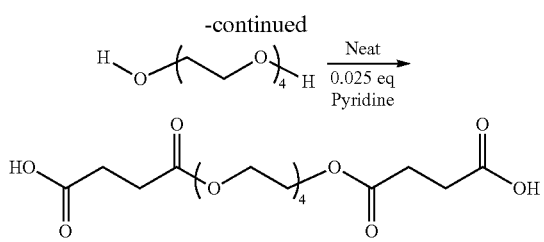

General: The reagents and solvents were purchased from Aldrich and used without further purification. The starting materials, tetraethylene glycol and succinic anhydride, were stored and transferred in air. The toluene and pyridine were stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL clear glass vial equipped with a small stir bar were added succinic anhydride (6.73 g, 67.2 mmoles) followed by tetraethylene glycol (6.47 g, 33.3 mmoles), and the vial was closed with a septum screw cap. Positive pressure of nitrogen was maintained in the vial using a needle through the septum cap. The headspace of the vial was gently purged for 15 min by piercing the septum with another needle to release the gas into the air. The vent needle was removed and pyridine (132 mg, 1.66 mmoles or 0.025 eq) was added by syringe after transfer in the glove box. Then the mixture was heated in a heat block that was thermostat controlled at 90° C., which melted the solids and produced a clear, colorless, homogenous solution. The reaction solution was heated at 90° C. for 16 h or overnight. A sample was prepared for FTIR analysis by removing the volatiles by vacuum. That analysis showed that the C=O peaks of succinic anhydride at 1859 cm$^{-1}$ and 1775 cm$^{-1}$ had been replaced by C=O peaks at 1728 cm$^{-1}$ and 1708 cm$^{-1}$. The alcohol absorbance 3500 had also been replaced by a broad absorbance between 3500 cm$^{-1}$ and 2500 cm$^{-1}$ for the carboxylic acid. Following analysis that suggested the reaction was complete, the heating block temperature was reduced to 60° C. and dry toluene (10 mL) was added to the reaction solution. The reaction mixture was dissolved in toluene and a vent needle was inserted into the septum to purge the headspace above the solution with a stream of nitrogen gas. The toluene was evaporated while the solution temperature was maintained at about 60° C. with the heat block. The toluene azeotrope purification/drying step was performed four times to produce a clear colorless product. Ultimately, the product was isolated by vacuum while being stirred in a desiccator to a pressure of less than 50 mtorr overnight. The product was a slightly viscous clear colorless oil. The hygroscopic product was stored in a glove box.

Analytical

FTIR (diamond, cm$^{-1}$): 3500-2500 (broad, carboxylic acid), 1728, 1708 (s, C=O), 1157 (s, C—O—C).

B. Synthesis of EG4SA, a Monocarboxylic Acid Ligand, via Alcohol Addition to Succinic Anhydride

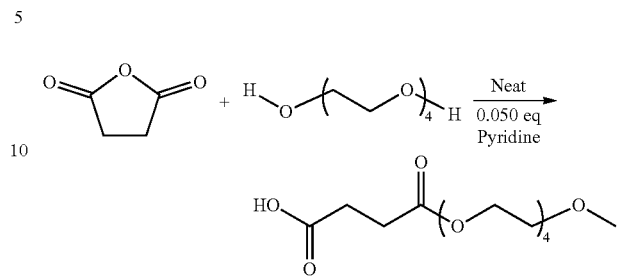

General: The reagents and solvents were purchased from Aldrich and used without further purification. The starting materials tetraethylene glycol monomethyl ether and succinic anhydride were stored and transferred in air. The toluene and pyridine were stored and handled under nitrogen gas.

Synthetic Procedure: To a 100 mL RBF equipped with a thermocouple attached to a temperature control unit and heating mantle, magnetic stirrer, stopper, and nitrogen inlet adapter were added tetraethylene glycol monomethyl ether (12.00 g, 57.6 mmoles) and succinic anhydride (5.77 g, 57.6 mmoles). The thermocouple tip was adjusted to monitor the reaction solution temperature, and the mixture was heated to 80° C., which dissolved the succinic anhydride. Then pyridine (0.228 g, 0.233 mL, 2.88 mmoles) was added by syringe and the reaction solution was maintained at 80° C. overnight. A sample was prepared for FTIR analysis by removing the volatiles by vacuum. FTIR analysis showed that the C=O peaks of succinic anhydride at 1859 cm$^{-1}$ and 1775 cm$^{-1}$ had been replaced by C=O a peak at 1730 cm$^{-1}$. The alcohol absorbance at 3500 cm$^{-1}$ for tetraethylene glycol monomethyl ether had also been replaced by a broad absorbance between 3500 cm$^{-1}$ and 2500 cm$^{-1}$ for the carboxylic acid. Due to this data, the reaction was considered complete, and the reaction flask was then modified by removal of the stopper opposite to the nitrogen inlet adapter and replaced by a short path distillation head equipped with a 100 mL receiving flask. Nitrogen gas was adjusted to pass across the surface of the solution from the nitrogen inlet adapter to the distillation head. Toluene (40 mL) was added and the solution was maintained at 80° C. to distill the toluene into the receiver. After distillation, toluene was added three more times followed by distillation to remove impurities by toluene azeotrope. The distillation head was then replaced by a stopper and the reaction solution was cooled to 40° C. while vacuum was applied to the reaction flask. The volatiles were removed by vacuum overnight while the reaction solution temperature was maintained at 40° C. The product, a clear colorless oil, was stored in the glove box.

Analytical

Product FTIR (diamond, cm$^{-1}$): 3500 to 2500 (broad, carboxylic acid), 1730 (s, C=O), 1095 (s, C—O—C).

ESI TOF MS: m/z (% relative intensity, ion): Positive 412 (50%, Tetramer+3Na+2H$_2$O), Negative 393 (100%, Tetramer+2 Na+K).

C. Synthesis of EG4.3TSA, a Bidentate Dicarboxylic Acid, from Mercaptosuccinic Acid and Allyloxy(tetraethylene oxide) Methyl Ether

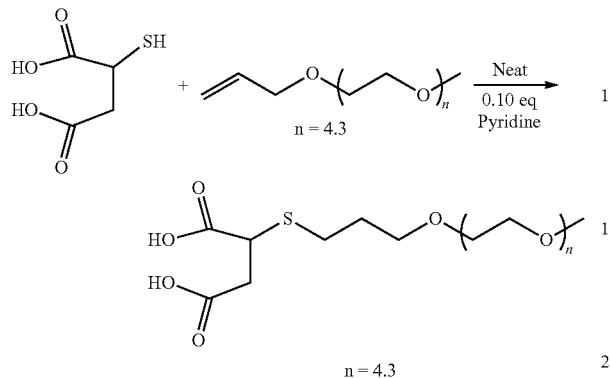

General: The reagents and solvents were purchased from Aldrich and used without further purification, with the exception of allyloxy(tetraethylene oxide) methyl ether that was purchased from Gelest. The starting materials, mercaptosuccinic acid and allyloxy(tetraethylene oxide) methyl ether, were stored and transferred in the glove box under nitrogen gas. The solvents, toluene and pyridine, were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 100 mL RBF equipped with a nitrogen inlet adapter, stir bar and stoppers was added in the glove box mercaptosuccinic acid (12.0 g, 79.9 mmoles), and the flask was then connected to the vacuum line. After attachment to the vacuum line, the middle stopper was replaced by a thermocouple and allyloxy(tetraethylene oxide) methyl ether (21.8 g, 87.9 roles) was added by syringe. Pyridine (0.632 g, 0.646 mL or 7.99 mmoles) was also added to the reaction solution by syringe. The thermocouple and heating mantle were connected to a temperature controller and the reaction solution was heated to 90° C., which dissolved the mercaptosuccinic acid and formed a clear straw yellow solution. The yellow color was imparted into the solution by the light straw yellow allyloxy(tetraethylene oxide) methyl ether. The reaction solution was heated at 90° C. overnight. Following heating for 16 h, the reaction was about the same straw yellow color as the night before. The reaction solution was sampled and the volatiles were removed from that sample to prepare them for FTIR analysis. Before volatiles removal, the sample smelled like a sulfur organic compound. The sample was vacuumed until a pressure of <100 mtorr was reached. FTIR analysis showed that the S—H peaks, from starting mercaptosuccinic acid centered at 2564 cm$^{-1}$, had almost disappeared and the (C=O peak from mercaptosuccinic acid at 1681 cm$^{-1}$ had shifted to 1729 cm$^{-1}$ suggesting the reaction had proceeded to completion. The reaction apparatus was modified by removal of the stopper followed by replacement with a short path distillation apparatus equipped with a 100 mL receiver flask. Nitrogen gas was sent through the apparatus gently from the nitrogen inlet adapter across the surface of the solution and out the short path distillation head to the air. Then toluene (40 mL) was added and the toluene was distilled slowly with the assistance of flowing nitrogen gas. Upon completion of distillation of the first aliquot of toluene, the process was repeated four more tines. Upon completion of toluene distillation/product purification, the short path distillation head was replaced by a stopper and the reaction solution was placed under vacuum while the temperature was allowed to decrease to 60° C. The product was purified by vacuum overnight as the pressure dropped to <50 mtorr. The product, a clear light yellow oil, was then transferred into the glove box and stored in a vial.

Analytical

FTIR (diamond, cm$^{-1}$): 1729 (m, C=O) and 1084 (s, C—O—C).

ESI TOF MS: m/z (% relative intensity, ion): Positive 354 (40%, M–CO$_2$H), 372 (65%, M–CO$_2$H+H$_2$O), 398 (20%, M+H for n=4), 416 (25%, M+H$_2$O) and negative 397 (15%, M–H).

D. Synthesis of EG4.3OSA, a Bidentate Dicarboxylic Acid, from Maleic Anhydride Acid and Allyloxy(Tetraethylene Oxide) Methyl Ether

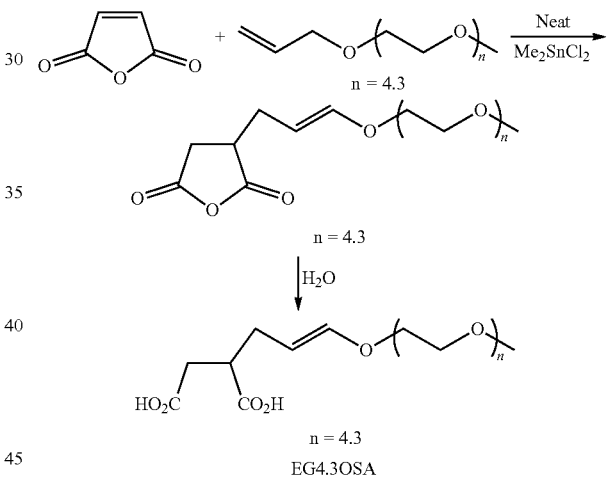

n = 4.3
EG4.3OSA

General: The reagents and solvents were purchased from Aldrich and used without further purification, with the exception of allyloxy(tetraethylene oxide) methyl ether that was purchased from Gelest. The starting materials, maleic anhydride and activated charcoal, were stored and handled in the air, while allyloxy(tetraethylene oxide) methyl ether and dimethyltin dichloride were stored and handled in the glove box under nitrogen gas. Toluene and ethyl acetate were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of the anhydride: To a 20 mL clear glass vial was added maleic anhydride (1.00 g, 10.2 mmoles) in air, and the vial then was pumped into the glove box antechamber. Once the vial was inside the glove box, allyloxy (tetraethylene oxide) methyl ether (2.53 g, 10.2 mmoles) was added. Dimethyltin dichloride (0.22 mg, 1.0 micromoles) was then added, the vial was closed, and the reaction solution was heated on a thermostat-controlled heat block at 90° C. overnight. The reaction solution was a colorless slurry upon combination, but upon reaching 90° C. the maleic anhydride dissolved and the solution became a clear, colorless oil. After being heated overnight at 90° C., the reaction solution remained a clear, colorless oil. A sample was removed and, after a brief vacuum, analyzed by FTIR. The C=O peaks of the maleic anhydride at 1800 cm$^{-1}$ and 1855 cm$^{-1}$ (symm and asymm) had been shifted to 1776 cm$^{-1}$ and 1848 cm$^{-1}$, which suggested that the reaction had gone to completion. The reaction solution was cooled to room temperature, and tin impurities were removed with activated charcoal. A sample of the anhydride (1.00 g, 2.89 mmoles) was dissolved in 1.0 mL toluene, and 100 mg of activated charcoal was added. The resulting slurry was stirred overnight and then filtered through fine glass wool, followed by a 0.45 um nylon syringe filter into a 20 mL vial. After the initial filtration, the filter apparatus was rinsed with another 3 mL of toluene, and that filtrate was combined with the product to produce a clear, colorless solution. The anhydride was hydrolyzed by the addition of water (1.30 g, 1.30 mL, 72.2 mmoles) to the same vial, and the reaction solution was heated at 90° C. for 90 min. A small 0.2 mL portion of the reaction solution was transferred to a separate vial, and the volatiles were removed with flowing nitrogen gas followed by vacuum, leaving an opaque paste. Analysis of the paste by FTIR showed one C=O peak at 1731 cm$^{-1}$ and a broad adsorption for carboxylic acid between 3500 cm$^{-1}$ and 2500 cm$^{-1}$ indicating that succinic anhydride had been hydrolyzed to succinic acid. The volatiles were removed by toluene azeotrope using flowing nitrogen, while the vial containing the reaction solution was held in a thermostat-controlled heat block at 50° C. Once the product had been reduced to a paste, ethyl acetate (10 mL) was added, and an ethyl acetate/water azeotrope was used to remove the water at 30° C. Finally, ethyl acetate (10 mL)/water azeotrope was used again to dry the product to a paste followed by subjecting the product to two days at a pressure of less than 50 mtorr. The product was an opaque, but flowing, very light yellow oil.

Anhydride Analytical Data:

FTIR (diamond, cm$^{-1}$): 3083 (w, olefin C—H), 1848 (m, C=O) and 1776 (s, C=O) anhydride symm and asymm, 1094 (s, C—O—C).

ESI TOF MS: m/z (% relative intensity, ion): Positive 249 (40%, M-CO$_2$H—CH$_2$O-2CH$_2$), 266 (85%, M-CO$_2$H—CH$_2$O—2CH$_2$+H$_2$O), 293 (40%, M-CO$_2$H-CH$_2$O+H$_2$O), 310 (100%, M-CO$_2$H—CH$_2$O-CH$_2$+Li+Na+H$_2$O), 354 (50%, M-O+Na), Negative 287 (100%, M-CO$_2$H—CH$_2$O—CH$_2$+Li+H$_2$O), 331 (90%, M-CO$_2$H—CH$_2$O—CH$_2$+Li+Na+K).

Acid Analytical Data:

FTIR (diamond, cm$^{-1}$): 3500 to 2500 (broad, carboxylic acid OH), 1731 (m, C=O) and 1084 (s, C—O—C).

ESI TOF MS: m/z (% relative intensity, ion): Positive 266 (100%, M-O(CH$_2$CH$_2$O)$_2$CH$_3$+H$_2$O+H), 266 (100%, M-CO$_2$H—O(CH$_2$)$_2$OCH$_3$+H$_2$O+H), 222 (20%, M-O(CH$_2$CH$_2$O)$_3$CH$_3$+H$_2$O+H), 222 (20%, M-CO$_2$H—O(CH$_2$CH$_2$O)$_2$CH$_3$+H$_2$O+H), 249 (20%, M-CO$_2$H—CH$_2$O(CH$_2$)$_2$OCH$_3$+H$_2$O), 271 (20%, M-O(CH$_2$CH$_2$O)$_2$CH$_3$+Na+H), 271 (20%, M-CO$_2$H—O(CH$_2$)$_2$OCH$_3$+H$_2$O+Li), 310 (20%, M-CO$_2$H—OCH$_3$+H$_2$O+H).

TABLE 2

Amine Ligand Structure Guide—Polymerizable End Groups

| Denticity | Ligand Name | Ligand length, in atoms |
|---|---|---|
| Monodentate | MADMI | 30 |
|  | A2MI | 6 |
|  | A4MI | 8 |
|  | A8MI | 10 |
|  | DA2MI | 9 |
| Bidentate | DADMI | 31 |
| Tridentate | TAMMI | 31 |

E. Synthesis of A2 MI, A4 MI and A8 MI. Amines with Maleimide from their Respective Diamine

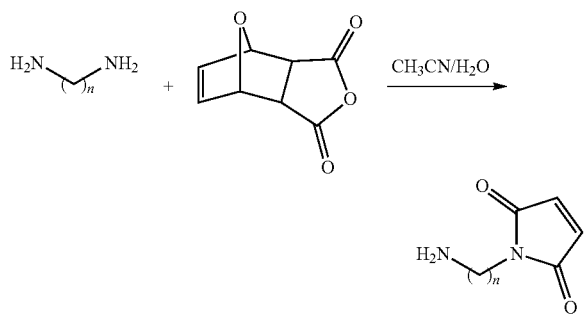

Where n = 2, 4, 8

General: The reagents and solvents were purchased from Aldrich and used without further purification. However, the amines were stored and transferred in the glove box. The reagent handling and reactions were performed under nitrogen, except where noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL amber vial was added 1,8-diaminooctane (0.868 g, 6.02 mmoles) in the glove box, and the vial was capped with a septum cap. The vial was then connected to the vacuum line through a syringe needle and de-gassed water (10 mL) was added by syringe, which dissolved the amine and produced a clear solution. Then exo-3,6-epoxy-1,2,3,6-tetrahydrophthalic anhydride (1.00 g, 6.02 mmoles) was weighed into a vial in the air. The vial was connected to the vacuum line with a needle and purged with a vent needle using nitrogen gas. Acetonitrile (8 mL) was added to the vial, and the solution was heated slightly to dissolve the anhydride and produce a clear solution before it was drawn into a syringe. The reaction solution of di-amine in water, connected to the vacuum line, then was heated in a thermostat-controlled heat block maintained at 70° C., and the anhydride was added dropwise to the center of the vortex over 5 min. The reaction solution was stirred at 70° C. overnight. The volatiles were then removed with flowing nitrogen gas while the vial was in a heat block maintained at 30° C. A small sample was placed under vacuum in a desiccator to prepare it for analysis. FTIR analysis showed the anhydride peaks at 1857 cm$^{-1}$ and 1778 cm$^{-1}$ had been replaced by maleimide C=O at peaks 1769 cm$^{-1}$ and 1693 cm$^{-1}$. The C=O peaks also appeared to be the typical maleimide peak (symm and asymm) pattern, suggesting that the reaction had gone to completion. There was also an amine peak at 3321 cm$^{-1}$, although the peak was obscured by a substantial amount of hydrogen bonded water. Dimethoxyethane (DME, 10 mL) then was added to the oily product, and after mixing the volatiles were removed with flowing nitrogen gas using a vent needle while in a heat block maintained at 30° C. DME (10 mL) was added to dry the product two more times, and the product was placed under vacuum in a desiccator and stirred overnight. The product was a white crystalline powder.

Analytical

Product FTIR (diamond, cm$^{-1}$): ~3450 and 3321 (m, secondary amine). 3069 (w, olefin C—H), 1769 (sh, C=O), 1693 (s, C=O); both are maleimide symm. and asymm.

ESI TOF MS: m/z (% relative intensity, ion): Positive 243 (50%, M+H$_2$O+H), 268 (40%, M+2Na), 293 (85%, M+3Na), 311 (100%, M+3Na+H$_2$O), negative 241 (35%, M+H$_2$O—H).

For n=2 and 4, the procedure and solvent amounts were the same.

For n=2, 1,2-diaminoethane (0.362 g, 6.02 mmoles) and exo-3,6-Epoxy-1,2,3,6-tetrahydrophthalic anhydride (1.00 g, 6.02 mmoles) were used. The product was a white crystalline powder.
Analysis:
Product FTIR (diamond, cm$^{-1}$): 3371 and 3299 (m, secondary amine), 3071 (w, olefin C—H), 1760 (w, maleimide C=O) and 1691 (s, maleimide C=O) symm and asymm.

ESI TOF MS: m/z (% relative intensity, ion): Positive 209 (50%, M+3Na), 157 (50%, M+H$_2$O—H) and negative 433 (65%, 2 M+3H$_2$O).

For n=4, 1,4-diaminobutane (0.531 g, 6.02 mmoles and exo-3,6-Epoxy-1,2,3,6-tetrahydrophthalic anhydride (1.00 g, 6.02 mmoles) was used. The product was a white crystalline powder.
Analysis:
Product FTIR (diamond, cm$^{-1}$): ~3400 and 3280 (m, secondary amine), 3073 (w, olefin C—H), 1769 (w, maleimide C=O) and 1692 (s, maleimide C=O) symm and asymm.

ESI TOF MS: m/z (% relative intensity, ion): Positive 237 (100%, M+3 Na) and negative 421 (35%, 2 M+3 Na—H$_2$O).

F. Synthesis of DA2 MI. Amines with Maleimide from their Respective Triamine

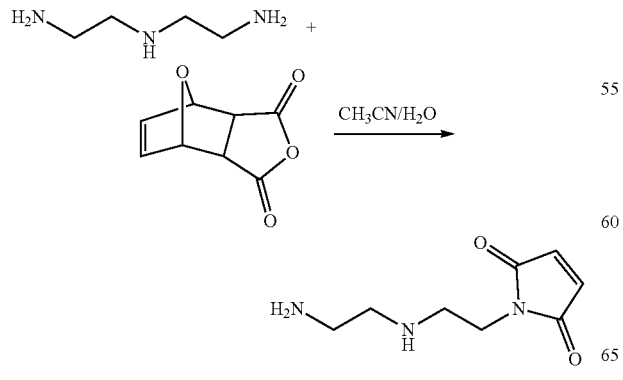

General: The reagents and solvents were purchased from Aldrich and used without further purification. However, the amines were stored and handled in the glove box. The reagent handling and reaction were performed under nitrogen, except where noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL amber vial was added diethylenetriamine (0.621 g, 6.02 mmoles) in the glove box, and then the vial was capped with a septum cap. The vial was then connected to the vacuum line through a syringe needle, and de-gassed water (10 mL) was added by syringe, which dissolved the amine and produced a clear solution. Then exo-3,6-epoxy-1,2,3,6-tetrahydrophthalic anhydride (1.00 g, 6.02 mmoles) was weighed into a vial in the air. The vial was connected to the vacuum line with a needle and purged with a vent needle using nitrogen gas. Acetonitrile (8 mL) was added to the vial, and the solution was heated slightly to dissolve the anhydride before the clear solution was drawn into a syringe. The reaction solution of di-amine in water, connected to the vacuum line, was then heated in a thermostat-controlled heat block maintained at 70° C., and the anhydride was added dropwise to the center of the vortex over 5 min. The reaction solution was stirred at 70° C. overnight. The volatiles were then removed with flowing nitrogen gas while the vial was in a thermostat-controlled heat block maintained at 30° C. A small sample was placed under vacuum in a desiccator to prepare it for analysis. FTIR analysis showed the anhydride peaks at 1857 cm$^{-1}$ and 1778 cm$^{-1}$ had been replaced by maleimide C=O at peaks 1769 cm$^{-1}$ and 1692 cm$^{-1}$. Also, the C=O peaks appeared as the typical maleimide peak pattern (symm and asymm), suggesting that the reaction had gone to completion. There was also an amine peak at 3321 cm-1, although the peak was obscured by a substantial amount of hydrogen bonded water. Dimethoxyethane (DME, 10 mL) was then added to the oily product and, after mixing, the volatiles were removed with flowing nitrogen gas using a vent needle while in a heat block maintained at 30° C. DME (10 mL) was added two more times to dry the product, and the product was placed under vacuum in a desiccator and stirred overnight. The product was a clear oil.

Analytical

Product FTIR (diamond, cm$^{-1}$): 3283 (w, amine), 3076 (w, olefin C—H), 1769 (sh, maleimide C=O) and 1692 (s, maleimide C=O) symm and asymm.

ESI TOF MS: m/z (% relative intensity, ion): Positive 184 (30%, M+H), 252 (100%, M+3Na) and negative 547 (100%, 3 M–H).

G. Synthesis of DCA10A, a Dicarboxylic Acid Monoamine from the Reaction of Tris(2-Aminoethyl)Amine and Succinic Anhydride

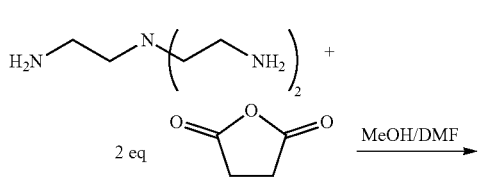

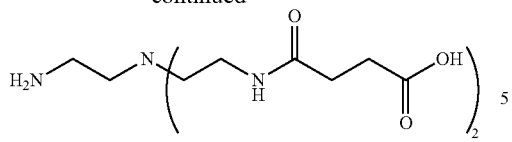

General: The reagents and solvents were purchased from Aldrich and used without further purification. However, the amine was stored and transferred in the glove box. The reagent handling and reaction were performed under nitrogen. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL clear glass vial in the glove box tris(2-aminoethyl)amine (1.00 g, 6.84 mmoles) was dissolved in methanol (5.0 mL) to form a clear solution. The vial was closed with a septum cap. In a separate vial, succinic anhydride (1.37 g, 13.7 mmoles) was dissolved in methanol (5.0 mL) and dimethylformamide (DMF, 5.0 mL). The succinic anhydride solution was pulled into a syringe. The tris(2-aminoethyl)amine solution in the vial was then stirred at 30° C. in a thermostat-controlled heat block while the succinic anhydride solution was added dropwise into the vortex over 5 min. The resulting clear, colorless reaction solution was then stirred overnight. A reaction sample was subjected to vacuum to prepare it for analysis. FTIR analysis showed loss of the starting succinic anhydride C=O peaks at 1857 $cm^{-1}$ and 1778 $cm^{-1}$ (symm and asymm), and the appearance of peaks at 1725 $cm^{-1}$ for carboxylic acid C=O and 1648 $cm^{-1}$ for amide C=O. In addition, there was a broad absorbance between 3500 $cm^{-1}$ and 2500 $cm^{-1}$ for the hydrogen bonded carboxylic acid. The FTIR data suggested that the reaction was complete. The reaction volume was about 15 mL when the volatiles were removed with flowing nitrogen gas, and when the volume reached about 10 mL the solution transformed into opaque white. When the reaction solution had been reduced to a paste, ethyl acetate (5.0 mL) was added and the reaction solution temperature was maintained at about 30° C. in the thermostat-controlled heating block, while the volatiles were removed with flowing nitrogen gas. Toluene (5.0 mL) was added six times, and the volatiles were removed with flowing nitrogen gas while in the heat block. The vial then was placed into the desiccator to remove the last of the volatiles overnight. Finally, the product was dissolved in methanol (5.0 mL), and toluene (about 4 to 8 mL) was added to precipitate the product. After removal of the supernatant, the precipitate was dried by vacuum overnight. The product was a thick, straw yellow oil.

Analytical

Product FTIR (diamond, $cm^{-1}$): 3266 cm–1 (m, amine), 3500 to 2500 (broad, carboxylic acid), 1709 (sh, carboxylic acid), 1634 (m, amide C=O), 1535 (s, amide N—H).

ESI TOF MS: m/z (% relative intensity, ion): Positive 347 (90%, M+H), 693 (20%, 2 M+H), Negative 345 (20%, M–H).

H. Synthesis of DCAMI, a Dicarboxylic Acid Ligand, with Maleimide

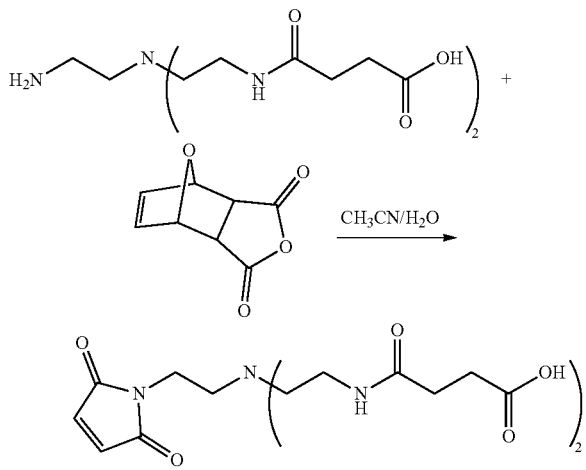

General: The reagents and solvents were purchased from Aldrich and used without further purification. However, the amine/carboxylic acid was stored and transferred in the glove box. The reagent handling and reaction were performed under nitrogen, except where noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL amber vial the amine/carboxylic acid (2.08 g, 6.02 mmoles) was transferred in the glove box, and the vial was closed with a septum cap. The vial was attached to the vacuum line by a syringe needle and dissolved in degassed water (10 mL) to form a clear solution. The exo-3,6-epoxy-1,2,3,6-tetrahydrophthalic anhydride (1.00 g, 6.02 mmoles) was transferred to a vial and dissolved in acetonitrile (5.0 mL) before being drawn into a syringe. The solution of amine in the vial then was stirred in a 30° C. thermostat-controlled heat block while the solution of anhydride was added by syringe into the reaction solution vortex dropwise over 5 min. The reaction solution was then stirred under nitrogen gas atmosphere at 30° C. in a thermostat-controlled heat block overnight. A small sample was prepared for analysis by removal of volatiles by vacuum. FTIR analysis showed loss of the anhydride C=O peaks at 1857 $cm^{-1}$ and 1778 $cm^{-1}$, along with the appearance of product peaks at 1769 $cm^{-1}$ and 1687 $cm^{-1}$ in the characteristic pattern for a cyclic maleimide ring system (symm and asymm), suggesting that the reaction was complete. The volatiles were removed using nitrogen gas and a vent needle on the vacuum line. Once the volume had been substantially reduced, ethyl acetate (10 mL) was added, followed by removal of volatiles with flowing nitrogen gas while the vial was being heated in the heat block at 30° C. This ethyl acetate (10 mL) addition followed by flowing nitrogen etc. then was performed once again, and the product was isolated by vacuum to yield a white semi-crystalline solid. The product was stored in the glove box.

Analytical

Product FTIR (diamond, $cm^{-1}$): 3500 to 2500 (broad, carboxylic acid), 1769 (sh, maleimide), 1688 (s, maleimide and carboxylic acid), ~1680 (sh, carboxylic acid).

ESI TOF MS: m/z (% relative intensity, ion): Positive 443 (25%, M+H$_2$O—H), 429 (35%, M-CO$_2$H+2Na+H), Positive 477 (55%, M-CO$_2$H+2K+H$_2$O), Positive 411 (100%, M-CO$_2$H+Na+Li), Negative 427 (15%, M+H).

I. Synthesis of TR14A, a Nanocrystal Intermediate Intended to Produce a Nanocrystal Ligand to Covalently Bond the Nanocrystals into an Acrylate Cure Matrix

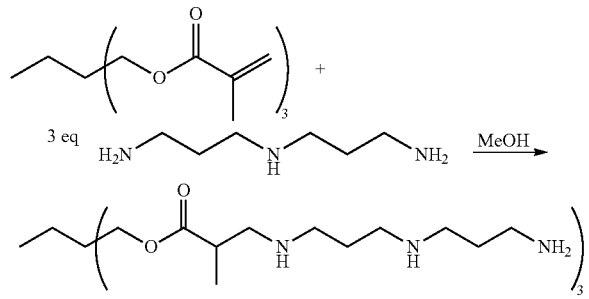

General: The reagents and solvents were purchased from Aldrich and used without further purification. However, the amine was stored and transferred in the glove box. The reaction was performed under clean dry air (CDA). FTIR analysis was performed on a Nicolet 6700 spectrometer equipped with a Smart iTR Attenuated Total Reflectance (ATR) Sampling Accessory. Mass spectroscopy analysis was performed at Scripps MS Center for Metabolomics and Mass Spectrometry.

Synthetic Procedure: To a 20 mL amber glass vial in the glove box was added bis(3-aminopropyl)amine (1.16 g, 8.86 mmoles), which was then dissolved in methanol (10 mL). The vial was capped with a septum cap. To another vial then was added trimethylolpropane trimethacrylate (1.00 g, 2.95 moles), and it was dissolved in methanol (5.0 mL) under CDA. The acrylate was then transferred into a syringe. Under a CDA atmosphere, the solution of acrylate was added to the solution of triamine dropwise over 5 min. The two solutions were clear and colorless before combination, and clear and colorless afterward, but the reaction solution became slightly warm upon the addition of acrylate. The reaction solution then was stirred overnight at room temperature under CDA. Samples removed 20 min after addition and, after stirring overnight, appeared to be the same after FTIR analysis. The product was isolated by addition of 5 mL toluene, followed by removal of the volatiles with flowing nitrogen gas. The product then was placed under a vacuum overnight, leaving an opaque, white semi-solid.

Analytical: Trimethylolpropane trimethacrylate FTIR (diamond, cm$^{-1}$): 3104 (w, olefin C—H), 1715 (s, C=O).

Product FTIR (diamond, cm$^{-1}$): 3278 and 3182 (w, amine) and 1728 (s, C=O).

ESI TOF MS: m/z (% relative intensity, ion): positive 232 (100%, M-2NH$_2$(CH$_2$)$_3$NH(CH$_2$)$_3$NHCH$_2$CH(CH$_3$)CO—NH$_2$(CH$_2$)$_3$NH(CH$_2$)$_2$+H), 331 (85%, M-2NH$_2$(CH$_2$)$_3$NH(CH$_2$)$_3$NHCH$_2$CH(CH$_3$)CO—NH$_2$+2Li—H), 431 (75%, M-NH$_2$(CH$_2$)$_3$NH(CH$_2$)$_3$NHCH$_2$CH(CH$_3$)CO—NH$_2$(CH$_2$)$_3$NH(CH$_2$)$_3$NH$_2$CH$_2$CH(CH$_3$)+3Na+H), 531 (25%, M-NH$_2$(CH$_2$)$_3$NH(CH$_2$)$_3$NHCH$_2$CH(CH$_3$)CO—H), 631 (15%, M-NH$_2$(CH$_2$)$_3$NH(CH$_2$)$_2$) and Negative 375 (35%, M-NH$_2$(CH$_2$)$_3$NH(CH$_2$)$_3$NHCH$_2$CH(CH$_3$)CO—NH$_2$(CH$_2$)$_3$NH(CH$_2$)$_3$NHCH$_2$CH(CH$_3$)+2Li), 443 (20%, M-NH$_2$(CH$_2$)$_3$NH(CH$_2$)$_3$NHCH$_2$CH(CH$_3$)CO—NH$_2$(CH$_2$)$_3$NH(CH$_2$)$_3$+H$_2$O+Li), 575 (35%, M-NH$_2$(CH$_2$)$_3$NH(CH$_2$)$_3$NHCH$_2$CH(CH$_3$)+2Li) and 773 (10%, M+Na+H$_2$O+H).

J. Synthesis of TE14A, a Dodecylamine Intermediate Intended for Production of a Nanocrystal Ligand to Bond the Nanocrystals into an Acrylate Cure Matrix

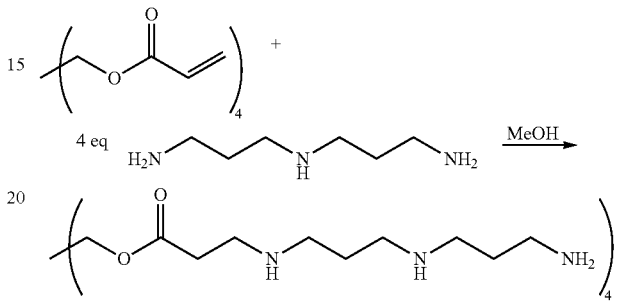

General: The reagents and solvents were purchased from Aldrich and used without further purification. However, the amine was stored and transferred in the glove box. The reagent handling and reaction were performed under clean dry air (CDA), as noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL vial in the glove box was added bis(3-aminopropyl)amine (2.98 g, 22.7 mmoles), which was then dissolved in methanol (8 mL). The vial was capped with a septum cap. Pentaerythritol tetraacrylate (1.00 g, 3.84 mmoles) was added to a vial and dissolved in methanol (5 mL) and then pulled into a syringe. The 20 mL vial then was placed under CDA and the acrylate was added dropwise over 5 min. Both solutions were clear and colorless before addition, and the reaction solution remained clear colorless after the addition. The reaction solution also became a little warm upon reagent combination. The reaction solution was stirred overnight at room temperature under CDA. Samples removed 20 min after addition and after stirring overnight were essentially the same according to FTIR analysis. The product was isolated by adding 5 mL toluene followed by removing the volatiles with flowing nitrogen gas. The product was then placed under vacuum overnight, leaving an opaque, white, oily solid.

Analytical

Pentaerythritol tetraacrylate FTIR (diamond, cm$^{-1}$): 1720 (s, C=O).

Product FTIR (diamond, cm$^{-1}$): 1733 (m, C=O), 1652 (s, primary NH$_2$ scissoring). ESI TOF MS: m/z (% relative intensity, ion): Positive 317 (100%, M-3NH$_2$(CH$_2$)$_3$NH(CH$_2$)$_3$NH(CH$_2$)$_3$CO—NH$_2$CH$_2$+Na+H), 502 (35%, M-2NH$_2$(CH$_2$)$_3$NH(CH$_2$)$_3$NH(CH$_2$)$_3$CO—NH$_2$CH$_2$+Na+H) and 688 (15%, M-NH$_2$(CH$_2$)$_3$NH(CH$_2$)$_3$NH(CH$_2$)$_3$CO—NH$_2$CH$_2$+Li—H). Negative 361 (60%, M-3NH$_2$(CH$_2$)$_3$NH(CH$_2$)$_3$NH(CH$_2$)$_3$CO+Na+H$_2$O—H), 366 (60%, M-2NH$_2$(CH$_2$)$_3$NH(CH$_2$)$_3$NH(CH$_2$)$_3$CO-2NH$_2$(CH$_2$)$_3$NH(CH$_2$)$_3$NH(CH$_2$)$_3$+H$_2$O—H), 546 (60%, M−2NH$_2$(CH$_2$)$_3$NH(CH$_2$)$_3$NH(CH$_2$)$_3$CO+Na+H$_2$O—H), 551 (25%, M−NH$_2$(CH$_2$)$_3$NH(CH$_2$)$_3$NH(CH$_2$)$_3$CO—NH$_2$(CH$_2$)$_3$NH(CH$_2$)$_3$NH(CH$_2$)$_3$+H$_2$O—H), 732 (25%, M−NH$_2$(CH$_2$)$_3$NH(CH$_2$)$_3$NH(CH$_2$)$_3$CO+Na+H$_2$O—H) and 917 (8%, M+Na+H$_2$O—H).

Example 2: Carboxylic Acid Ligands with Polymerizable Functional Groups

TABLE 3

Carboxylic Acid Ligand Structure Guide—Polymerizable End Groups

| Density | (Meth) Acrylate Ligand Name | Meth (Acrylate) Ligand Length, in atoms | Maleimide Ligand Name | Maleimide Ligand Length, in atoms |
|---|---|---|---|---|
| Bidentate | DCAMI | 13 | | |
| | DCA17A | 17 | DCAD2MI | 22 |
| | | | DCAD2MI | 24 |
| | | | DCAD8MI | 28 |
| | | | DCAD2AMI | 25 |
| | DCA17MA | 17 | DCAM2MI | 24 |
| | | | DCAM4MI | 28 |
| | | | DCAM8MI | 32 |
| | | | DCAM2AMI | 29 |
| | DCA7MA | 17 | DCA2MI | 29 |
| | | | DCA4MI | 31 |
| | | | DCA8MI | 34 |
| | | | DCA2D2AMI | 31 |

A. Synthesis of DCA17A, a Dicarboxylic Acid, Diacrylate Ligand for Nanocrystal Stabilization and Covalent Bonding into the Acrylate Cure Matrix

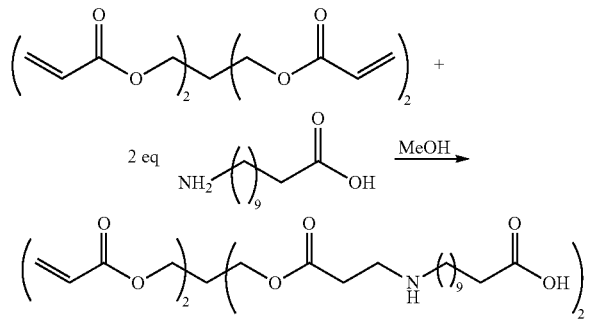

General: The reagents and solvents were purchased from Aldrich and used without further purification. However, the amine was stored and transferred in the glove box. The reagent handling and reaction were performed under clean dry air (CDA) as noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL amber vial under CDA were added 11-aminoundecanoic acid (1.14 g, 5.68 mmoles) and methanol (5 mL), which formed a slurry. The vial was closed with a septum cap. Pentaerythritol tetraacrylate (1.00 g, 2.84 mmoles) then was added to a separate vial and dissolved in methanol (5 mL) to produce a clear, colorless solution. The acrylate was drawn into a syringe, and the vial containing the amine solution was placed under CDA. The amine solution was added to the acrylate solution dropwise over 5 min. Upon this addition, the reaction solution became an opaque, white slurry that had become slightly warm. The solution was stirred overnight at room temperature. Samples of the reaction solution were removed for analysis after about 30 min, and overnight, and analyzed after removal of volatiles. The C=O peaks from pentaerythritol tetraacrylate at 1720 cm$^{-1}$ had shifted to 1725 cm$^{-1}$, which is not a very large shift. However, the NH$_2$ peak at 3111 cm$^{-1}$ had disappeared into the hydrogen bonded carboxylic acid absorbance between 3500 cm$^{-1}$ and 2500 cm$^{-1}$. Both of these factors suggested that the reaction had gone to completion. The reaction solution was isolated by adding toluene (5 mL), followed by removing volatiles with flowing nitrogen gas and vacuum. The product was an opaque, white semi-solid.

Analytical

Pentaerythritol tetraacrylate FTIR (diamond, cm$^{-1}$): 1720 (s, C=O).

Product FTIR (diamond, cm$^{-1}$): 3500 to 2500 (broad, hydrogen bonded carboxylic acid, ~3025 (sh, olefin C—H), 1725 (s, C=O), 1634 (m, C=C).

ESI TOF MS: m/z (% relative intensity, ion): Negative 939 (20%, M+Na+2NH$_4$Cl+3H$_2$O), 885 (15%, M+Na+2NH$_4$Cl), 794 (10%, M+Na+H$_2$O-H), 713 (25%, M−CO$_2$H+H$_2$O), 641 641 (100%, M−HO$_2$C(CH$_2$)5−H), 587 (100%, M−HO$_2$C(CH$_2$)10−H), 401 (15%, M−HO$_2$C(CH$_2$)10NH$_2$—HO$_2$C(CH$_2$)$_8$+H), 200 (40%, 2 M−HO$_2$C(CH$_2$)10NH$_2$—HO$_2$C(CH$_2$)8+H).

B. Synthesis of DCA17MA, a Dicarboxylic Acid Monomethacrylate Ligand, for Nanocrystal Stabilization and Covalent Bonding into the Acrylate Cure Matrix

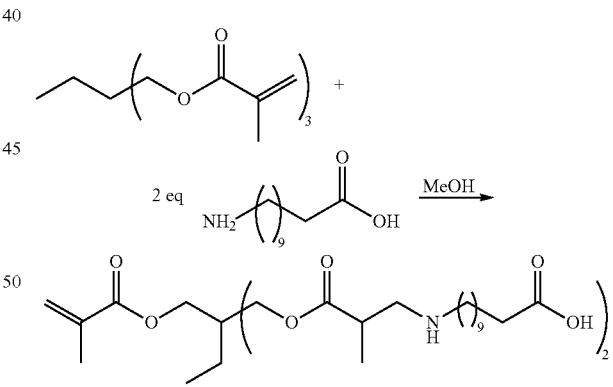

General: The reagents an solvents were purchased from Aldrich an use without further purification. However, the amine/carboxylic acid were stored under CDA. The reagent handling and reaction were performed under clean dry air (CDA), as noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL amber vial was added 11-aminoundecanoic acid (1.19 g, 5.91 mmoles) that was then dissolved in methanol (5 mL) to form a slurry. The vial was closed with a septum cap. Then into a separate vial was added trimethylolpropane trimethacrylate (1.00 g, 2.95 mmoles) that was dissolved in methanol (5 mL) to produce a clear, colorless solution that was drawn into a syringe. Under CDA, the amine solution then was added to the acrylate solution dropwise over 5 min. The reaction solution remained an opaque, white slurry. The solution was stirred at room temperature under CDA overnight. Samples were removed about 30 min after addition, and overnight, and the volatiles were removed with flowing nitrogen gas and vacuum to prepare them for FTIR analysis. FTIR analysis of the two samples was essentially the same, except the hydrogen bonding regions between 2500 $cm^{-1}$ and 3500 $cm^{-1}$ were not the same. The product was isolated by adding toluene (5 mL) and, after mixing, the volatiles were removed with flowing nitrogen gas followed by vacuum overnight. The product was an opaque, white semi-solid.

Analytical

Trimethylolpropane trimethacrylate FTIR (diamond, $cm^{-1}$): 1715 (s, C=O).

Product FTIR (diamond, $cm^{-1}$): 3500 to 2500 (broad w, hydrogen bonded carboxylic acid), 1718 (m, C=O), 1637 (m, C=C).

ESI TOF MS: m/z (% relative intensity, ion): Positive 540 (40%, M-2($CH_2$)$_4$$CO_2$H+), 361 (45%, M-C(O)C($CH_3$)=$CH_2$ and —($CH_2$)$_7$$CO_2$H and —($CH_2$)$_8$$CO_2$H$^-$), 356 (100%, M-C(O)C($CH_3$)$CH_2$NH($CH_2$)$_{11}$$CO_2$H and —($CH_2$)$_5$$CO_2$H$^-$) and Negative 641 (45%, M-$CH_2$$CO_2$C($CH_3$)=$CH_2$$^-$), 501 (35%, M-C($CH_3$)$CH_2$NH($CH_2$)$_{10}$$CO_2$H$^-$), 346 (55%, M-$CH_2$$CO_2$C($CH_3$)=$CH_2$ and ($CH_2$)$_9$$CO_2$H and ($CH_2$)$_8$$CO_2$H$^-$).

C. Synthesis of DCA7MA, a Bidentate Dicarboxylic Acid, from a Dicarboxylic Acid Amine and Hexanediol Dimethacrylate 1-piperidinyloxy (TEMPO) to prevent polymerization. To a 20 mL vial was added hexanediol dimethacrylate (10 g, 39.3 mmoles) followed by TEMPO (14.2 mg) in air, and the solution in the vial was mixed with a vial rolling mixer overnight to completely dissolve the TEMPO and produce a clear solution. Toluene and methanol were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of the anhydride: To a 20 mL clear glass vial was added hexanediol diacrylate (0.867 g, 3.41 mmoles), which was dissolved in methanol (2.0 mL). The vial then was capped with a septum cap, attached to the vacuum line with a needle through the septum, and placed into a heat block that was thermostat controlled at 30° C. The diacid amine (DCA10A) (1.18 g, 3.41 mmoles) was dissolved in methanol (8.7 mL). The solution was drawn into a syringe and added dropwise over 10 min with stirring. The reaction solution was clear after the addition, and remained clear upon stirring at 30° C. overnight. A sample was removed, and the volatiles were removed with flowing nitrogen gas and vacuum to prepare them for FTIR analysis. FTIR analysis showed two C=O peaks at 1701 $cm^{-1}$ and 1636 $cm^{-1}$, which are different than the peaks that occurred when the solution was the placed under starting diacid—amine at 1712 $cm^{-1}$ and 1633 $cm^{-1}$ and the hexanediol dimethacrylate at 1713 $cm^{-1}$. As a result, the reaction was considered complete, and the volatiles were removed with flowing nitrogen gas followed by vacuum. The product was stored in methanol for the next reaction. The purity and yield of this synthesis may be improved with a tertiary amine catalyst such as trimethylamine or pyridine.

Analytical Data

FTIR (diamond, $cm^{-1}$): 3275 (m, amine), 3069 (w, olefin C—H), 1701 (m, C=O), 1636 (m, C=O).

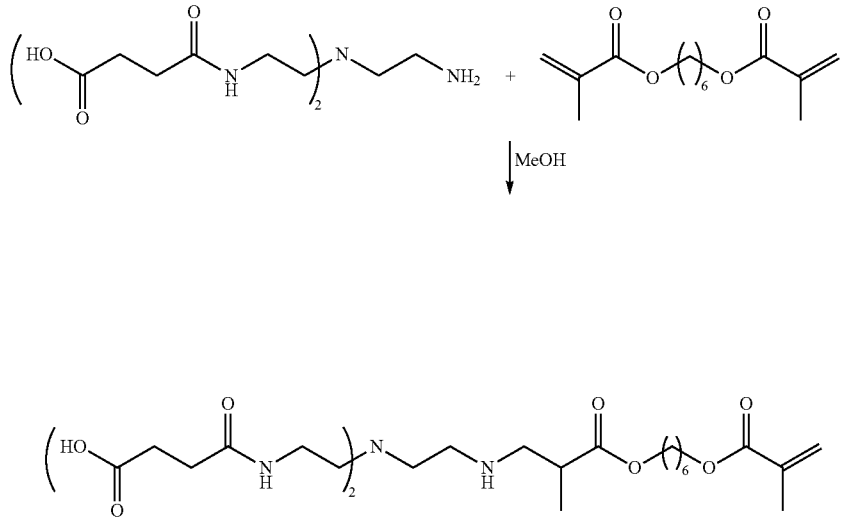

General: The reagents and solvents were purchased from Aldrich and used without further purification. The starting materials dicarboxylic acid amine (DCA10A) was stored and handled in the glove box and hexanediol dimethacrylate was stored and handled in the air. However, the hexanediol dimethacrylate was also combined with 2,2,6,6-tetramethyl- ESI TOF MS: m/z (% relative intensity, ion): Positive 266 (25%, M-2$HO_2$C($CH_2$)$_2$—$CH_3$CH($CH_2$)CO(O)($CH_2$)$_6$OC(O)$CH_2$$CH_3$+Na+H), 447 (50%, M-$CH_3$C($CH_2$)CO(O)($CH_2$)$_5$+H), negative 445 (100%, M-$CH_3$C($CH_2$)CO(O)($CH_2$)$_5$-H).

D. Synthesis of DCA2MI, DCA4MI and DCA8MI, that are Bidentate Dicarboxylic Acid, from a Dicarboxylic Acid Amine and the Amine—Maleimides A2 MI, A4 MI and A8 MI, Respectively

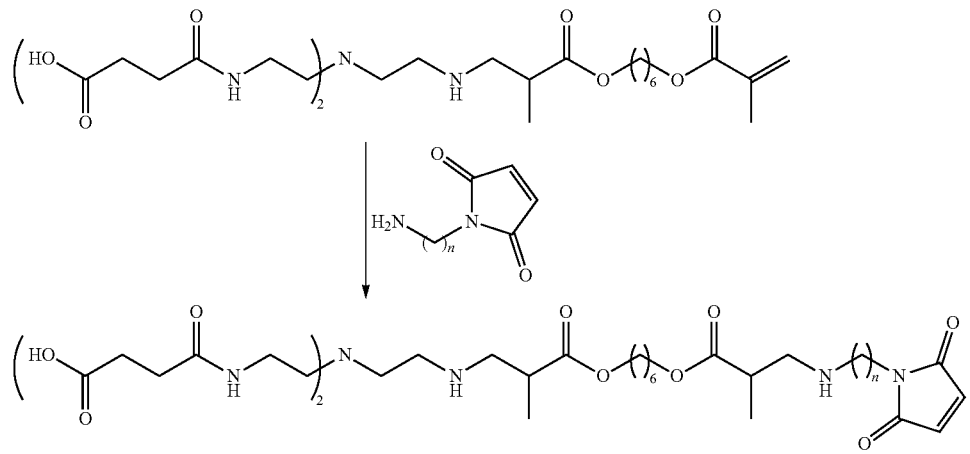

Where n = 2, 4, 8

General: The reagents and solvents were purchased from Aldrich and used without further purification. The starting materials dicarboxylic acid-methacrylate (DSA7MA) was stored in methanol in the glove box along with the maleimide-amine that was stored as a dry powder. Toluene and methanol were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of DCA8MI with n=8: To an 8 mL clear glass vial was added maleimide-amine (A8 MI) (0.100 g, 0.446 mmoles), and the diacid-methacrylate (DSA7MA) (0.268 g, 0.446 mmoles) was added in methanol (1.6 mL). The vial was then stirred over the weekend while resting in a heat block that was temperature controlled at 30° C. The volatiles then were removed with flowing nitrogen gas followed by vacuum, leaving the product a white, oily paste.

Analytical Data

FTIR (diamond, $cm^{-1}$): 3500 to 2500 (broad, carboxylic acid OH), 3273 (w, amine), 3059 (w, olefin C—H), 1967 (m, C=O), 1636 (s, C=O).

ESI TOF MS: m/z (% relative intensity, ion): Positive 447 (50%, M-(HOC(O)CH$_2$CH$_2$C(O)NHCH$_2$CH$_2$)$_2$N(CH$_2$)$_2$NHCH$_2$CH(CH$_3$)+Li+H) and negative 445 (100%, M-(HOC(O)(CH$_2$)$_2$C(O)NHCH$_2$CH$_2$)$_2$N(CH$_2$)$_2$NHCH$_2$CH(CH$_3$)+Li–H), 427 (15%, M-(HOC(O)(CH$_2$)$_2$C(O)NHCH$_2$CH$_2$)$_2$N)CH$_2$)$_2$NHCH$_2$CH(CH$_3$)C(O)O+H$_2$O—H) and 459 (15%, M-(HOC(O)(CH$_2$)$_2$C(O)NHCH$_2$CH$_2$)$_2$N-Maleimide+Li+Na+H).

The other products were synthesized similarly.

For DCA2MI the n=2 derivative: dicarboxylic acid-methacrylate (0.428 g, 0.713 mmoles) in 2.2 mL methanol was combined with maleimide-amine (A2 MI) (0.100 g, 0.713 mmoles).

FTIR (diamond, $cm^{-1}$): 3500 to 2500 (broad, carboxylic acid OH), 3268 (m, amine), 3068 (m, olefin), 1702 (m, C=O), and 1635 (s, C=O).

ESI TOF MS: m/z (% relative intensity, ion): Positive 429 (20%, M-(HOC(O)CH$_2$CH$_2$C(O)NHCH$_2$CH$_2$)$_2$NCH$_2$CH$_2$+H$_2$O) and 447 (55%, M-(HOC(O)CH$_2$CH$_2$C(O)NHCH$_2$CH$_2$)$_2$N+Li+H) and negative 691 (15%, M-maleimide+2Na—H) and 445 (100%, M-(HOC(O)CH$_2$CH$_2$C(O)NHCH$_2$CH$_2$)$_2$N+Li—H).

For DCA4MI the n=4 derivative: dicarboxylic acid-methacrylate (0.357 g, 0.594 mmoles) in 1.8 mL methanol was combined with maleimide-amine (A4 MI) (0.100 g, 0.594 mmoles).

FTIR (diamond, $cm^{-1}$): 3500 to 2500 (broad, carboxylic acid OH), 3265 (m, amine), 3075 (m, olefin), 1695 (m, C=O), and 1634 (s, C=O).

ESI TOF MS: m/z (% relative intensity, ion): Positive 693 (10%, M-maleimideCH$_2$CH$_2$+2Na+H) and 593 (10%, M-maleimideCH$_2$—HOC(O)CH$_2$CH$_2$—H+Li) and negative 459 (10%, M-maleimide-CH$_2$CH$_2$CH$_2$NHCH$_2$CH(CH$_3$)CO(O)CH$_2$CH$_2$CH$_2$CH$_2$—H) and 691 (10%, M-maleimideCH$_2$CH$_2$+2Na—H).

TABLE 3

Succinic Acid Ligand Structure Guide—Polymerizable End Groups

| Density | (Meth) Acrylate Ligand Name | Meth (Acrylate) Ligand Length, in atoms | Maleimide Ligand Name | Maleimide Ligand Length, in atoms |
|---|---|---|---|---|
| Tetradentate | SA16MA | 15 | SA2MI | 23 |
|  |  |  | SA4MI | 25 |
|  |  |  | SA8MI | 29 |
|  |  |  | SA2D2AMI | 26 |
|  | DSA12MA | 13 | DSA2MI | 19 |
|  |  |  | DSA4MI | 21 |
|  |  |  | DSA8MI | 25 |
|  |  |  | DSA2AMI | 22 |

E. Synthesis of SA16 MA, a Bidentate Dicarboxylic Acid, from a Mercaptosuccinic Acid and Hexanediol Dimethacrylate

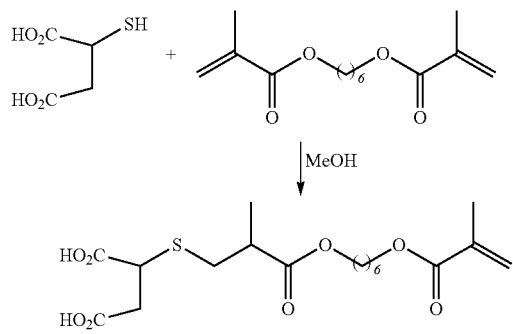 [SMILES: "MeOH" ; O=C(O)CC(S)C(=O)O ; C=C(C)C(=O)OCOC(=O)C(=C)C ; C=C(C)C(=O)OCOC(=O)C(C)CSC(CC(=O)O)C(=O)O]

General: The reagents and solvents were purchased from Aldrich and used without further purification. The starting materials mercaptosuccinic acid was stored and handled in the glove box while hexanediol dimethacrylate was stored and handled in the air. However, the hexanediol dimethacrylate was also combined with TEMPO to prevent polymerization. To a 20 mL vial was added hexanediol dimethacrylate (10 g, 39.3 mmoles) followed by TEMPO (14.2 mg) in air, and the solution was mixed with a rolling vial mixer overnight to completely dissolve the TEMPO and produce a clear solution. Toluene and methanol were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of the anhydride: To a 20 mL clear glass vial were added mercaptosuccinic acid (2.00 g, 13.3 mmoles) and methanol (7.0 mL) in the glove box. The thiol was dissolved completely and pulled into a syringe. The hexanediol dimethacrylate (3.39 g, 13.3 mmoles) was transferred into a 20 mL brown glass vial in air and then de-gassed in the antechamber on the way into the glove box. Once inside the glove box, the hexanediol dimethacrylate was dissolved in methanol (4.0 mL) and the vial was capped with a septum cap. Outside the glove box, the vial was attached to the vacuum line using a syringe needle through the septum. The vial was placed into a thermostat-controlled heat block maintained at 30° C., and the solution of the thiol was added dropwise over 10 min. Following this addition, the reaction solution was clear, and was then heated at 40° C. overnight. After being heated overnight, the reaction solution was opaque, but stirring freely. The solution was sampled, and the volatiles were removed from the sample with flowing nitrogen gas followed by vacuum. FTIR analysis of the sample showed C=O peaks at 1690 cm$^{-1}$, which were different than those obtained with the mercaptosuccinic acid at 1681 cm$^{-1}$, but not very much different than those obtained with hexanediol dimethacrylate at 1713 cm−1. However, the volatiles were removed from the reaction solution with flowing nitrogen gas followed by vacuum, leaving an oily paste. The reaction procedure can be improved by adding 0.01 eq (or less) of a catalytic amine such as triethyl amine or pyridine.

Analytical Data

FTIR (diamond, cm$^{-1}$): 3500 to 2500 (broad, carboxylic acid) and 1710 (m, C=O).

ESI TOF MS: m/z (% relative intensity, ion): Positive 255 (100%, M-CO$_2$H—(CH$_2$)$_4$OC(O)CH(CH$_2$)CH$_3$+2H$_2$O), 255 (100%, M-CO$_2$H—(CH$_2$)$_4$OC(O)CH(CH$_2$)CH$_3$+2H$_2$O), 271 (50%, M-CO$_2$H—(CH$_2$)$_{20}$C(O)(CH$_2$)CH$_3$)+Na), 266 (25%, M-(CH$_2$)$_4$OC(O)C(CH$_2$)CH$_3$) and 277 (25%, M-(CH$_2$)$_{30}$C(O)C(CH$_2$)CH$_3$).

F. Synthesis of SA2 MI, a Bidentate Dicarboxylic Acid, from a Dicarboxylic Acid Amine and Hexanediol Dimethacrylate

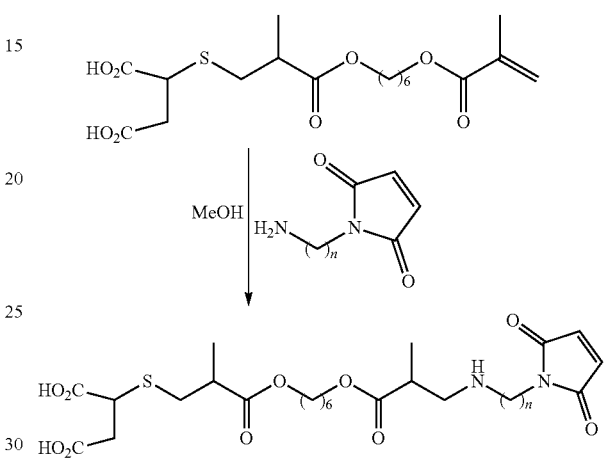

General: The reagents and solvents were purchased from Aldrich and used without further purification. The starting material, dicarboxylic acid-methacrylate (SA16 MA), was stored in methanol in the glove box. The maleimide-amine was stored as a dry powder in the glove box. Toluene and methanol were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps Center for Metabolomics and Mass Spectrometry.

Synthesis of SA2 MI, the product with n=2: To an 8 mL clear glass vial was added maleimide-amine (A2 MI) (0.100 g, 0.713 mmoles), and diacid-methacrylate (SA16 MA) (0.289 g, 0.713 mmoles) was added in methanol (1.0 mL). The vial was then stirred over the weekend while resting in a heat block that was temperature controlled at 30° C. The volatiles then were removed with flowing nitrogen gas followed by vacuum, leaving the product was a white oily paste.

Analytical Data

FTIR (diamond, cm$^{-1}$): 3500 to 2500 (broad, carboxylic acid OH) and 1702 (s, C=O).

ESI TOF MS: m/z (% relative intensity, ion): Positive 209 (100%, M-HO$_2$CCH$_2$CH(CO$_2$H)SCH$_2$CH(CH$_3$)C(=O)O(CH$_2$)$_6$O—H–), 255 (35%, M-HO$_2$CCH$_2$CH(CO$_2$H)SCH$_2$CH(CH$_3$)C(=O)O(CH$_2$)$_5$+H) and 463 (25%, M-HO$_2$C—HO$_2$C+Li) and negative 403 (20%, M-HO$_2$CCH$_2$CH(CO$_2$H)SCH$_2$CH(CH$_3$)—H+2H$_2$O).

The other products were synthesized similarly.

For SA4 MA, the n=4 derivative: dicarboxylic acid-methacrylate (0.241 g, 0.594 mmoles) in 1.5 mL methanol was combined with maleimide-amine (A4 MI) (0.100 g, 0.594 mmoles). FTIR (diamond, cm$^{-1}$): 3500 to 2500 (broad, carboxylic acid OH) and 1711 (s, C=O). For SA8 MA, the n=8 derivative: dicarboxylic acid-methacrylate (0.181 g, 0.466 mmoles) in 1.5 mL methanol was combined with maleimide-amine (A8 MI) (0.100 g, 0.446 mmoles). FTIR (diamond, cm$^{-1}$): 3500 to 2500 (broad, carboxylic acid OH) and 1697 (s, C=O).

G. Synthesis of DSA12MA, a Tetradentate Succinic Acid, from a Mercaptosuccinic Acid and TMPTMA

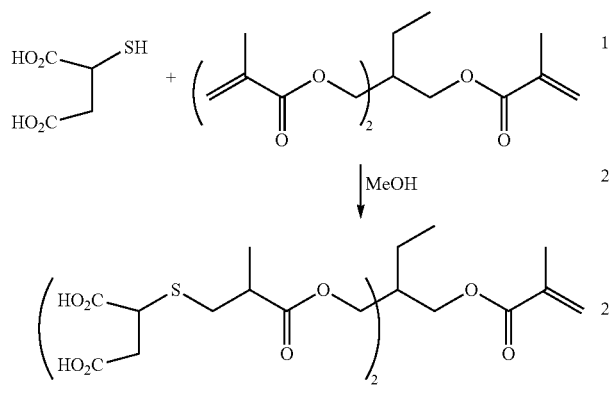

General: The reagents and solvents were purchased from Aldrich and used without further purification. The starting material, mercaptosuccinic acid, was stored and handled in the glove box, while trimethylolpropane trimethacrylate (TMP TMA) was stored and handled in the air. However, the TMP TMA was also combined with TEMPO to prevent polymerization. To a 20 mL vial was added TMP TMA (10 g, 29.6 mmoles) followed by TEMPO (10.5 mg) in air, and the solution was mixed with a rolling vial mixer overnight to completely dissolve the TEMPO and produce a clear solution. Toluene and methanol were also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of DSA12MA: To a 20 mL clear glass vial was added mercaptosuccinic acid (2.66 g, 17.7 mmoles) and methanol (9.0 mL) in the glove box. The thiol then was dissolved completely and pulled into a syringe. The TMP TMA (3.00 g, 8.86 mmoles) was transferred into a 20 mL brown glass vial in air and then de-gassed in the antechamber on the way into the glove box. Once inside, the TMP TMA was dissolved in methanol (4.0 mL) and the vial was capped with a septum cap. Outside the glove box, the vial was attached to the vacuum line using a syringe needle through the septum. The vial was placed into a thermostat-controlled heat block maintained at 30° C., and the solution of the thiol was added dropwise over 10 min. After addition, the reaction solution was clear and was then heated at 40° C. overnight. After being heated overnight, the reaction solution was opaque but stirring freely. The solution was sampled, and the volatiles were removed from the sample with flowing nitrogen gas followed by vacuum. FTIR analysis of the sample showed C=O peaks at 1689 cm$^{-1}$, which were different than TMP TMA at 1715 cm$^{-1}$, but not very much different than the mercaptosuccinic acid at 1681 cm$^{-1}$. The reaction ceased, and the product was stored in methanol in the glove box. This reaction procedure can be improved by adding 0.01 eq (or less) of a catalytic amine such as triethyl amine or pyridine.

Analytical Data

FTIR (diamond, cm$^{-1}$): 3500 to 2500 (broad, carboxylic acid) and 1689 (s, C=O).

ESI TOF MS: m/z (% relative intensity, ion): Positive 361 (60%, M−CH$_3$C(CH$_2$)CO(O)−HO$_2$CCH$_2$CH(CO$_2$H)SCH$_2$CH(CH$_3$)CO(O)+H$_2$O+Na), 511 (75%, M−CO$_2$H−CH$_3$C(CH$_2$)CO(O)), 525 (20%, M−HO$_2$CCH$_2$CHCO$_2$H+H), 525 (20%, M−CO$_2$H−CH$_3$C(CH$_2$)C(O)−H).

H. Synthesis of DSA2MI, DSA4MI and DCS8MI, that are Bidentate Dicarboxylic Acids, from a Dicarboxylic Acid Amine and the Amine—Maleimides A2 MI, A4 MI and A8 MI, Respectively

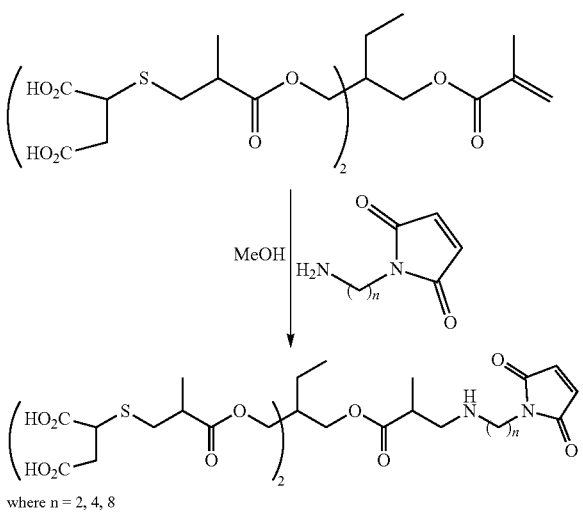

where n = 2, 4, 8

General: The reagents and solvents were purchased from Aldrich and used without further purification. The starting material dicarboxylic acid-methacrylate (DSA12MA) was stored in methanol in the glove box. Maleimide amine was stored as a dry powder. Methanol was also stored and handled under nitrogen gas. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthesis of DSA2MI with n=2: To an 8 mL clear glass vial was added maleimide-amine (A2MI)(0.100 g, 0.713 mmoles), and the tetraacid-methacrylate (DSA2MA)(0.46 g, 0.713 mmoles) was added in methanol (1.6 mL). The vial was then stirred over the weekend while resting in a heat block that was temperature controlled at 30° C. The volatiles then were removed with flowing nitrogen gas followed by vacuum, leaving the product a white oily paste.

Analytical Data

FTIR (diamond, cm$^{-1}$): 3500 to 2500 (broad, carboxylic acid OH) and 1700 (s, C=O).

ESI TOF MS: m/z (% relative intensity, ion): Positive 359 (15%, M-2HO$_2$CCH$_2$CH(CO$_2$H)SCH$_2$CH(CH$_3$)C(=O)+H$_2$O—H), 459 (10%, M-HO$_2$CCH$_2$CH(CO$_2$H)—HO$_2$CCH$_2$CH(CO$_2$H)SCH$_2$CH(CH$_3$)C(=O)+2Li—H), 565 (10%, M-HO$_2$CCH$_2$CH(CO$_2$H)SCH$_2$CH(CH$_3$)C(=O)—H+Li) and 697 (10%, M-2HO$_2$C+Li), negative 487 (10%, M-HO$_2$CCH$_2$CH(CO$_2$H)—HO$_2$CCH$_2$CH(CO$_2$H)SCH$_2$CH(CH$_3$)C(=O)—H) and 637 (10%, M-HO$_2$CCH$_2$CH(CO$_2$H)S+Li—H).

The other products were synthesized similarly.

For DSA4MI the n=4 derivative: tetracarboxylic acid-methacrylate (A4 MI) (0.380 g, 0.594 mmoles) in 1.3 mL methanol was combined with maleimide-amine (0.100 g, 0.594 mmoles)

FTIR (diamond, cm$^{-1}$): 3500 to 2500 (broad, carboxylic acid OH), 3075 (w, olefin) and 1699 (s, C=O).

For DSA8MI the n=8 derivative: tetracarboxylic acid-methacrylate (0.268 g, 0.446 mmoles) in 1.0 mL methanol was combined with maleimide-amine (A8 MI) (0.100 g, 0.446 mmoles).

FTIR (diamond, cm$^{-1}$): 3500 to 2500 (broad, carboxylic acid OH) and 1696 (s, C=O).

Example 3: Ligand Exchange of Quantum Materials Green ODS with Ligand EG4.3TSA

General: The solvents dimethoxy ethane (DME), ethyl acetate (EtOAc), hexanes and ethyl alcohol (EtOH) were purchased from Aldrich (anhydrous grade) and used without further purification in a glovebox. The ligand EG4.3TSA was synthesized as described in Example 1. The diluent, M-600-MI, was synthesized as described in Example 5. The QDs were purchased from Quantum Materials Corp in San Marcos, TX. An Amicon Ultra 4 (i.e. 4 mL volume) with high flux polyethersulfone (PES) membrane with 30K molecular weight cut off (MWCO) was used for centrifugal filtration. FTIR analysis was obtained on a Nicolet 6700 spectrometer equipped with a Smart iTR Attenuated Total Reflectance (ATR) Sampling Accessory. Analysis for optical density (OD) was performed on a Cary 5000 UV-Vis Spectrometer by Varian.

Procedure: To six, 8 mL vials (synthesis performed in parallel) in the glovebox were added EG4.3TSA ligand (200 mg, 0.502 mmoles, 1.4 eq ligand/surface Zn atom (as shown in the table below) and DME (2.0 mL), and the reaction solution was gently swirled until clear. A flea size magnetic stir bar then was added, followed by a solution of green QDs in toluene (2.0 mL with [QD] of 10 OD$_{450}$ measured at 450 nm). After closing the vial with a screw cap, the mixture was then heated in a thermostat-controlled heat block at 90° C. for 16 h. The reaction solution was clear green upon combination, and was also clear green after being heated overnight at 90° C. The vial cap was replaced with a septum cap, and the volatiles were removed with flowing nitrogen gas using two syringe needles (nitrogen in and nitrogen out) to produce a clear, concentrated oil. The oil was dissolved in EtOAc (200 μL) completely to form a clear solution, and the product was precipitated with hexanes (2.0 mL). After the addition of hexane, the vial was shaken aggressively for about 60 seconds and then centrifuged using an angular velocity, ω, of 2000 for 10 minutes to produce a clear, intensely green pellet underneath a clear, colorless liquid supernatant. In the glove box the supernatant was removed and discarded before the dissolution/precipitation process was repeated again with EtOAc 200 μL, precipitated with 2 mL of hexanes, mixed by shaking, centrifuged, and the supernatant removed to produce an intensely green pellet that was a little smaller in volume and a little thicker in viscosity than produced by the first precipitation. The product in each vial was dissolved in EtOH (1.0 mL) to a produce clear, green solution. At the same time, one Amicon Ultra 4 filter was cleaned with EtOH (4 mL) and centrifuged for 10 min to remove surfactant from the filter membrane. The solution from four vials then was added to the MWCO centrifuge filters, and the centrifuge filters were spun at an angular velocity, ω, of 2000 until about 300 μL of solution remained above the filter element. During centrifugation, a small amount of green QDs leaked through the filter, but the vast majority were retained. The retained QDs had been concentrated into a yellow orange oil that could be observed by the eye above the MWCO filter element. The last two vials then were added to the filter, and the solution above the filter was mixed by 'pumping' the solution with a Pasteur pipette. The filter was spun on the centrifuge until about 500 μL of solution remained above the filter element. Each vial then was rinsed with EtOH, 1 mL, and that solution was added to the filter sequentially and the vials were spun on the centrifuge with enough EtOH so that each vial was rinsed with 2×1.0 mL EtOH. When the volume in the centrifuge filter was about 500 μL the solution was transferred to a tared vial and the volatiles were removed with flowing nitrogen gas to leave a concentrated paste of quantum dot concentrate or 'QD concentrate.' The vial was sent into the glove box and the product was placed under vacuum in the antechamber for 1 minute before weighing. The product was an intensely green grease that weighed 94.4 mg. It was easily dissolved in 1.0 mL EtOH, and a 20 μL sample was dissolved in 4.0 mL EtOH for an optical density (OD) measurement at 450 nm using a cuvette with 10 mm path length. Using the optical density from this dilute solution measurement the OD$_{450}$ was projected back to the QD concentrate. The OD$_{450}$ was 0.521, which made the EtOH solution 105 OD$_{450}$ and the QD concentrate 1214 OD$_{450}$. While dissolved in 1 mL of EtOH, 100 mg of M-600-MI then was added, and the volatiles were removed with flowing nitrogen gas followed by vacuum to leave a thick, intensely green, but flowing oil. The table below summarizes some of the numbers used in this synthesis.

| OD450 of QDs from manufacturer | QD solution used per vial | Zn surface atoms/ OD450 | Zn atoms on surface in solution | Ligand/ fwt of ligand | Amount of ligand added to exchange | mmoles of ligand added to exchange | Ratio; mmoles ligand to mmoles Zn on QD surface |
|---|---|---|---|---|---|---|---|
| 10 | 2 mL | 1.79 × 10E-2 mmoles/ OD450 | 0.179 mmoles | EG4. 3TSA/ 398.47 | 100 mg | 0.251 mmoles | 1.40 |

Example 4: Ligand Exchange of Quantum Materials Red QDS with Ligand EG4.3TSA General: The solvents dimethoxy ethane (DME), ethyl acetate (EtOAc), hexanes and ethyl alcohol (EtOH) were purchased from Aldrich (anhydrous grade) and used without further purification in a glovebox. The ligand EG4.3TSA was synthesized as described in Example 1. The diluent, M-600-MI, was synthesized as described in Example 5. The QDs were purchased from Quantum Materials Corp in San Marcos, TX. An Amicon Ultra 4 (i.e. 4 mL volume) with high flux polyethersulfone (PES) membrane with 30K molecular weight cut off (MWCO) was also used for centrifugal filtration. FTIR analysis was obtained on a Nicolet 6700 spectrometer equipped with a Smart iTR Attenuated Total Reflectance (ATR) Sampling Accessory. Analysis for optical density (OD) was performed on a Cary 5000 UV-Vis Spectrometer by Varian.

Procedure: To six, 8 mL vials (synthesis performed in parallel) in the glovebox were added EG4.3TSA ligand (40 mg, 0.502 mmoles, 1.4 eq ligand/surface Zn atom, as shown in the table below) and DME (2.0 mL), and the reaction solution was gently swirled until clear. Then a flea size magnetic stir bar was added, followed by a solution of red QDs in toluene (2.0 mL with [QD] of 10 OD measured at 450 nm). After closing the vial with a screw cap, the mixture was then heated in a thermostat-controlled heat block at 90° C. for 16 h. The reaction solution was clear red upon combination and was also clear red after heating at 90° C. overnight. The vail cap was replaced with a septum cap, and the volatiles were removed with flowing nitrogen gas using two syringe needles (nitrogen in and nitrogen out) to produce a clear concentrated oil. The oil was dissolved in EtOAc (100 µL) completely to form a clear solution, and the product was precipitated by the addition of hexanes (2.0 mL). After hexane addition, the vial was shaken aggressively for about 60 seconds and then centrifuged using an angular velocity, ω, of 2000 for 10 minutes to produce a clear, intensely red pellet underneath a clear, colorless liquid supernatant. In the glove box, the supernatant was removed and discarded before the dissolution/precipitation process was repeated with EtOAc 200 µL, precipitated with hexanes 2 mL, mixed by shaking, centrifuged and the supernatant removed to produce an intensely red pellet that was a little smaller in volume and a little thicker in viscosity than produced by the first precipitation. The product in each vial was dissolved in EtOH (1.0 mL) to produce a clear, red solution. At the same time, one Amicon Ultra 4 filter was cleaned with EtOH (4 mL) and centrifuged for 10 min to remove surfactant from the filter membrane. The solution from four vials was then added to the MWCO centrifuge filters, and the centrifuge filters were spun at an angular velocity, ω, of 2000 until about 300 µL of solution remained above the filter element. During centrifugation, a small amount of red QDs leaked through the filter, but the vast majority were retained. The retained QDs had been concentrated into a dark red oil that could be observed by the eye above the MWCO filter element. The last two vials then were added to the filter, and the solution above the filter was mixed by 'pumping' the solution with a Pasteur pipette. The filter was spun on the centrifuge until about 500 µL of solution remained above the filter element. Each vial then was rinsed with EtOH, 1 mL, that solution added to the filter sequentially, and the vials were spun on the centrifuge with enough EtOH so that each vial was rinsed with 2×1.0 mL EtOH. When the volume in the centrifuge filter was about 500 µL the solution was transferred to a tared vial and the volatiles were removed with flowing nitrogen gas to leave a concentrated paste of quantum dot concentrate or 'QD concentrate.' The vial was sent into the glove box, and the product was placed under vacuum in the antechamber for 1 minute before weighing. The product was an intensely red grease that weighed 17.3 mg. It was easily dissolved in 1.0 mL EtOH and a 20 µL sample was dissolved in 4.0 mL EtOH for an optical density (OD) measurement at 450 nm using a cuvette with 10 mm path length. Using the optical density from this dilute solution measurement, the $OD_{450}$ was projected back to the QD concentrate. The $OD_{450}$ was 0.310, which made the EtOH solution 62.3 $OD_{450}$ and the QD concentrate 3664 $OD_{450}$. While dissolved in 1 mL of EtOH, 200 mg of M-600-MI was then added, and the volatiles were removed with flowing nitrogen gas followed by vacuum to leave a thick, intensely red grease. The table below summarizes some of the numbers used in this synthesis.

| OD450 of QDs from manufacturer | QD450 solution used per vial | Zn surface atoms/ OD450 | Zn atoms on surface in solution | Ligand/ fwt of ligand | Amount of ligand added to exchange | mmoles of ligand added to exchange | ratio; mmoles ligand to mmoles Zn on QD surface |
|---|---|---|---|---|---|---|---|
| 12.6 | 2.0 mL | 1.99 × 10E-3 mmoles/ OD450 | 0.0501 mmoles | EG4. 3TSA/ 398.47 | 40.0 mg | 0.304 | 2.0 |

Example 5: Synthesis of M-600-MI from Jeffamine M-600

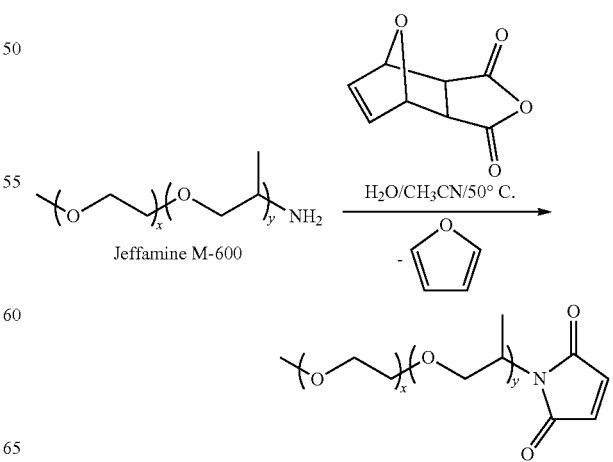

General: The reagents and solvents were purchased from Aldrich and used without further purification. The M–600 Jeffamine was obtained from Huntsman. Reagent handling and the reaction were performed under nitrogen, except where noted. FTIR analysis was obtained on a Nicolet 6700 spectrometer equipped with a Smart iTR Attenuated Total Reflectance (ATR) Sampling Accessory. Mass spectroscopy analysis was obtained by Scripps MS Center for Metabolomics and Mass Spectrometry.

Synthetic Procedure: To a 20 mL clear glass vial was added exo-3,6-epoxy-1,2,3,6-tetrahydrophthalic anhydride (2.76 g, 16.7 mmoles) in air, and the vial was sent into the glove box open to de-gas in the antechamber. 20 mL of acetonitrile was then added, and the solution was stirred for about 15 minutes until dissolved. The solution was drawn into a 24 mL syringe. Concurrently, to a 40 mL vial was added Jeffamine M-600 (10.0 g, 16.7 mmoles) in air. The vial was then capped with a septum cap and gently purged with nitrogen gas for 15 minutes before de-gassed water, 5 mL, was added to form a clear, colorless solution. While a nitrogen atmosphere was maintained with a needle and bubbler, the reaction solution was heated in a thermostat-controlled heat block to 50° C. The solution of the anhydride in acetonitrile was then added dropwise over 15 minutes. The reaction was stirred at 50° C. for 16 h (or overnight) under nitrogen.

Following heating the reaction solution overnight, a 100 µL sample was placed under vacuum at a pressure of less than 100 mtorr and analyzed by FTIR. There were two new peaks at 1717 cm$^{-1}$ and 1578 cm$^{-1}$ for maleimide C=O, which differed from the starting anhydride peaks at 1857 cm$^{-1}$ and 1778 cm$^{-1}$. The Jeffamine also did not have significant absorbances in this region. The volatiles were removed from the product by flowing nitrogen gas, while the vial was in the thermostat-controlled heat block was maintained at 50° C. Once the volume of the solution had been reduced by half, toluene was added (24 mL), the reaction solution was thoroughly mixed, and the volatiles were removed again with flowing nitrogen gas. Toluene (24 mL) was added, and the volatiles were removed again with the same procedure. The reaction vial was then placed into a desiccator and subjected to vacuum overnight with magnetic stirring. Following that, the whole process was performed again: toluene 24 mL, flowing nitrogen, toluene 24 mL, flowing nitrogen, and vacuum with stirring. When the process was completed the pressure in the desiccator was <100 mtorr.

The product was analyzed by FTIR after the first and second vacuum procedures. The baseline was compared between ~3800 and ~2200 cm$^{-1}$ as a relative measure of the amount of water in the mixture. The relative shape and size of the baseline and the shoulder surrounding the sp$^3$ C—H bond stretch was the same, so the product was considered dry and the toluene was removed.

Analytical: Product FTIR (diamond, cm$^{-1}$): 3078 (sh, olefin C—H), 1720 (w, maleimide C=O) & 1634 (w, maleimide C=O) symm and asymm.

Example 6: Formulation of an Acrylate Cure, Thin Film of Green or Red QD Phosphors Exchanged with EG4.3TSA Ligand and Diluent M-600-MI In this example, green or red QD phosphors exchanged with EG4.3TSA ligand and dissolved in diluent M-600-MI were dissolved in ether methacrylates and then thin film coated at 10 µm thickness, followed by free radical curing.

The preparation of QD phosphors exchanged with EG4.3TSA ligand and dissolved in diluent M-600-MI was described in Examples 3 and 4. The QD phosphor/ligand/diluent mixture was efficiently dissolved in ether methacrylate monomers, as described below. This procedure describes the formulation of green QDs. The procedure for red QDs is similar, and thus is also briefly presented, with relevant data, at the end of this procedure. In total, the procedure describes the fabrication of 10 µm thick thin films of green QD phosphors at 200, 300 & 400 mg/mL, and red QD phosphors at 100 mg/mL.

General: The ether methacrylates, ethylene glycol methyl ether methacrylate (EGMEMA), di(ethylene glycol) methyl ether methacrylate (DEGMEMA), and tetrahydrofurfuryl methacrylate (THFMA) were purchased from Aldrich and used without purification. Ethyl alcohol (EtOH) anhydrous and dimethoxyethane (DME) anhydrous were also purchased from Aldrich and used without further purification. Photoinitiator 2,4,6-trimethylbenzoyldiphenyl phosphine oxide or 'liquid TPO' was purchased from Omnirad and also used without further purification. Optical density (OD) analysis was performed on a Cary 5000 UV-Vis Spectrometer by Varian.

Procedure: The procedure uses green QDs that have been ligand exchanged with EG4.3TSA, purified by MWCO filtration then combined with M-600-MI to form a 'thick, intensely green, but flowing oil,' as described in Example 3. The resulting oil was dissolved in EtOH, 1 mL, and transferred into three separate 8 mL vials. The volatiles were then removed with flowing nitrogen gas (one needle for nitrogen in & one needle to vent) to produce three samples with roughly equal amounts as shown below.

| Reference | Amount of QD concentrate isolated | OD$_{450}$ of concentrate | mg QDs/ mL of concentrate | Amount of diluent added | Amount of QD concentrate with diluent isolated |
|---|---|---|---|---|---|
| 10290-030AF | ~31.5 mg | 1214 | 4552 | 33 mg | 78.4 mg |
| 10290-030BF | ~31.5 mg | 1214 | 4552 | 33 mg | 69.7 mg |
| 10290-030CF | ~31.5 mg | 1214 | 4552 | 33 mg | 66.2 mg |

The oils were then combined with the methacrylates as shown below and roller mixed to produce clear green solutions. ~5 mg of the oils was then dissolved in DME, 4.0 mL, for OD$_{450}$ analysis by UV-Vis spectroscopy. Analysis of the dilute sample was projected to confirm the QD concentrate/diluent OD$_{450}$.

| Reference | Methacrylate added | Amount of methacrylate added | Amount of QD ligand/ diluent/ methacrylate isolated | OD$_{450}$ of QD ligand/ diluent/ methacrylate mixture | mg QDs/ mL of QD ligand/ diluent/ methacrylate mixture |
|---|---|---|---|---|---|
| 10290-030AF | EGMEMA | ~92 mg | 169.0 mg | 240 | 900 |
| 10290-030BF | DEGMEMA | ~92 mg | 162.3 mg | 195 | 731 |
| 10290-030CF | THFMA | ~92 mg | 167.2 mg | 208 | 780 |

The formulations then were diluted in methacrylates and roller mixed to produce formulations with about 200 mg QDs/mL. To cure the formulations photoinitiator, liquid TPO was added and the formulations were roller mixed again. They remained clear green. 10-µm-thick thin film samples were then fabricated using the draw-down method and cured with UV light.

Notably, when the ink compositions of this example were formulated using the same procedures and components, except that the diluent was omitted, the QDs remained only sparingly soluble in the ink compositions even after roller mixing the ink compositions overnight.

| Reference | Amount of methacrylate added | Ratio of diluent to methacrylate | Amount of QD ligand/ diluent/ methacrylate isolated | OD$_{450}$ of QD ligand/ diluent/ methacrylate mixture | mg QDs/ mL of QD ligand/ diluent/ methacrylate mixture | TPO-L to add |
|---|---|---|---|---|---|---|
| 10290-030AF | 520 mg | 0.063 | 0.647 g | 49.8 | 186.8 | 27.9 mg |
| 10290-030BF | 376 mg | 0.088 | 0.504 g | 51.2 | 192 | 21.5 mg |
| 10290-030CF | 604 mg | 0.055 | 0.755 g | 37.7 | 141 | 25.2 mg |

Other formulations for concentrations of green QD phosphors at 300 and 400 mg/mL or red QD phosphors at 100 mg/mL are described below. They were ligand exchanged and purified analogously to other procedures described herein. As described in this procedure, these formulations started with QD phosphor/ligand/diluent data, as tabulated in the table below.

| Reference | Color | Amount of QD concentrate isolated | OD of concentrate | mg QDs/ mL of concentrate | Amount of diluent added | Amount of QD concentrate with diluent isolated |
|---|---|---|---|---|---|---|
| 10290-033 | Green | 67.3 mg | 1543 | 5786 | 70 mg | 135.7 mg |
| 10290-036 | Green | 64.3 mg | 1451 | 5441 | 70 mg | 137.0 mg |
| 10290-037 | Red | 17.3 mg | 3664 | 4228 | 20 mg | 37.9 mg |

The QD concentrates were combined with ether methacrylate, EGMEMA, mixed by roller mixer, combined with photoinitiator liquid TPO, draw-down coated at 10 μm, and cured by UV light to produce thin films on a glass substrate. Relevant data are described in the table below.

| Reference | Expected mg QDs/ mL in formulation | Amount of methacrylate added | Ratio of diluent to methacrylate | Amount of QD ligand/ diluent/ methacrylate isolated | OD$_{450}$ of QD ligand/ diluent/ methacrylate mixture | mg QDs/ mL of QD ligand/ diluent/ methacrylate mixture | TPO-L to add |
|---|---|---|---|---|---|---|---|
| 10290-033 | 300 | 1117 mg | 0.063 | 1.237 g | 79.2 | 297 | 54.8 mg |
| 10290-036 | 400 | 738 mg | 0.080 | 0.860 g | 106 | 398 | 36.5 mg |
| 10290-037 | 100 | 694 mg | 0.029 | 0.710 g | 84.4 | 97.4 | 30.5 mg |

The table below tabulates emission data from the draw down films. In the table, the reference indicates which ink composition was used to make the film. All of the emission data were from samples excited with a laser light source at 445 nm wavelength with about 500 units of power. The photoluminescence intensity provides a rough but qualitative measure of phosphor film brightness that can be used to compare the brightness between these sample films. The last column describing emission max shows that the phosphors down converted the light energy of the emission and that the films maintained their QD fluorescence. The GD roughly correlates to the amount (in mg) of QDs in the films and the photoluminescence roughly correlates to the amount (in mg) of QDs in the films. Finally, the emission measurement for a dilute emission for the green QDs was 547 nm, so a film emission of 549 to 550 nm indicates that the QDs emission was not substantially shifted during the ligand exchange/ purification/formulation/film fabrication processes.

| Reference | Color | Methacrylate | Amount of QDs in mg QDs/mL | Amount of QDs in mg QDs/mL, calculated from OD measurement in mg QDs/mL | OD | Photoluminescence from excitation at 445 nm with about 500 nits power | Emission max in nm |
|---|---|---|---|---|---|---|---|
| 10290-030AF | Green | EGMEMA | 200 | 187 | 0.0340 | 1260 | 550 |
| 10290-030BF | Green | DEGMEMA | 200 | 192 | 0.0634 | 1522 | 549 |
| 10290-030CF | Green | THFMA | 200 | 141 | 0.0307 | 1543 | 549 |
| 10290-033 | Green | EGMEMA | 300 | 297 | 0.0515 | 2558 | 549 |
| 10290-036 | Green | EGMEMA | 400 | 398 | 0.1271 | 5703 | 549 |
| 10290-037 | Red | EGMEMA | 100 | 97 | 0.0608 | 1571 | 633 |

Example 7: Formulation, Characterization, and Inkjet Printing of QD-Free Ink Compositions and Ink Compositions Containing Green or Red QD Phosphors In this example, the formulation of curable ink compositions containing benzyl methacrylate as a base monomer is illustrated.

Five printable ink compositions were formulated and characterized. The first formulation did not contain quantum dots, the second and third formulations contained red-emitting quantum dots, and the fourth and fifth formulations contained green-emitting quantum dots. The five formulations are shown in the tables below.

QD-Free Curable Ink Composition

| Ink Component | Commercial Source/Catalog Number | Weight Percent (wt. %) |
|---|---|---|
| Quantum Dots | Nanosys QD Gen3 | 0 |
| Benzyl Methacrylate | Aldrich/409448 | 90 |
| Pentaerythritol Tetracrylate | Aldrich/408263 | 7 |
| TPO-L | IGM/TPO-L | 3 |
| Total | | 100 |

First Red QD-Containing Curable Ink Composition

| Ink Component | Commercial Source/Catalog Number | Weight Percent (wt. %) |
|---|---|---|
| Quantum Dots | Nanosys QD Gen3 Red | 24.0 |
| Benzyl Methacrylate | Aldrich/409448 | 68.4 |
| Pentaerythritol Tetracrylate | Aldrich/408263 | 5.32 |
| TPO-L | IGM/TPO-L | 2.28 |
| Total | | 100 |

Second Red QD-Containing Curable Ink Composition

| Ink Component | Commercial Source/Catalog Number | Weight Percent (wt. %) |
|---|---|---|
| Quantum Dots | Nanosys QD Gen3 Red | 24.0 |
| Benzyl Methacrylate | Aldrich/409448 | 73.72 |
| TPO-L | IGM/TPO-L | 2.28 |
| Total | | 100 |

First Green QD-Containing Curable Ink Composition

| Ink Component | Commercial Source/Catalog Number | Weight Percent (wt. %) |
|---|---|---|
| Quantum Dots | Nanosys QD Gen3 Green | 24.0 |
| Benzyl Methacrylate | Aldrich/409448 | 68.4 |
| Pentaerythritol Tetracrylate | Aldrich/408263 | 5.32 |
| TPO-L | IGM/TPO-L | 2.28 |
| Total | | 100 |

Second Green QD-Containing Curable Ink Composition

| Ink Component | Commercial Source/Catalog Number | Weight Percent (wt. %) |
|---|---|---|
| Quantum Dots | Nanosys QD Gen3 Green | 24.0 |
| Benzyl Methacrylate | Aldrich/409448 | 73.72 |
| TPO-L | IGM/TPO-L | 2.28 |
| Total | | 100 |

The QD-Free Ink Composition had a viscosity of 3.4 cP and a surface tension of 35 dyn/cm. The First Red QD-Containing Ink Composition had a viscosity of 5.7 cP and a surface tension of 36 dyn/cm. The Second Red QD-Containing Ink Composition had a viscosity of 6.5 cP and a surface tension of 36 dyn/cm. The First Green QD-Containing Ink Composition had a viscosity of 5.8 cP and a surface tension of 36. The viscosity and surface tension measurements were made at temperatures between 21° C. and 25° C. Viscosities were measured using a Brookfield DV-1 viscometer and surface tensions were measured using a SITA DynoTester Bubble Tensiometer.

The present teachings are intended to be illustrative, and not restrictive. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A photonic device comprising:
    a photonic device substrate;
    a crosslinked polymer film on the photonic device substrate, the crosslinked polymer film comprising:
        50 to 90 wt. % crosslinked polymer chains comprising polymerized di(meth)acrylate monomers or a combination of polymerized di(meth)acrylate monomers and mono(meth)acrylate monomers;
        1 to 10 wt. % multifunctional crosslinking agents linked to the polymer chains; and
        20 to 30 wt. % quantum dots having ligands bonded to the polymer chains; and
    a filter layer that blocks light having wavelength less than an absorption wavelength or emission wavelength of one or more of the quantum dots.

2. The photonic device of claim 1, further comprising scattering nanoparticles.

3. The photonic device of claim 1, further comprising a scattering layer.

4. The photonic device of claim 1, wherein the crosslinked polymer film further comprises scattering nanoparticles.

5. The photonic device of claim 1, wherein the filter layer comprises scattering nanoparticles.

6. The photonic device of claim 1, wherein the filter layer is a first filter layer that blocks light having a wavelength less than an absorption wavelength of one or more of the quantum dots, and further comprising a plurality of second filter layers, each second filter layer disposed in a sub-pixel cell of the substrate, wherein each second filter layer blocks light having wavelength larger than an emission wavelength of quantum dots in the respective sub-pixel cell.

7. The photonic device of claim 1, wherein the crosslinked polymer film comprises one or more diluents bonded to the polymer chains.

8. A photonic device comprising:
    a photonic device substrate;
    a crosslinked polymer film on the photonic device substrate, the crosslinked polymer film comprising:
        50 to 90 wt. % crosslinked polymer chains comprising polymerized di(meth)acrylate monomers or a combination of polymerized di(meth)acrylate monomers and mono(meth)acrylate monomers;
        1 to 10 wt. % multifunctional crosslinking agents linked to the polymer chains;
        20 to 30 wt. % quantum dots having ligands bonded to the polymer chains; and
        one or more diluents bonded to the polymer chains, at least one of the diluents selected to enhance solubility of the quantum dots in an ink composition; and
    a filter layer that blocks light having wavelength less than an absorption wavelength or emission wavelength of one or more of the quantum dots.

9. The photonic device of claim 8, wherein the photonic device is an OLED device.

10. The photonic device of claim 8, further comprising scattering particles.

* * * * *